(12) United States Patent
Byeon et al.

(10) Patent No.: US 10,809,835 B2
(45) Date of Patent: Oct. 20, 2020

(54) ELECTRONIC DEVICE COMPRISING PRESSURE SENSOR

(71) Applicant: Samsung Electronics Co., Ltd., Suwon-si, Gyeonggi-do (KR)

(72) Inventors: Hyung-Sup Byeon, Suwon-si (KR);
Jung-Won Kim, Hwaseong-si (KR);
Han-Vit Kang, Suwon-si (KR);
Ho-Kyung Kang, Daegu (KR);
Kwang-Tai Kim, Yongin-si (KR);
Byeong-Cheol Kim, Suwon-si (KR);
Kyung-Wan Park, Suwon-si (KR);
Yo-Han Lee, Seongnam-si (KR);
Jeong-Sik Jeong, Hwaseong-si (KR);
Eun-Sung Cho, Ansan-si (KR);
Hyun-Ju Hong, Osan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/343,656

(22) PCT Filed: Oct. 20, 2017

(86) PCT No.: PCT/KR2017/011684
§ 371 (c)(1),
(2) Date: Apr. 19, 2019

(87) PCT Pub. No.: WO2018/080115
PCT Pub. Date: May 3, 2018

(65) Prior Publication Data
US 2019/0278412 A1 Sep. 12, 2019

(30) Foreign Application Priority Data
Oct. 24, 2016 (KR) .......................... 10-2016-0138686

(51) Int. Cl.
*G06F 3/041* (2006.01)
*H01L 27/32* (2006.01)
(Continued)

(52) U.S. Cl.
CPC ............ *G06F 3/0412* (2013.01); *G06F 3/041* (2013.01); *G06F 3/044* (2013.01); *G06F 3/0414* (2013.01);
(Continued)

(58) Field of Classification Search
CPC ...... G06F 3/0412; G06F 3/041; G06F 3/0416; G06F 3/0414; G06F 3/044; G06K 9/00; H01B 5/14; H01L 27/323
See application file for complete search history.

(56) References Cited

U.S. PATENT DOCUMENTS

2008/0129898 A1* 6/2008 Moon .................. G02F 1/13338
349/12
2012/0075239 A1 3/2012 Azumi et al.
(Continued)

FOREIGN PATENT DOCUMENTS

KR 10-2010-0065816 A 6/2010
KR 10-2011-0026817 A 3/2011
(Continued)

*Primary Examiner* — Robert J Michaud
(74) *Attorney, Agent, or Firm* — Jefferson IP Law, LLP

(57) ABSTRACT

An electronic device according to an embodiment of the present invention comprises: a housing that comprises a first surface which faces a first direction and a second surface which faces a second direction opposite to the first direction, and that comprises a first transparent plate which forms at least a portion of the first surface of the housing; a display that is disposed between the first transparent plate and the second face of the housing, and comprises a second transparent plate which faces the first direction, and a third transparent plate which faces the second direction; a first electrode, a second electrode, a third electrode, and a fourth
(Continued)

electrode that are disposed between the second transparent plate and the third transparent plate; and a control circuit that is electrically connected to the first electrode, the second electrode, the third electrode, and the fourth electrode, wherein the control circuit may be configured to detect the position of touch input with respect to the first transparent plate by using the first electrode, to detect the intensity of the touch input by using the second electrode, and to display visual information on at least a portion of the display by using the third electrode and the fourth electrode. In addition, an electronic device comprising a pressure sensor according to various embodiments of the present invention can provide a slim electronic device with reduced manufacturing costs by utilizing an integrated structure with a touch sensor and/or a fingerprint sensor and by disposing the touch sensor including the pressure sensor, and other sensors between various structures inside the display.

14 Claims, 44 Drawing Sheets

(51) Int. Cl.
G06K 9/00 (2006.01)
G06F 3/044 (2006.01)
H01B 5/14 (2006.01)
H04B 1/3827 (2015.01)

(52) U.S. Cl.
CPC ............ G06F 3/0416 (2013.01); G06K 9/00 (2013.01); H01B 5/14 (2013.01); H01L 27/323 (2013.01); H01L 27/3211 (2013.01); H01L 27/3244 (2013.01); H04B 1/3827 (2013.01)

(56) References Cited

U.S. PATENT DOCUMENTS

| | | | |
|---|---|---|---|
| 2016/0004428 A1 | 1/2016 | Bernstein et al. | |
| 2016/0103542 A1 | 4/2016 | Ogata et al. | |
| 2017/0228573 A1* | 8/2017 | Shen | G06K 9/0002 |
| 2017/0249049 A1* | 8/2017 | Wang | G06F 3/0412 |
| 2017/0338287 A1* | 11/2017 | Ito | G06F 3/044 |
| 2019/0258340 A1* | 8/2019 | Agari | G06F 3/0412 |

FOREIGN PATENT DOCUMENTS

| | | |
|---|---|---|
| KR | 10-2012-0031432 A | 4/2012 |
| KR | 10-2013-0022259 A | 3/2013 |
| KR | 10-2016-0068466 A | 6/2016 |
| KR | 10-2016-0077760 A | 7/2016 |
| WO | 2015/123322 A1 | 8/2015 |

\* cited by examiner

FIG.44A SLEEP & LOCK
FIG.44B INPUT FORCE
FIG.44C FINGER PRINT & UNLOCK

ELECTRONIC DEVICE COMPRISING PRESSURE SENSOR

CROSS-REFERENCE TO RELATED APPLICATION(S)

This application is a U.S. National Stage application under 35 U.S.C. § 371 of an International application number PCT/KR2017/011684, filed on Oct. 20, 2017, which is based on and claimed priority of a Korean patent applications number 10-2016-0138686, filed on Oct. 24, 2016, in the Korean Intellectual Property Office the disclosure of which is incorporated by reference herein in its entirety.

TECHNICAL FIELD

The present disclosure relates to an electronic device including a pressure sensor.

BACKGROUND ART

Generally, a display device is a device for outputting an image or image information, and may be installed in most electronic devices having an information communication function. With the development of electric and electronic technologies, the performance of the display device has innovatively advanced such that the display quality thereof has been remarkably improved, and the display device has been integrated with a touch panel, etc., such that the display device is utilized not only as an output device, but also as an input device.

An electronic device including a display device has been used providing a touch-based device capable of offering various user experiences to users by calculating a strength of pressure corresponding to a vertical element in addition to calculating a horizontal element (e.g., a position or movement) of an input based on the input to a touch panel.

DETAILED DESCRIPTION OF THE INVENTION

Technical Problem

According to related art, an electronic device may calculate a horizontal position and a vertical position of a touch input based on touch inputs made using various schemes.

However, a conventional pressure recognition sensor is arranged under a display, requiring a separate space due to a hardware structure separate from the display, and miniaturization and slimmerization of an electronic device such as a mobile device has restricted the position and the space of the pressure recognition sensor.

Moreover, a conventional touch sensing technique and pressure recognition technique are implemented separately, and are used for separate functions for particular situations. For a mobile device equipped with both a touch sensing function and a pressure recognition function, separate costs and efforts are needed to develop and manufacture those functions separately.

According to an embodiment of the present disclosure, there is provided an electronic device in which a pressure recognition sensor is arranged inside a display to solve limitation in a mounting space, and is arranged in a region where a touch sensor electrode and a display electrode are mounted to provide an integrated structure with the touch sensor and the display electrode.

According to another embodiment of the present disclosure, there is also provided an electronic device which allows reduction of a manufacturing cost thereof and slimmerization thereof through various arrangements of a fingerprint sensor, a touch sensor, and a force sensor inside a display.

Technical Solution

An electronic device according to an embodiment of the present disclosure includes a housing including a first face facing a first direction and a second face facing a second direction that is opposite to the first direction, and including a first transparent plate forming at least a part of the first face of the housing, a display disposed between the first transparent plate and the second face of the housing, and comprising a second transparent plate facing the first direction and a third transparent plate facing the second direction, a first electrode, a second electrode, a third electrode, and a fourth electrode that are arranged between the second transparent plate and the third transparent plate, and a control circuit electrically connected with the first electrode, the second electrode, the third electrode, and the fourth electrode, in which the control circuit is configured to detect a position of a touch input with respect to the first transparent plate by using the first electrode, to detect a strength of the touch input by using the second electrode, and to display visual information in at least a part of the display by using the third electrode and the fourth electrode.

Advantageous Effects

According to various embodiments of the present disclosure, an electronic device including a front force sensor may solve limitation in a mounting space through arrangement of a force sensor inside a display.

Moreover, according to various embodiments of the present disclosure, an electronic device including a force sensor may reduce a manufacturing cost and have a silmmerized structure by using an integrated structure of a touch sensor and/or a fingerprint sensor and various arrangements between a force sensor, the touch sensor, other sensors, and structures inside the display.

MODE FOR CARRYING OUT THE INVENTION

Figure 1:
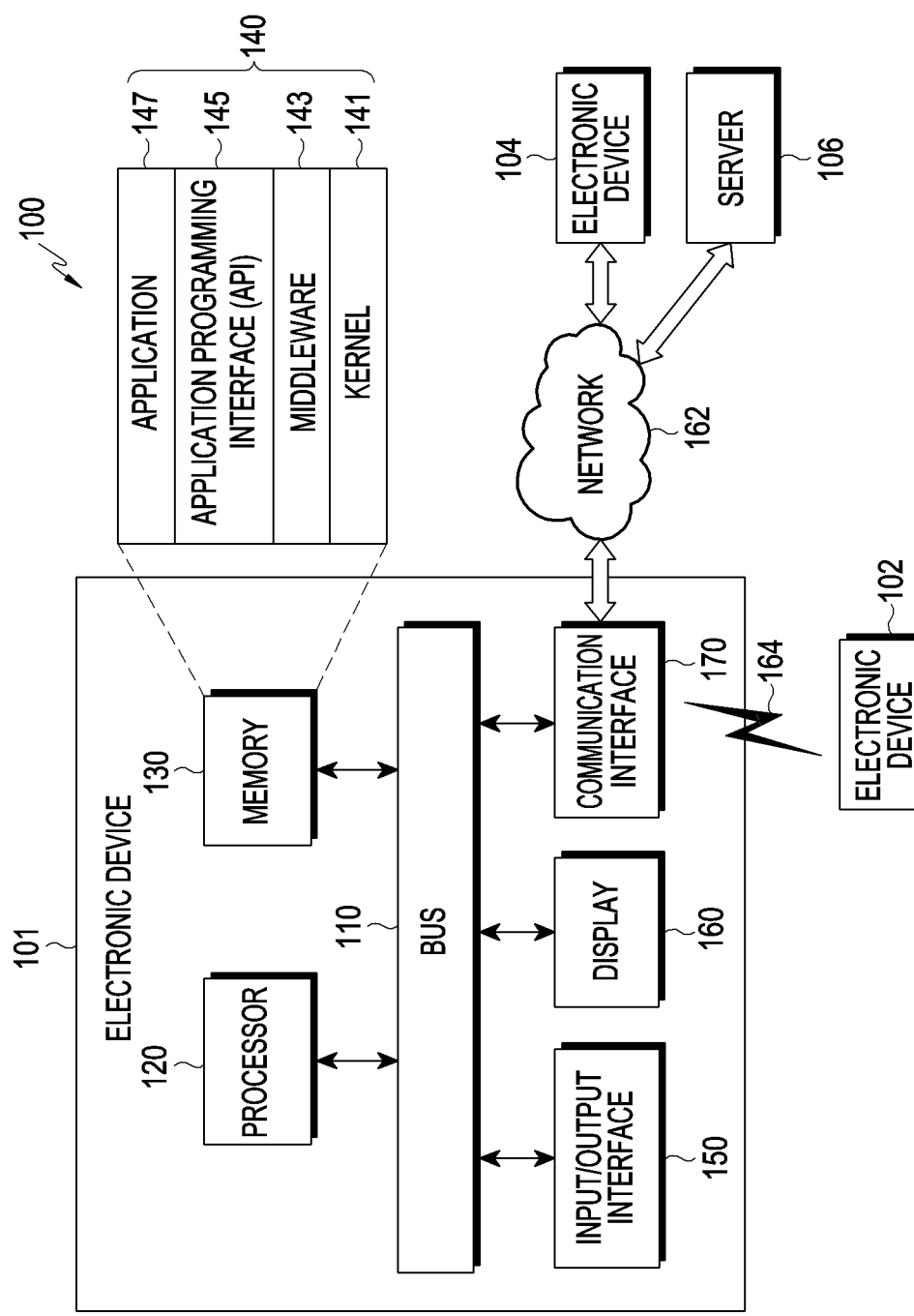
FIG. 1 is a schematic block diagram of an electronic device in a network environment according to various embodiments of the present disclosure.

Hereinafter, various embodiments of the present disclosure will be disclosed with reference to the accompanying drawings. However, embodiments and terms used therein are not intended to limit the present disclosure to particular embodiments, and it should be construed as including various modifications, equivalents, and/or alternatives according to the embodiments of the present disclosure. With regard to the description of the drawings, similar reference numerals may be used to refer to similar or related elements. It is to be understood that a singular form of a noun corresponding to an item may include one or more of the things, unless the relevant context clearly indicates otherwise. In the present disclosure, an expression such as "A or B," "at least one of A and/or B," or "one or more of A and/or B" may include all possible combinations of together listed items. Expressions such as "first," "second," "primarily," or "secondary," used herein may represent various elements regardless of order and/or importance and do not limit corresponding elements. When it is described that an element (such as a first element) is "operatively or communicatively coupled with/to" or "connected" to another element (such as a second element), the element can be directly connected to the other element or can be connected to the other element through another element (e.g., a third element).

An expression "configured to (or set)" used in the present disclosure may be replaced with, for example, "suitable for," "having the capacity to," "adapted to," "made to," "capable of," or "designed to" according to a situation. Alternatively, in some situations, an expression "apparatus configured to" may mean that the apparatus "can" operate together with another apparatus or component. For example, a phrase "a processor configured (or set) to perform A, B, and C" may be a dedicated processor (e.g., an embedded processor) for performing a corresponding operation or a generic-purpose processor (such as a central processing unit (CPU) or an application processor) that can perform a corresponding operation by executing at least one software program stored in a memory device.

Examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), an MP3 player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device. In some embodiments, the electronic device may include, for example, a television (TV), a digital versatile disk (DVD) player, audio equipment, a refrigerator, an air conditioner, a vacuum cleaner, an oven, a microwave oven, a laundry machine, an air cleaner, a set-top box, a home automation control panel, a security control panel, a TV box (e.g., Samsung HomeSync™, Apple TV™, or Google TV™), a game console, an electronic dictionary, an electronic key, a camcorder, and an electronic frame.

In other embodiments, the electronic device may include at least one of various medical equipment (for example, magnetic resonance angiography (MRA), magnetic resonance imaging (MRI), computed tomography (CT), an imaging device, or an ultrasonic device), a navigation system, a global positioning system (GPS) receiver, an event data recorder (EDR), a flight data recorder (FDR), a vehicle infotainment device, electronic equipment for ships (e.g., a navigation system and gyro compass for ships), avionics, a security device, a vehicle head unit, an industrial or home robot, a drone, an automatic teller's machine (ATM), a Point of Sale (POS), Internet of things (e.g., electric bulbs, various sensors, electricity or gas meters, sprinkler devices, fire alarm devices, thermostats, streetlights, toasters, exercise machines, hot-water tanks, heaters, boilers, and so forth). According to some embodiments, the electronic device may include a part of furniture, building/structure or a part of a vehicle, an electronic board, an electronic signature receiving device, a projector, and various measuring instruments (e.g., a water, electricity, gas, electric wave measuring device, etc.). According to various embodiments, the electronic device may be flexible or may be a combination of two or more of the above-described various devices. According to an embodiment of the disclosure, the electronic devices are not limited to those described above. Herein, the term "user" used in various embodiments of the present disclosure may refer to a person who uses the electronic device or a device (e.g., an artificial intelligence electronic device) using the electronic device.

Referring to FIG. 1, an electronic device 101 in a network environment 100 according to various embodiments of the present disclosure is disclosed. The electronic device 101 may include a bus 110, a processor 120, a memory 130, an input/output (I/O) interface 150, a display 160, and a communication interface 170. According to some embodiments, the electronic device 101 may omit at least one of the foregoing elements or may further include other elements. The bus 110 may include a circuit for connecting, e.g., the elements 110 to 2170 and delivering communication (e.g., a control message or data) between the elements 110 to 170. The processor 120 may include one or more of a central processing unit (CPU), an application processor (AP), and a communication processor (CP). The processor 120 performs operations or data processing for control and/or communication of, for example, at least one of the other elements of the electronic device 101.

The memory 130 may include a volatile and/or nonvolatile memory. The memory 130 may store, for example, instructions or data associated with at least one of the other elements of the electronic device 101. According to an embodiment of the present disclosure, the memory 130 may store software and/or a program 140. The program 140 may include at least one of, for example, a kernel 141, middleware 143, an application programming interface (API) 145, and/or an application program (or "application") 147, and the like. At least some of the kernel 141, the middleware 143, and the API 145 may be referred to as an operating system (OS). The kernel 141 may control or manage, for example, system resources (e.g., the bus 110, the processor 120, the memory 130, etc.) used to execute operations or functions implemented in other programs (e.g., the middleware 143, the API 145, or the application program 147). The kernel 141 provides an interface through which the middleware 143, the API 145, or the application program 147 accesses separate components of the electronic device 101 to control or manage the system resources.

The middleware 143 may work as an intermediary for allowing, for example, the API 145 or the application program 147 to exchange data in communication with the kernel 141. In addition, the middleware 143 may process one or more task requests received from the application program 147 based on priorities. For example, the middleware 143 may give a priority for using a system resource (e.g., the bus 110, the processor 120, the memory 130, etc.) of the electronic device 101 to at least one of the application programs 147, and may process the one or more task requests. The API 145 is an interface used for the application 147 to control a function provided by the kernel 141 or the middleware 143, and may include, for example, at least one interface or function (e.g., an instruction) for file control, window control, image processing or character control. The I/O interface 150 may deliver, for example, an instruction or data input from a user or another external device to other component(s) of the electronic device 101, or output an instruction or data received from other component(s) of the electronic device 101 to a user or another external device.

The display 160 may include, for example, a liquid crystal display (LCD), a light emitting diode (LED) display, an organic light emitting diode (OLED) display, a microelectromechanical system (MEMS) display, or an electronic paper display. The display 160 may, for example, display various contents (e.g., a text, an image, a video, an icon, and/or a symbol, etc.) to users. The display 160 may include a touchscreen, and receive a touch, a gesture, proximity, or a hovering input, for example, by using an electronic pen or a part of the body of a user. The communication interface 170 establishes communication between the electronic device 101 and an external device (e.g., the vehicle device 102, the electronic device 104, or the server 106). For example, the communication interface 170 may be connected to a network 162 through wireless communication or wired communication to communicate with an external device (e.g., the second external electronic device 104 or the server 106).

Wireless communication may include a cellular communication protocol using at least one of, for example, long-term evolution (LTE), LTE advance (LTE-A), code division multiple access (CDMA), wideband CDMA (WCDMA), universal mobile telecommunications system (UMTS), wireless broadband (WiBro), global system for mobile communications (GSM), and so forth. According to an embodiment, the wireless communication may include at least one of Wireless Fidelity (WiFi), Bluetooth, Bluetooth Low Energy (BLE), Zigbee, near field communication (NFC), magnetic secure transmission (MST), radio frequency (RF), and a body area network (BAN). According to an embodiment, the wireless communication may include a global navigation satellite system (GNSS). The GNSS may include, for example, at least one of a global positioning system (GPS), a global navigation satellite system (GLONASS), a Beidou navigation satellite system ("Beidou"), and Galileo, the European global satellite-based navigation system. Hereinbelow, "GPS" may be used interchangeably with "GNSS". The wired communication may include, for example, at least one of a universal serial bus (USB), a high definition multimedia interface (HDMI), a recommended standard 232 (RS-232), power line communication, a plain old telephone service (POTS), and so forth. The network 162 may include a telecommunications network, for example, at least one of a computer network (e.g., a local area network (LAN) or a wide area network (WAN)), Internet, and a telephone network.

Each of the first external electronic device 102 and the second external electronic device 104 may be a device of the same type as or a different type than the electronic device 101. According to various embodiments of the present disclosure, some or all of operations performed by the electronic device 101 may be performed in another electronic device or a plurality of electronic devices (e.g., the electronic device 102 or 104, or the server 106). According to an embodiment of the present disclosure, when the electronic device 101 has to perform a function or a service automatically or at a request, the electronic device 101 may request another device (e.g., the electronic devices 102 or 104 or the server 106) to perform at least some functions associated with the function or the service instead of or in addition to executing the function or the service. The another electronic device (e.g., the electronic device 102 or 104 or the server 106) may execute the requested function or additional function and deliver the execution result to the electronic device 101. The electronic device 101 may then process or further process the received result to provide the requested function or service. To that end, a cloud computing, distributed computing, or client-server computing technology may be used, for example.

Figure 2A:
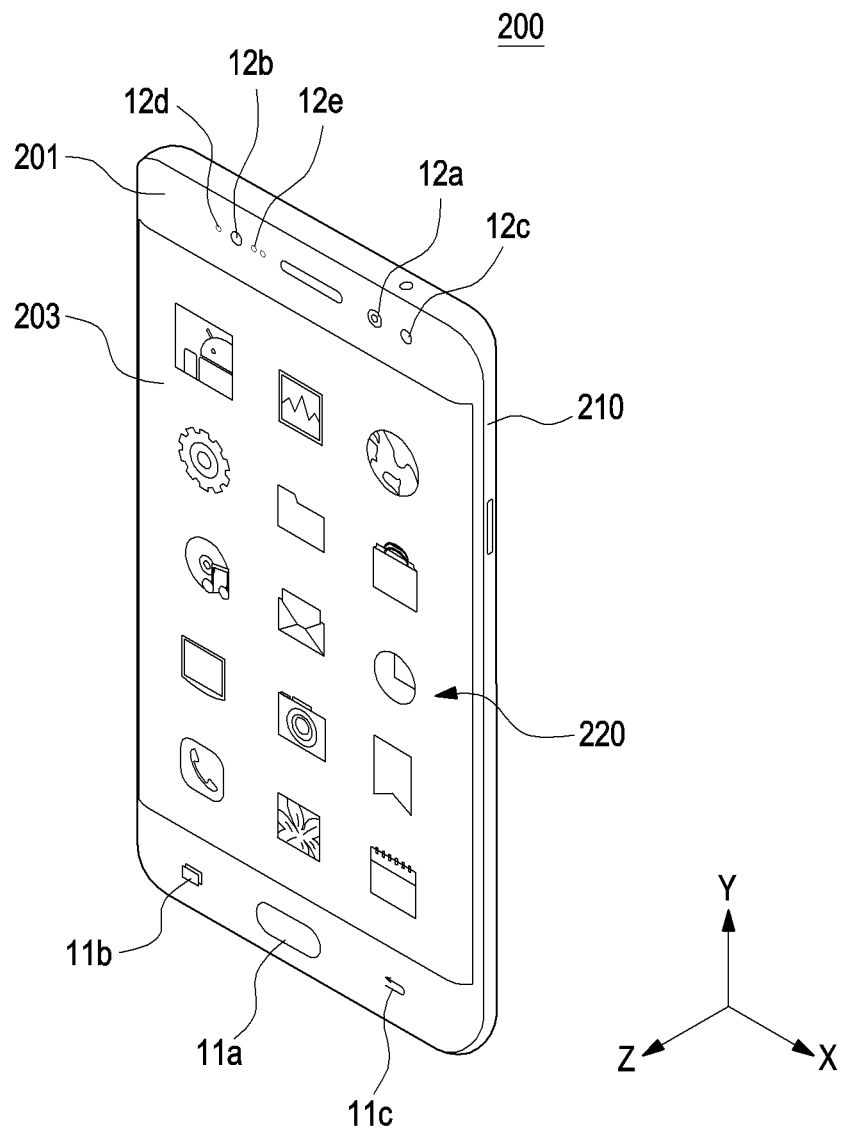
FIGS. 2A through 2D are perspective views each illustrating an electronic device including a display device according to various embodiments of the present disclosure.
Figure 2B:
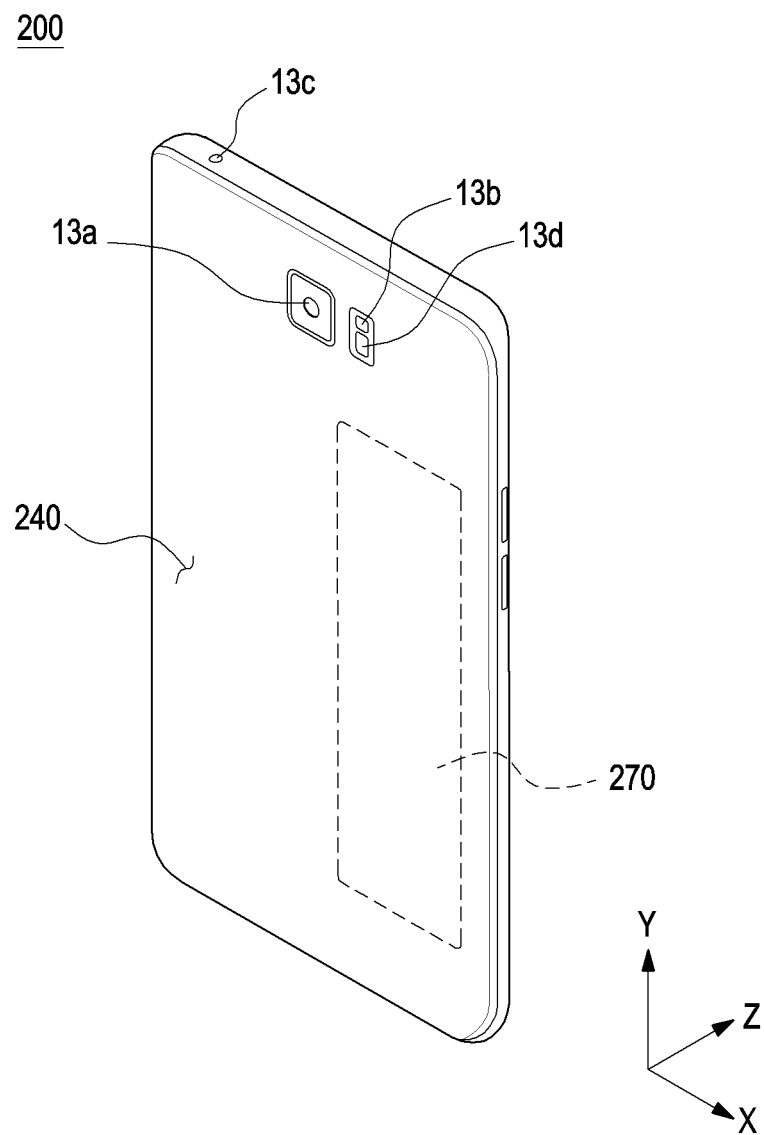
Figure 2C:
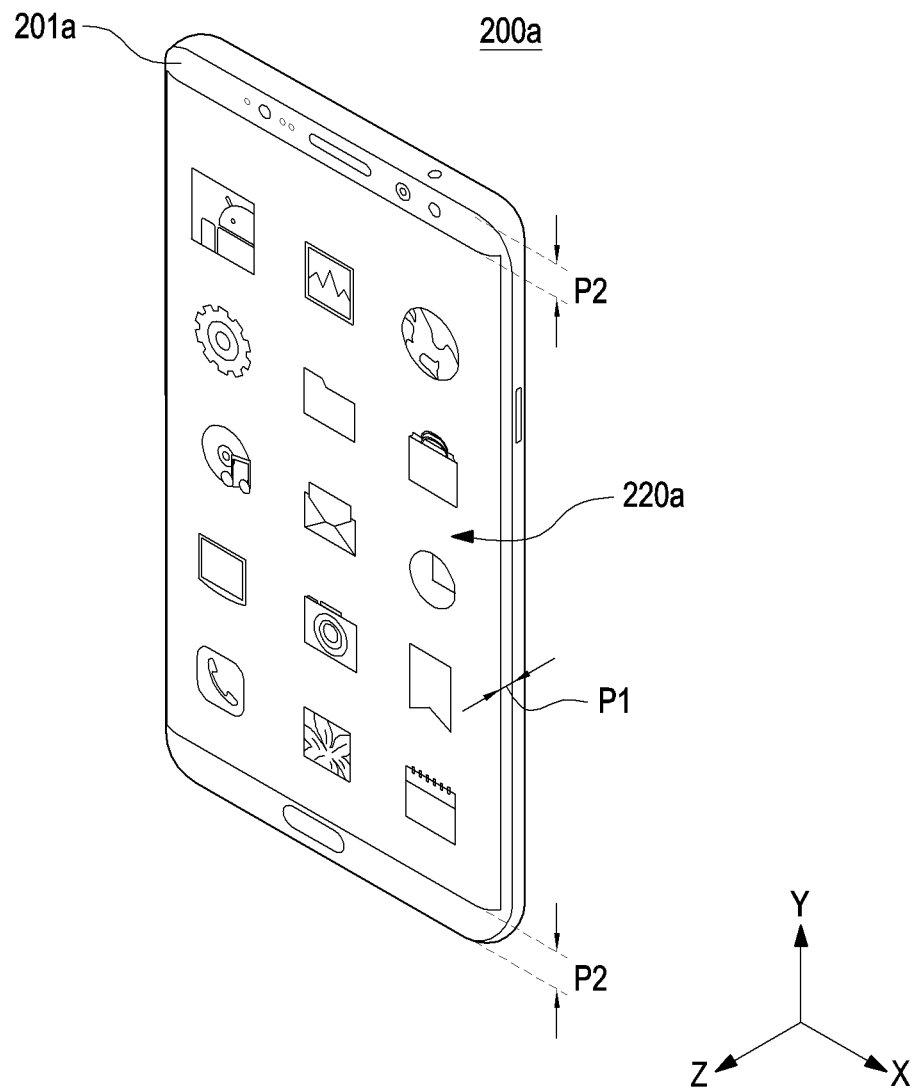

FIG. 2A is a perspective view illustrating an electronic device 200 according to one of various embodiments of the present disclosure. FIG. 2B is an exploded perspective view illustrating the electronic device 200 when viewed from another direction, according to one of various embodiments of the present disclosure. FIG. 2C is a perspective view illustrating an electronic device 200 according to another one of various embodiments of the present disclosure.

In FIGS. 2A and 2B, in a three-axis orthogonal coordinate system, 'X' may denote the width direction of the electronic device 200, 'Y' may denote the length direction of the electronic device 200, and 7' may denote the thickness direction of the electronic device 200.

As illustrated in FIGS. 2A and 2B, the electronic device 200 may include a housing 210 and a display device 220. The housing 210 may include a first face 101 facing a first direction (+Z) and a second face 240 facing a second direction (−Z) that is opposite to the first direction (+Z). The first face 201 of the housing 210 may be a front face, and the second face 240 of the housing 210 may be a rear cover. The front face of the housing 210 may be opened, and a first transparent plate 203 may be mounted to form at least a portion of the first face 201 that is the front face of the housing 210 so as to close the opened first face 201 of the housing 210. A keypad including mechanically operating buttons or touch keys 11a, 11b, are 11c may be provided on the electronic device 200, for example, one side region of the transparent plate 203 on the front face 201 of the housing 210. The touch key may generate an input signal by a user's body contact.

According to various embodiments, the keypad may be implemented with only mechanical buttons, or with only touch keys. Alternatively, the keypad may be implemented with a combination of a mechanical button scheme and a touch scheme. The keypad may provide various screens displayed on a display device corresponding to a time during which buttons are pressed or touched long or short. Various types of circuit devices, such as the processor 120, the memory 130, the input/output (I/O) interface 150, and the communication interface 170, which are described above with reference to FIG. 1, may be accommodated in the housing 210, and a battery 270 may be accommodated in the housing 210 to secure a power source.

According to various embodiments of the present disclosure, a first camera 12a, a light source unit 12b, or an iris camera 12c may be arranged in an upper region of the front face of the electronic device 200. For example, the light source unit 12b may be an infrared radiation (IR) light-emitting diode (LED), and the iris camera 12c may photograph a user's eyes by using red near IR emitted from the IR LED as a light source and recognize iris information. In another example, a light source unit lamp 12d and an illumination sensor or proximity sensor 12e may be arranged in the upper region of the front face of the electronic device 200. In another example, a second camera 13a and a heartrate monitor (HRM) sensor or flash 13b may be arranged on the rear face of the electronic device 200, and a microphone 13c may be included on an upper portion of the electronic device 200.

According to various embodiments, in FIG. 2C (unlike in FIG. 2A), the display device 220a may be arranged substantially over the entire area of a first face 201a of the housing. For example, by removing at least a portion of a hole or a physical button from the first face 201a of the housing, the display device 220a may be arranged substantially over the entire area of the first face 201a. The electronic device 200a may include the display device 220a in which, for example, an inactive area having no screen displayed therein is not completely removed. For example, the electronic device 200a may include an active area where the screen of the display is displayed and an inactive area of a width of 0.1 mm to 5 mm from an edge of the first face 201a of the housing. For example, a width between the active area where the screen of the display is displayed and an edge of the first face 201a of the housing may range from 0.1 mm to 1 mm in a first portion P1 and range from 1 mm to 5 mm in a second portion P2.

Figure 2D:
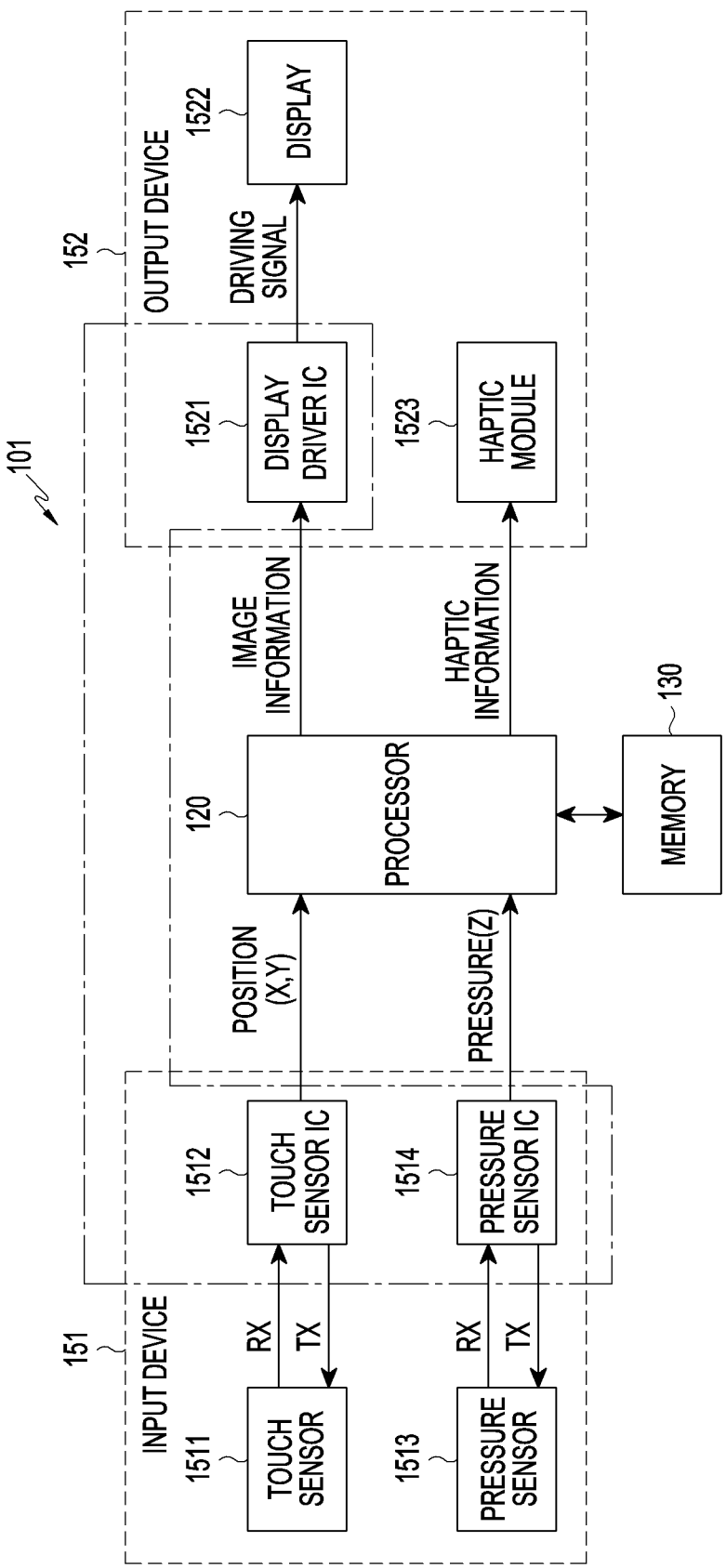

FIG. 2D illustrates an example of a configuration of an electronic device according to various embodiments of the present disclosure.

Referring to FIG. 2D, according to various embodiments of the present disclosure, the electronic device 101 may include the processor 120, an input device 151, the memory 130, and an output device 152. The electronic device 101 may further include a communication module (not shown).

According to various embodiments of the present disclosure, the output device 152 of the electronic device 101 may include a display panel 1522, a display driver IC 1521, and a haptic module 1523, and the input device 151 may include a touch sensor 1511, a touch sensor IC 1512, a force sensor or pressure sensor 1513, and a force sensor IC 1514. The display 1522 of FIG. 2C may be the display 160 illustrated in FIG. 1. Components described above with reference to FIGS. 1 through 1 will not be described repetitively.

According to various embodiments of the present disclosure, the display 1522 may receive an image driving signal provided from the display driver IC 1521. The display 1522 may display various contents and/or items (e.g., a text, an image (object), a video, an icon, a function object, a symbol, etc.) based on the image driving signal. In the present disclosure, the display 1522 may be overlappingly combined with the touch sensor 1511 and/or the force sensor 1513 (e.g., see FIG. 2), or may be referred to as simply a "display panel". The display 1522 may be driven in a low-energy mode.

According to various embodiments of the present disclosure, the display driver 1521 may supply an image driving signal corresponding to image information received from the processor 120 to the display 1522 at a preset frame rate. The display driver IC 1521 may drive the display 1522 in the low-energy mode. Although not shown, according to an embodiment of the present disclosure, the display driver IC 1521 may include a graphic random-access memory (RAM), an interface module, an image processing unit, a multiplexer, a display timing controller (T-con), a source driver, a gate driver, and/or an oscillator, etc.

According to various embodiments, in the touch sensor 1511, a designated physical quantity (e.g., a voltage, a quantity of light, a resistance, a quantity of electric charge, a capacitance, etc.) may be changed due to a touch by a user. According to an embodiment, the touch sensor 1511 may be arranged overlappingly with the display 1522.

According to various embodiments of the present disclosure, the touch sensor IC 1512 may sense a change in the physical quantity (e.g., a voltage, a resistance, a capacitance, etc.) in the touch sensor 1511 and calculate a position (X, Y) where the touch is made, based on the change of the physical quantity. The calculated position (coordinates) may be provided (or reported) to the processor 120. For example, when a user's body part (e.g., a finger), an electronic pen, or the like contacts a cover glass (e.g., a first transparent plate 510 of FIG. 2A) of the display, a coupling voltage between a transmitting terminal Tx and/or a receiving terminal Rx included in the touch sensor 1511 or between the sensing electrode and the ground may change. The change in the coupling voltage may be sensed by the touch sensor IC 1512 which may deliver the coordinates (X, Y) of the position where the touch is made to the processor 120. The processor 120 may obtain data regarding the coordinates (X, Y) as an event regarding a user input.

According to various embodiments, the touch sensor IC 1512 may be referred to as a touch IC, a touch screen IC, a touch controller, a touch screen controller IC, etc. According to an embodiment, in an electronic device not including the touch sensor IC 1512, the processor 120 may execute a function of the touch sensor IC 1512. According to an embodiment, the touch sensor IC 1512 and the processor 120 may be implemented in a single component (e.g., one chip).

According to various embodiments, the force sensor 1513 may sense a pressure (or a force) from an external object (e.g., a finger or an electronic pen). According to an embodiment, in the force sensor 1513, a physical quantity (e.g., a capacitance) between the transmitting terminal Tx and the receiving terminal Rx or between a sensing electrode and a ground may be changed by a touch.

According to various embodiments, the force sensor IC 1514 may sense a change in the physical quantity (e.g., a capacitance, etc.) in the touch sensor 1513 and calculate a pressure Z applied by a user's touch, based on the change of the physical quantity. The force sensor IC 1514 may calculate a change (rate) of a pressure strength changing per unit time in the force sensor 1513, a direction in which pressure is applied, etc. The force sensor IC 1514 may provide the pressure Z, a pressure strength, a pressure speed, a pressure direction, and the position (X, Y) where the touch is made to the processor 120.

According to various embodiments of the present disclosure, the force sensor IC 1514 may be mentioned as a force touch controller, a force sensor IC, a pressure panel IC, etc. According to various embodiments of the disclosure, the touch sensor IC 1514 may be implemented in a single component (e.g., one chip) together with the touch sensor IC 1512.

According to various embodiments, the haptic module (e.g., a haptic actuator) 1523 may provide tactile feedback (e.g., vibration) to the user in response to a control command of the processor 120. For example, the haptic module 1523 may provide a tactile feedback to the user when receiving a touch input (e.g., a touch, a hovering, and a force touch) from the user.

According to various embodiments, the memory 130 may store a command or data related to operations of components included in the electronic device 101. For example, in the memory 130 may be stored at least one application program including a user interface configured to display a plurality of items on a display. For example, the memory 130 may store instructions that cause, when executed, the processor 120 to perform various operations described herein.

According to various embodiments of the present disclosure, the processor 120 may be electrically connected with components 411 through 414 and 421 through 423 included in the electronic device 101 and perform computation or data processing for control and/or communication of the components 411 through 414 and 421 through 423 included in the electronic device 101.

According to various embodiments, the processor 120 may launch (or execute) an application program (or simply referred to as an "application") that displays a user interface on the display 1522. The processor 120 may display an array of a plurality of items on the user interface displayed on the display 1522 in response to launching of the application.

According to various embodiments, the processor 120 may receive first data (data including the position coordinates (X, Y) of the touch) generated from the touch sensor 1511 and second data (data including the pressure Z of the touch) generated from the force sensor 1513.

According to various embodiments, the processor 120 may activate at least a part of the force sensor 1513 while the display 1522 is turned off. The processor 120 may at least partially activate the force sensor 1513 while the display 1522 is turned off. For example, the processor 120 may activate the entire force sensor 1513 or a part thereof in a standby state of the electronic device 101 where a component such as the display 1522, etc., is turned off as well as in an awake state of the electronic device 101. The processor 120 may at least partially deactivate the force sensor 1511 while the display 1522 is turned off or while the electronic device 101 is in the standby state. The processor 120 may at least partially deactivate the touch sensor 1511 to reduce power consumption in the standby state and to prevent malfunction from occurring due to a touch.

According to various embodiments, the processor 120 may activate at least a part of the force sensor 1513 when a designated condition is achieved during the turned-off state of the display 1522. For example, the processor 120 may activate the force sensor 1513 after or during a designated time from when the display 1522 is turned off. In another example, the processor 120 may activate the force sensor 1513 upon sensing the use by the user by means of a gyro sensor, a proximity sensor, or the like. In another example, the processor 120 may activate the force sensor 1513 when the temperature is lower than a designated value, a touch is sensed by the touch panel, the electronic device 101 approaches another external device, or a stylus pen mounted in the electronic device 101 is pulled out from the electronic device 101. In another example, the processor 120 may activate the force sensor 1513 during execution of an application (e.g., a music player) operating in the standby state.

According to various embodiments, the processor 120 may deactivate at least a part of the force sensor 1513 when a designated condition is achieved during the turned-off state of the display 1522. For example, the processor 120 may deactivate the force sensor 1513 when sensing using a proximity sensor, an illumination sensor, an acceleration sensor, and/or a gyro sensor, etc., that the electronic device 101 is in the pocket or bag or is turned over. In another example, the processor 120 may deactivate the force sensor 1513 when the electronic device 101 is connected with an external device (e.g., connected with a desk top).

According to various embodiments, the processor 120 may activate only a designated region of the force sensor 1513 while the display 1522 is turned off. For example, the processor 120 may activate a designated partial region of the force sensor 1513 (e.g., a central lower region of the force sensor 1513) to reduce power consumption in the standby state. When the force sensor 1513 is implemented with a set of two or more sensors, the processor 120 may activate some of the two or more sensors.

According to various embodiments, the processor 120 may sense pressure using the force sensor 1513 during the standby state of the electronic device 101, by activating or enabling the force sensor 1513. For example, the processor 120 may receive data regarding pressure applied by an external object to the display 1522 from the force sensor 1513 during the turned-off state of the display 1522.

According to various embodiments of the disclosure, the processor 120 may identify whether a pressure is greater than or equal to a selected level based on the data regarding the pressure, and may perform a function without fully turning on the display 1522 when determining that the pressure is greater than or equal to the selected level. For example, the processor 120 may perform a function when sensing a higher level of pressure than a designated level. In this case, the processor 120 may turn on a part of the display 1522. The processor 120 may determine a function to be executed based on at least one of a position where the pressure is sensed, a strength of the sensed pressure, the number of points where the pressure is sensed, a speed of the sensed pressure, a direction of the sensed pressure, and a duration of the sensed pressure. For example, the processor 120 may wake up the electronic device 101 when sensing a pressure in a position corresponding to a central lower portion of the display 1522. The processor 120 may control volume of a speaker of the electronic device 101 when sensing a pressure in a position corresponding to a left upper portion of the display 1522. The processor 120 may perform a function related to adjacent hardware upon sensing a pressure in a position adjacent to hardware such as an earjack, a universal serial bus (USB) port, etc. The processor 120 may control the electronic device 101 to enter an emergency mode upon sensing pressure of a higher strength than a designated strength. The processor 120 may perform a different function depending on the number of points where pressure is sensed at the same time.

Although it is illustrated in FIG. 2D that the force sensor 1513 provides data regarding the pressure Z to the processor 120, the processor 120 may sense a position where pressure is applied, based on a position of a sensor where a capacitance is changed among two or more sensors, when the force sensor 1513 is implemented with a set of the two or more sensors, without being limited to the illustration. For example, when the force sensor 1513 is implemented with a set of six sensors arranged in a 3*2 array, the processor 120 may identify a position where pressure is applied, based on a change amount of capacitance of each sensor and a position where each sensor is arranged. That is, the processor 120 may identify a position where pressure is applied, without using the touch sensor 1511. When sensing pressure using the force sensor 1513, the processor 120 may activate the touch sensor 1511 to sense the position where the pressure is applied using the activated touch sensor 1511.

According to various embodiments, the processor 120 may perform a first function upon sensing, by the force sensor 1513, pressure of a first level applied by a touch. The processor 120 may determine the first function based on at least one of a position where the first-level pressure is detected, a strength of the first-level pressure, the number of points where the first-level pressure is detected, a speed of the first-level pressure, a direction of the first-level pressure, or a duration of the first-level pressure, and perform the determined first function. The first-level pressure may mean pressure of a strength in a designated range.

According to various embodiments, the processor 120 may perform a second function associated with the first function, upon sensing, by the force sensor 1513, pressure of a second level applied by a touch during execution of the first function. The processor 120 may determine the second function based on at least one of a position where the second-level pressure is detected, a strength of the second-level pressure, the number of points where the second-level pressure is detected, a speed of the second-level pressure, a direction of the second-level pressure, or a duration of the second-level pressure. The second-level pressure may mean pressure of a strength in a designated range. The strength of the second-level pressure may be higher or lower than that of the first-level pressure. The strength of the second-level pressure may be equal to that of the first-level pressure. The processor 120 may execute various functions based on a pressure that is a one-dimensional input by executing the second function associated with the first function under execution, when sensing the pressure during execution of the first function. After a touch on the electronic device, another function associated with a function under execution may be executed based on a magnitude of pressure applied to the electronic device 101, thereby improving convenience in input manipulation.

According to various embodiments of the present disclosure, the electronic device 101 may use a value (e.g., an acceleration sensor, a gyro sensor, etc.) measured by at least one sensor to distinguish a long-press input from a pressure input. The electronic device 101 may use a fingerprint, a camera, or an iris to distinguish a long-press input from a pressure input.

The above-described operation of the processor 120 is merely an example, and is not limited to the foregoing disclosure. For example, an operation of a processor described in other parts of the present document may also be understood as an operation of the processor 460. In this document, at least some of operations described as operations of the "electronic device" may be understood as operations of the processor 120.

An electronic device according to various embodiments of the present disclosure may include a housing including a first face that faces a first direction and a second face that faces a second direction opposite to the first direction, a display arranged between the first face and the second face and exposed through the first face, a force sensor arranged between the first face and the second face and configured to detect at least one level and/or position of pressure applied by an external object, at least one processor electrically connected to the display and the force sensor, and a memory electrically connected to the processor and storing at least one application program, in which the processor may be configured to display a user interface including at least one item on the display, detect an input for selecting the at least one item through the display, determine whether pressure strength of the detected input is greater than a first threshold value, and recognize the detected input as a pressure input when the pressure strength per frame changes.

According to an embodiment of the present disclosure, the processor may be configured to recognize the detected input as a pressure input and execute the function when the pressure strength per frame is not changed and the detected pressure strength is greater than a second threshold value.

According to an embodiment of the present disclosure, the processor may be configured to recognize the detected input as a pressure input and execute a corresponding function when the detected touch is not maintained for a predetermined length of time.

According to an embodiment of the present disclosure, the processor may be configured to recognize the detected input as a long press input and execute a corresponding function when the sensed touch is maintained for a predetermined length of time.

According to an embodiment of the present disclosure, the processor may be configured to recognize the detected input as a touch input and execute a corresponding function when the detected pressure strength is not greater than the first threshold value.

According to an embodiment of the present disclosure, the processor may be configured to measure the pressure strength of the input during a predetermined frame from a time at which the pressure is greater than the first threshold value.

According to an embodiment of the present disclosure, the processor may be configured to detect the pressure input when the pressure strength per frame increases or decreases at a predetermined rate from a time at which the pressure strength is greater than the first threshold value.

According to an embodiment of the present disclosure, the processor may be configured to detect the pressure input as a long press when the pressure strength per frame does not increase or decrease at a predetermined rate from a time at which the pressure strength is greater than the first threshold value.

According to an embodiment of the present disclosure, the processor may be configured to recognize the detected input as a pressure input when the strength of the detected pressure is greater than the second threshold.

According to an embodiment of the present disclosure, the processor may be configured to identify a time when the pressure strength becomes greater than the second threshold value as a pressure input start time when the pressure strength of the detected input is greater than the first threshold value and becomes greater than the second threshold value within a predetermined length of time.

Figure 3:
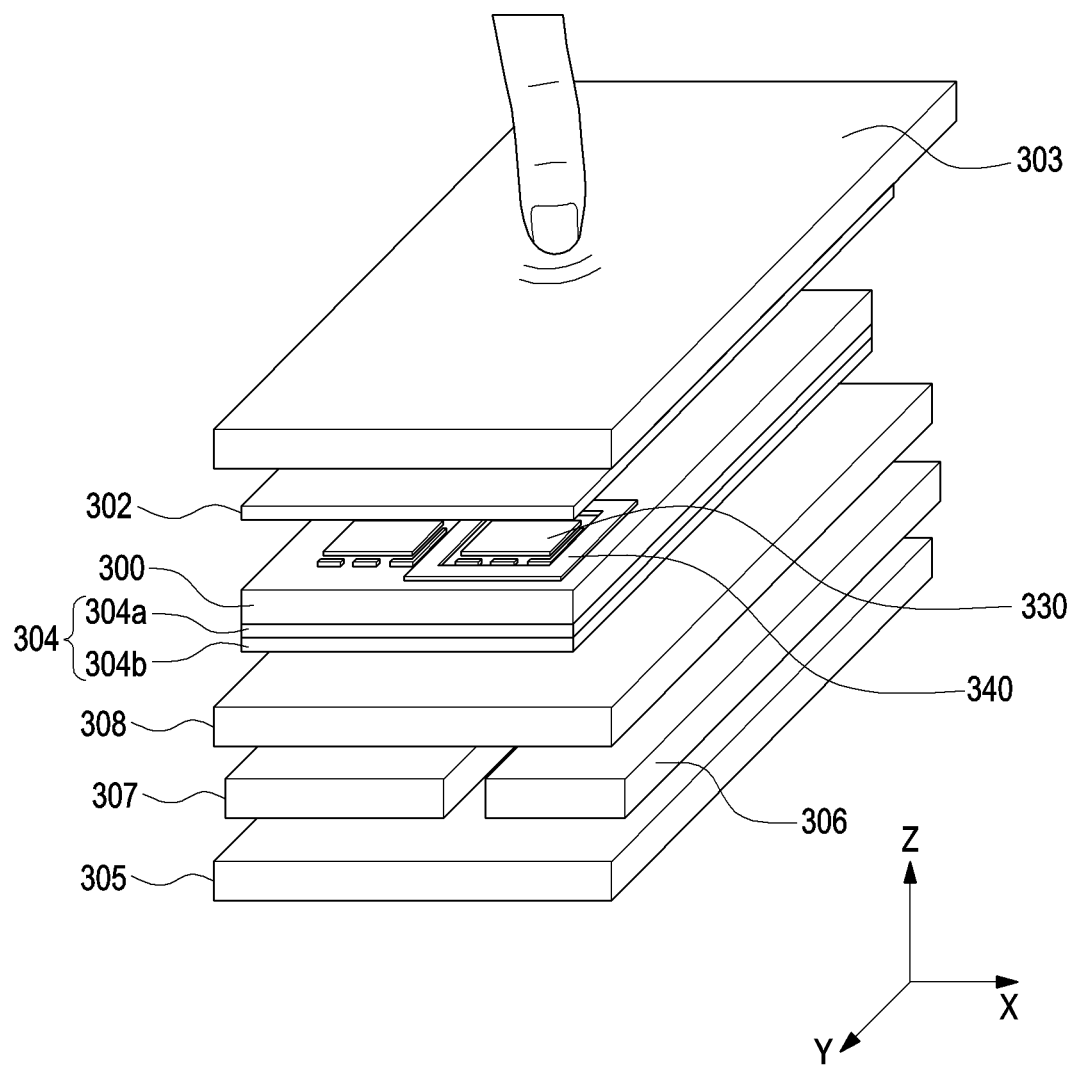
FIG. 3 is an exploded perspective view illustrating an electronic device including a display device according to various embodiments of the present disclosure.
Figure 4:
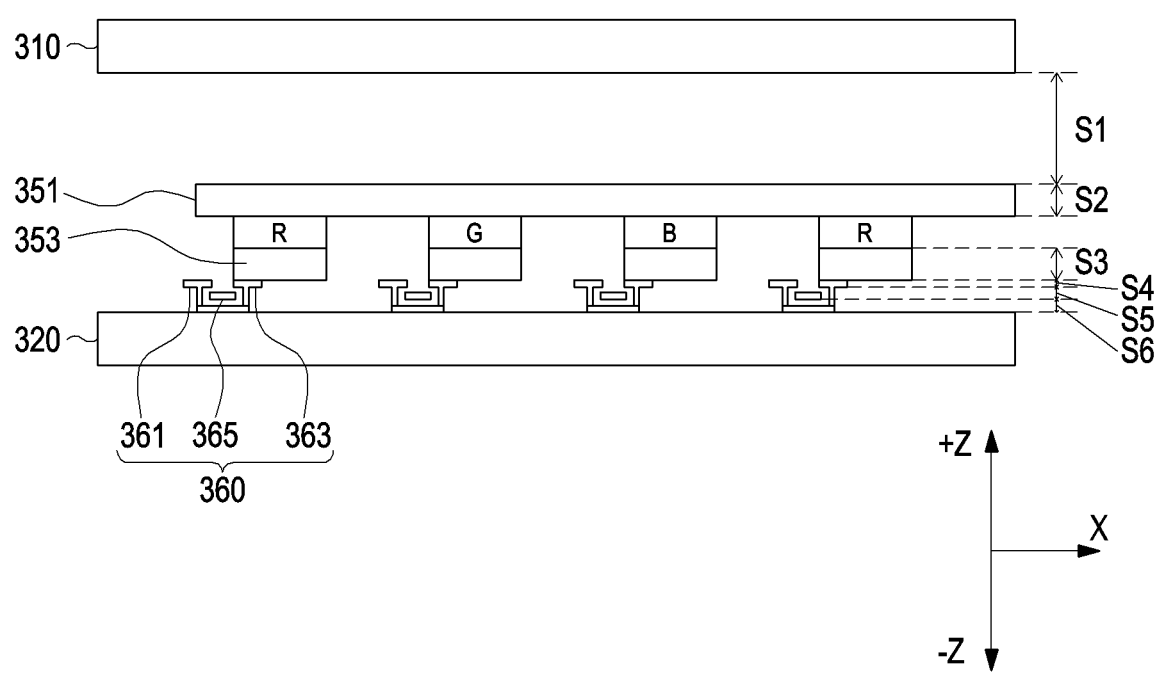
FIG. 4 is a cross-sectional view illustrating a display device according to various embodiments of the present disclosure.

FIG. 3 is an exploded perspective view illustrating an electronic device including a display device 300 according to various embodiments of the present disclosure. FIG. 4 is a cross-sectional view illustrating the display device 300 according to various embodiments of the present disclosure.

FIGS. 3 and 4 basically illustrate an embodiment of FIGS. 5 through 24 to be described below, and the display device 300 according to various embodiments of the present disclosure (e.g., the display 160 of FIG. 1) may output a screen and include at least one sensor stacked inside. The at least one sensor may be any one of the touch sensor 330 or the force sensor 340 and/or a fingerprint sensor (not illustrated).

As illustrated in FIGS. 3 and 4, the display device 300 may be arranged between a front face and a rear face of the housing (the housing 210 of FIG. 2) and may be exposed through the first transparent plate 303. The display device 300 may include a second transparent plate 310 facing the first direction (+Z) and a third transparent plate 320 facing the second direction (−Z).

According to various embodiments of the present disclosure, in the electronic device, the first transparent plate 303 may be positioned on a front face of the housing 210 to protect the display device 300 from an external environment. The display device 300 may include the touch sensor 330 or the force sensor 340 or the fingerprint sensor in the form of a panel integrated with the display device 300, thus being used as an input device as well as an output device.

According to various embodiments of the present disclosure, the touch sensor 330 may be arranged between the first transparent plate 303 and the rear cover 305 of the housing, and the force sensor 340 may be arranged between the first transparent plate 303 and the rear cover 305 of the housing. The display device 300 may implement various user experiences (e.g., three-dimensional (3D) input) through a combination of the at least one sensors 330 and 340.

According to various embodiments of the present disclosure, the electronic device may include the force sensor 330 and/or the touch sensor 340 and a support member 308 supporting a printed circuit unit 306. The support member 308 may be manufactured using a metal material and may be arranged between the display device 300 and the rear cover 305. For example, the support member 308 may be interposed between the display device 300 and the printed circuit unit 306. The support member 308 may prevent IC chips mounted on the printed circuit unit 306 from contacting the display device 300, and prevent electromagnetic interference between the IC chips by providing an electromagnetic shielding function. The support member 308 may reinforce rigidity of the electronic device. For example, in some components of the housing, multiple openings or recessed portions may be formed according to arrangement of electronic parts inside the electronic device, degrading the rigidity of the electronic device. The support member 308 may improve the rigidity of the electronic device by being mounted on and bound to the electronic device. According to various embodiments of the present disclosure, the printed circuit unit 306 may be arranged between the display device 300 and the rear cover 305, and may include at least one conductive path.

According to various embodiments of the present disclosure, a dielectric layer 302 may be arranged between the display device 300 and the first transparent plate 303, and at least one film layer 304 may be arranged between the display device 300 and the support member 308. The dielectric layer 302 may include, for example, silicon, air, foam, a membrane, an optical clear adhesive (OCA), a sponge, rubber, ink, a polymer (polycarbonate (PC) or polyethylene terephthalate (PET)), etc. A plurality of film layers 304 may be arranged, and may include a first film layer 304a that suppresses scattering of light emitted to an outside (e.g., a rear direction (−Z) of the electronic device) by directing light toward the first transparent plate 303. In another example, the plurality of film layers 304 may further include a second film layer 304b that manages a ground function, an electromagnetic shielding function preventing electromagnetic interference between IC chips, and/or a heat-emitting function. Various types of circuit devices, such as the processor 120, the memory 130, the input/output (I/O) interface 150, and the communication interface 170, which are described above with reference to FIG. 1, may be accommodated in the housing 210, and a battery 307 may be accommodated in the housing to secure a power source.

As illustrated in FIG. 4, the display device 300 may include an organic light-emitting diode (OLED) structure, and may include the second transparent plate 310 facing the first direction (+Z) and the third transparent plate 320 facing the second direction (−Z). At least one electrode may be arranged between the second transparent plate 310 and the third transparent plate 320. For example, a first electrode (a first electrode 431 of FIG. 4), a second electrode (a second electrode 441 of FIG. 4), a third electrode 351, and/or a fourth electrode 353 may be provided between the second transparent plate 310 and the third transparent plate 320.

According to various embodiments of the present disclosure, the second transparent plate 310 may include various organic materials and/or inorganic materials. The second transparent plate 310 may be formed in a form in which an organic material and an inorganic material are repetitively stacked in a plurality of layers (e.g., 5 layers). The second transparent plate 310 may include one inorganic layer.

According to various embodiments of the present disclosure, the third transparent plate 320 may include any one or two combinations selected from among acrylonitrile butadiene styrene (ABS), acrylic, polycarbonate (PC), polymethyl methacrylate (PMMA), polyimide (PI), polyethylene terephthalate (PET), polypropylene terephthalate (PPT), amorphous polyethylene terephthalate (APET), polyethylene naphthalate terephthalate (PEN), polyethylene terephthalate glycol (PETG), tri-acetyl-cellulose (TAC), cyclic olefin polymer (COP), cyclic olefin copolymer (COC), polydicyclopentadiene (DCPD), cyclopentdienyl anions (CPD), polyarylate (PAR), polyethersulfone (PES), polyetherimide (PEI), modified epoxy resin or acrylic resin.

According to various embodiments of the present disclosure, at least one of the first electrode, the second electrode, the third electrode 351, and/or the fourth electrode 353 may include a transparent or opaque conductive material. For example, at least one of the first electrode, the second electrode, the third electrode 351, and/or the fourth electrode 353 may include a transparent conductive material and include at least one of indium-tin-oxide (ITO), indium-zinc-oxide (IZO), poly(3,4-ethylenedioxythiophene) (PEDOT), silver (Ag) nanowire, a transparent high polymer conductor, or graphene. In another example, at least one of the first electrode, the second electrode, the third electrode 351, and/or the fourth electrode 353 may include an opaque conductive material and include at least one of silver (Ag), copper (Cu), magnesium (Mg), titanium (Ti), molybdenum (Mo), aluminum (Al), or graphene.

According to various embodiments of the present disclosure, the display device 300 may include a control circuit (not shown) electrically connected with the first electrode, the second electrode, the third electrode 351, and/or the fourth electrode 353. The control circuit may detect a position of a touch input with respect to the first transparent plate 310 by using the first electrode, and detect a strength of the touch input by using the second electrode. In another example, the control circuit may display visual information on at least a part of the display by using the third electrode 351 and the fourth electrode 353.

According to various embodiments of the present disclosure, the display device 300 may further include a transistor (thin film transistor (TFT)) 360 that is electrically connected to the third electrode 351 and/or the fourth electrode 353, and the transistor 360 may include a gate electrode 365, a source electrode 361, and a drain electrode 363.

According to various embodiments of the present disclosure, the first electrode and/or the second electrode may be arranged in one position of a first region S1 through a sixth region S6. For example, the first electrode and/or the second electrode may be arranged in the first region S1, that is, between the second transparent plate 310 and the third electrode 351. When the first electrode and/or the second electrode are arranged in the first region S1, the first electrode and/or the second electrode may include a transparent conductive material.

In another example, the first electrode and/or the second electrode may be arranged in the second region S2, that is, on the same plane as the third electrode 351, and may include the same material as that of the third electrode 351. When the first electrode and/or the second electrode are arranged in the second region S2, the first electrode and/or the second electrode may include a transparent conductive material.

In another example, the first electrode and/or the second electrode may be arranged in the third region S3, that is, on the same plane as the fourth electrode 353, and may include the same material as that of the fourth electrode 353. When the first electrode and/or the second electrode are arranged in the third region S3, the first electrode and/or the second electrode may include an opaque conductive material.

In another example, the first electrode and/or the second electrode may be arranged in the fourth region S4, that is, on the same plane as wirings of the source electrode 361 and/or the drain electrode 363 of the transistor 360, and may include the same material as that of the source electrode 361 and/or the drain electrode 363. When the first electrode and/or the second electrode are arranged in the fourth region S4, the first electrode and/or the second electrode may include an opaque conductive material.

In another example, the first electrode and/or the second electrode may be arranged in the fifth region S5, that is, on the same plane as a wiring of the gate electrode 363 of the transistor 360, and may include the same material as that of the gate electrode 363. When the first electrode and/or the second electrode are arranged in the fifth region S5, the first electrode and/or the second electrode may include an opaque conductive material.

In another example, the first electrode and/or the second electrode may be arranged in the sixth region S6, that is, between the gate electrode 363 and the third transparent plate 320. When the first electrode and/or the second electrode are arranged in the sixth region S6, the first electrode and/or the second electrode may include an opaque conductive material.

Hereinbelow, configurations of the first electrode and/or the second electrode arranged in each region of the display device 300 will be described.

Figure 5:
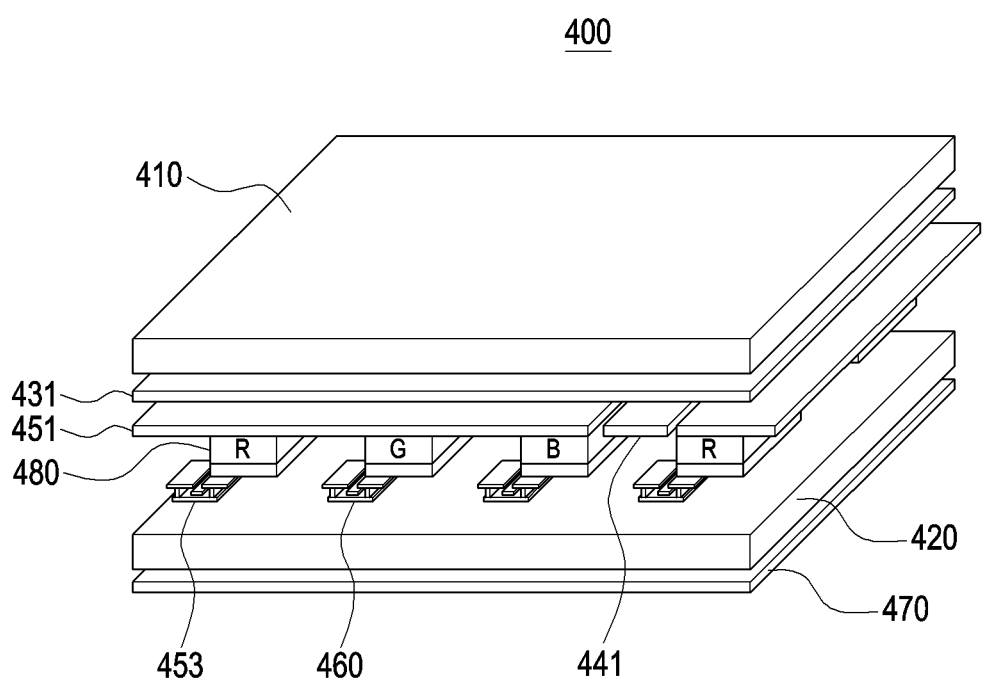
FIG. 5 is a perspective view illustrating stacked faces of a display device according to various embodiments of the present disclosure.
Figure 6:
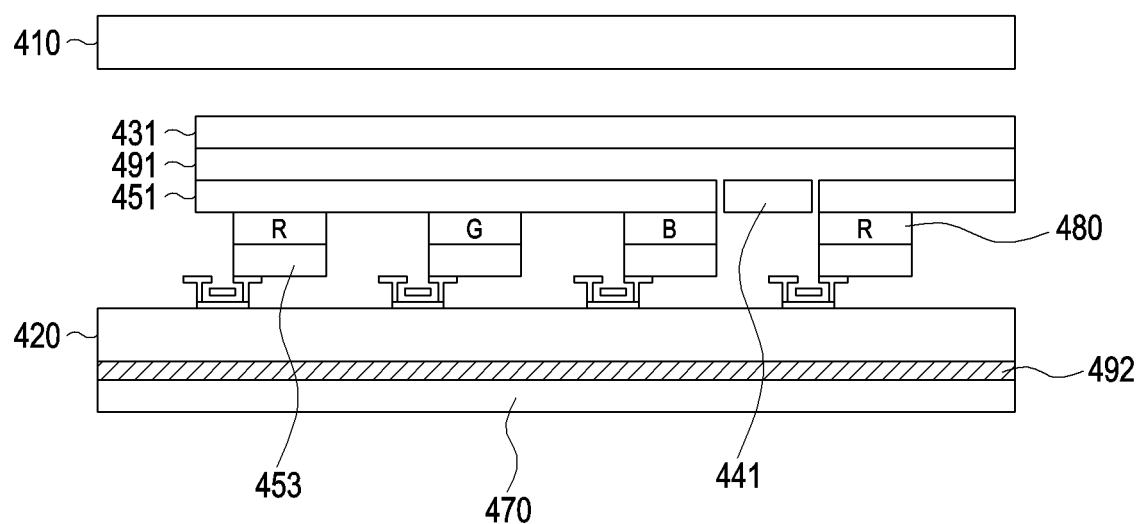
FIG. 6 is a cross-sectional view illustrating stacked faces of a display device according to various embodiments of the present disclosure.

FIG. 5 is a perspective view illustrating stacked faces of a display device 400 according to various embodiments of the present disclosure, and FIG. 6 is a cross-sectional view illustrating stacked faces of the display device 400 according to various embodiments of the present disclosure. A second transparent plate 410, a third transparent plate 420, and a transistor 460 of the display device 400 illustrated in FIGS. 5 and 6 may be the second transparent plate 310, the third transparent plate 320, and the transistor 360 illustrated in FIGS. 3 and 4.

Referring to FIGS. 5 and 6, the display device 400 may include a touch sensor (the touch sensor 330 of FIG. 3) and/or a force sensor (the force sensor 340 of FIG. 3), and the touch sensor and/or the force sensor may include at least one electrode.

According to various embodiments of the present disclosure, at least one electrode (e.g., the first electrode 431) of the touch sensor may be configured using a self-capacitance scheme that uses one electrode for each basic pixel for touch recognition and reads a change in a capacitance of the electrode, and this scheme will use a well-known technique for convenience.

In another example, the electrode using the touch sensor may be configured using a mutual capacitance scheme in which a plurality of electrodes are used and a capacitance is used between two electrodes, one of which is arranged in a horizontal axis and the other of which is arranged in a vertical axis to form a lattice structure, and a capacitance formed at an intersection between the axes is sequentially measured to detect a capacitance change at a particular point. Between the plurality of electrodes may be arranged a dielectric layer under which an optical member (not shown) may be arranged.

According to various embodiments of the present disclosure, the optical member may transmit a screen output from the display device 400, and at least one optical member may be stacked in the display device 400. Thus, the optical member may be directly adhered to the display device 400 or may be adhered to another optical member on the display device 400. For example, the optical member may include an optical compensation film, etc., for correcting a phase difference of the screen output from the display device 400.

According to various embodiments of the present disclosure, the optical member 250 may include an optical compensation film, e.g., a polarization film. The optical compensation film may be formed such that a tri-acetyl cellulose (TAC) film is adhered to both faces of a polyvinyl alcohol (PVA) film and the TAC film on the faces is protected by a surface coating layer.

According to various embodiments of the present disclosure, at least one electrode (e.g., the first electrode 431) for the touch sensor may be connected with a wiring electrode arranged on an inactive area (not shown). The wiring electrode may be connected to at least one control circuit. The control circuit may be electrically connected to at least one electrode for the touch sensor, and detect a touch position by a user's finger contacting the first transparent plate using the at least one electrode (e.g., the first electrode 431).

According to various embodiments of the present disclosure, the touch sensor may be adhered to a front face (a face on which an image output by the display is displayed) of the display device 400 or may be adhered to or formed on an inner face of the first transparent plate. The touch sensor may be implemented as a capacitive touch panel manufactured using an ITO film. According to various embodiments of the present disclosure, the touch sensor may be implemented as a resistive touch panel. When a user's body contacts or approaches the touch sensor, the touch sensor may detect a change in a capacitance to detect plane coordinates of a point that the user contacts (or approaches). Here, the plane coordinates may refer to coordinates indicating a position on the front face of the display 400.

Such touch inputs may include various gestures as well as simply touching or approaching a specific location. For example, various types of touch inputs may be performed that include, touch, which is an input action of placing a finger on the screen, tap, which is an input action of touching the screen shortly and lightly (e.g., double tap, triple tap, and quadruple tap), flick, which is an input action of placing a finger on the screen, moving the finger quickly, and then separating the finger, drag, which is an input action of moving or scrolling a screen element, drag and drop, which is an input action of moving a screen element in a touch state and then separating the finger from the screen in a stopped state, swipe, which is an input action of moving a finger over a predetermined distance in one direction in a state where two, three or more fingers touch a screen, multi swipe, which is an input action of two, three, or more fingers by a predetermined distance in a state where the fingers touch the screen, pinch that is an input action of moving two fingers in different directions in a state where the fingers touch the screen, touch and hold, which is an input action of maintaining a touch state until a screen element appears, and shake, which is an input action of shaking the device so as to operate an action.

According to various embodiments of the present disclosure, the display device 400 may include a structure in which a force sensor for one panel or a force sensor for arrangement of a plurality of panels is arranged on the entire back face of the second transparent plate 410.

According to various embodiments of the present disclosure, at least one electrode (e.g., the second electrode 441) including the force sensor may be configured using the self-capacitance scheme that uses one electrode for each basic pixel for a touch pressure and reads a change in a capacitance of the electrode.

In another example, the electrode using the force sensor may be configured using the mutual capacitance scheme in which a plurality of electrodes are used and a capacitance is used between two electrodes, one of which is arranged in a horizontal axis and the other of which is arranged in a vertical axis to form a lattice structure, and a capacitance formed at an intersection between the axes is sequentially measured to detect a capacitance change at a particular point.

According to various embodiments of the present disclosure, the force sensor using the mutual capacitance scheme may include a plurality of electrodes that are arranged separated from one another. For example, one electrode (e.g., the second electrode 441) of the force sensor may be arranged substantially on the same plane as one of the third electrode 451 or the fourth electrode 453. Another electrode (e.g., a fifth electrode 470) of the force sensor may be arranged between the third transparent plate 420 and a second face (the second face 240 of the housing of FIG. 2)

of the housing. The second electrode 441 and the fifth electrode 470 may be electrically connected with the control circuit to detect a strength of a touch pressure.

In another example, the fifth electrode 470 may include a ground member that may be manufactured to have substantially the same size as that of the display 400.

According to various embodiments of the present disclosure, the display device 400 may include a dielectric layer 491 between the first electrode 431 and the fourth electrode 441. In another example, the display device 400 may include a dielectric layer 492 between the third transparent plate 420 and the fifth electrode 470, and the dielectric layers 491 and 492 may include one of or a combination of a black embo layer (PET), a porous material (foam), a membrane, a polymer layer, and an air gap.

According to various embodiments of the present disclosure, the second electrode 441 may be arranged on the same layer or on the same plane as the third electrode 451. The third electrode 451 may be a display electrode. Thus, the other region than a region where the R, G, or B pixel of the display is arranged may be configured under the second electrode 441, such that the R, G, or B pixel of the display may be arranged under the third electrode 451. An organic light-emitting diode 480 that configures the R, G, or B pixel of the display may be arranged between the third electrode and the fourth electrode.

According to various embodiments of the present disclosure, the second electrode 441 may be arranged between parts of the third electrode 451 or alternately with the third electrode 451, and may include the same material as that of the third electrode 451. For example, the second electrode 441 may include a transparent conductive material and include at least one of ITO, IZO, PEDOT, Ag nanowire, a transparent high polymer conductor, or graphene. In another example, the second electrode 441 may apply the same voltage to the entire display device 400.

According to various embodiments of the present disclosure, in the case that a user's body, etc., is in proximity to or contacts a first transparent plate (the first transparent plate 303 of FIG. 3) of the display device 400, a change in a capacitance occurs between the pressure electrodes and the force sensor may detect the change in the capacitance. The change in the capacitance differs with a distance to which the user's body approaches the first transparent plate or a pressure by which the user's body contacts the first transparent plate, such that the force sensor may obtain vertical coordinates with respect to a face of the display device 400 by calculating an approaching distance or a contacting pressure with respect to the display device 400 from the change in the capacitance.

According to various embodiments of the present disclosure, the display device 400 may calculate an approaching distance or a contacting pressure of the user's body with respect to the display device 400 from a change in a capacitance or in a resistance, detected from the force sensor, and may calculate a digital value, e.g., vertical coordinates, with respect to the display 210, from the pressure. The control circuit (e.g., the processor 120) may obtain 3D coordinates by combining the calculated digital value with plane coordinates detected by the touch sensor, and may provide a new user experience by implementing a 3D touch input using the obtained 3D coordinates through the display device 400.

According to various embodiments of the present disclosure, the force sensor may be implemented as a capacitive type, and in this case, without a separate control circuit (e.g., a force sensor IC), the force sensor may be controlled or data detected from the force sensor may be processed by using a control circuit of the touch panel or a touch key (e.g., some of all channels of the touch sensor IC).

Figure 7A:
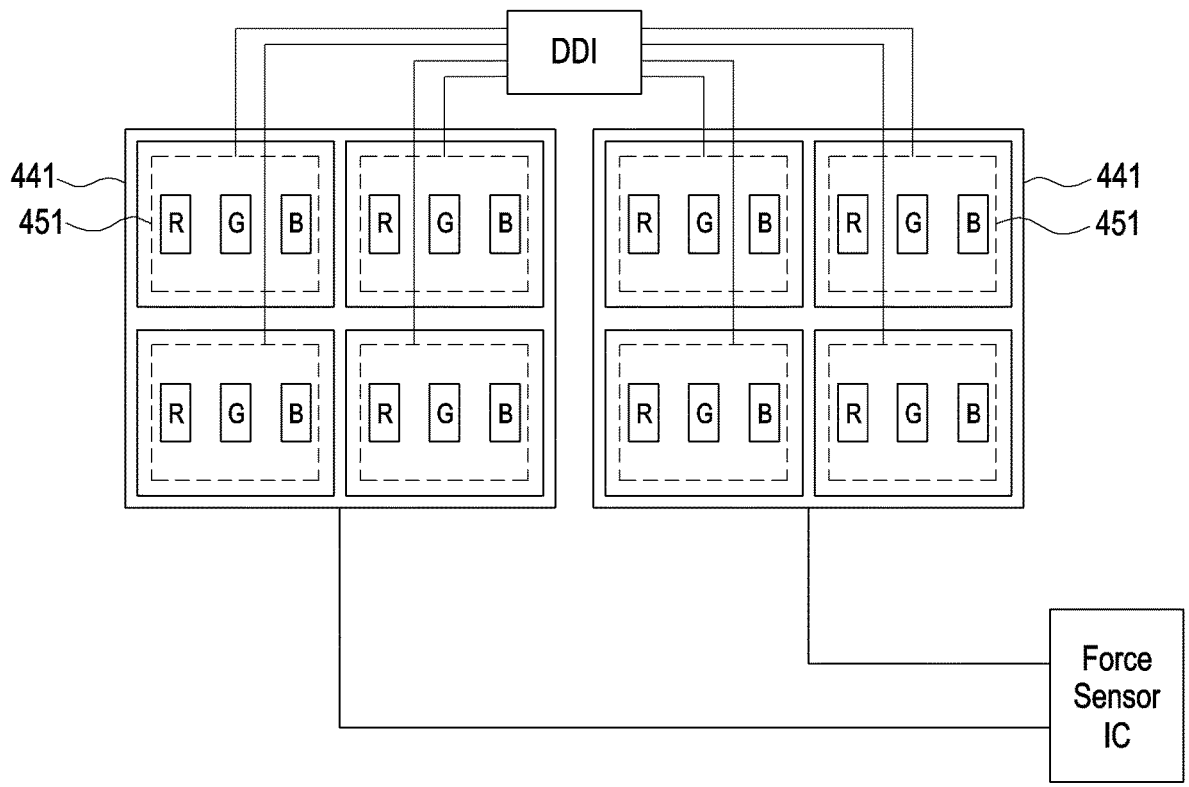
FIGS. 7A and 7B are plane views each illustrating an electrode arrangement structure of a force sensor, according to various embodiments of the present disclosure.
Figure 7B:
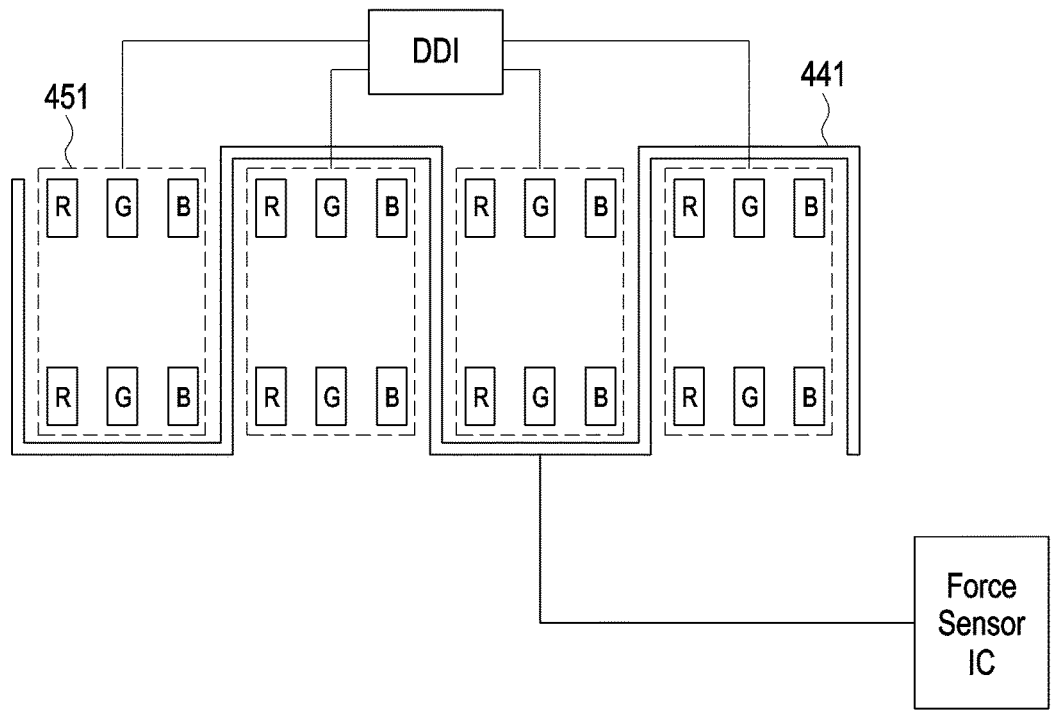

FIGS. 7A and 7B are plane views each illustrating an electrode arrangement structure of a force sensor, according to various embodiments of the present disclosure.

Referring to FIG. 7A, the second electrodes 441 of the force sensor may be configured as a bridge structure arranged around one organic light-emitting material set configured using R, G, and B pixels of the display. For example, the second electrodes 441 may be arranged to surround the one set, and the second electrodes 441 are globally interconnected to function as, for example, a capacitor with or between the ground and/or other electrodes. The second electrodes 441 may be configured in the first direction (+Z) from the R, G, and B pixels in such a way no to overlap top faces of the R, G, and B pixels.

According to various embodiments of the present disclosure, the third electrodes 451 of the display may be arranged on the same plane as the second electrodes 441 by a specific space therebetween. The third electrodes 451 may be arranged on the top faces of the R, G, and B pixels, and when viewed from top, may be arranged overlappingly.

According to various embodiments of the present disclosure, at least some (e.g., two or more) of the touch sensor and the force sensor may be included in one integrated chip (IC) or an IC package. For example, the second electrodes 441 of the force sensor may be connected with the force sensor IC, and third electrodes 731 of the display may be connected with a display driver IC (DDI) and may perform a sensing operation depending on a circuit operation. Each force IC and/or DDI may operate as an integrated IC. These ICs may be connected with a processor.

Referring to FIG. 7B, the second electrodes 441 of the force sensor may be configured as a bridge structure arranged around one organic light-emitting material set configured using R, G, and B pixels of the display. For example, the second electrode 441 may be configured in the form of a coil surrounding at least a partial region around the at least one set to form one inductor. For example, the force sensor may sense a pressure-caused inductance change occurring in the second electrode 441 that is an inductor. The second electrode 441 may be configured in the first direction (+Z) from the R, G, and B pixels in such a way no to overlap top faces of the R, G, and B pixels.

According to various embodiments of the present disclosure, the third electrodes 451 of the display may be arranged on the same plane as the second electrodes 441 by a specific space therebetween. The third electrodes 451 may be arranged on the top faces of the R, G, and B pixels, and when viewed from top, may be arranged overlappingly.

According to various embodiments of the present disclosure, at least some (e.g., two or more) of the touch sensor and the force sensor may be included in one IC or an IC package. For example, the second electrodes 441 of the force sensor may be connected with the force sensor IC, and third electrodes 451 of the display may be connected with a display driver IC (DDI) and may perform a sensing operation depending on a circuit operation. Each force IC and/or DDI may operate as an integrated IC. These ICs may be connected with a processor.

Figure 8:
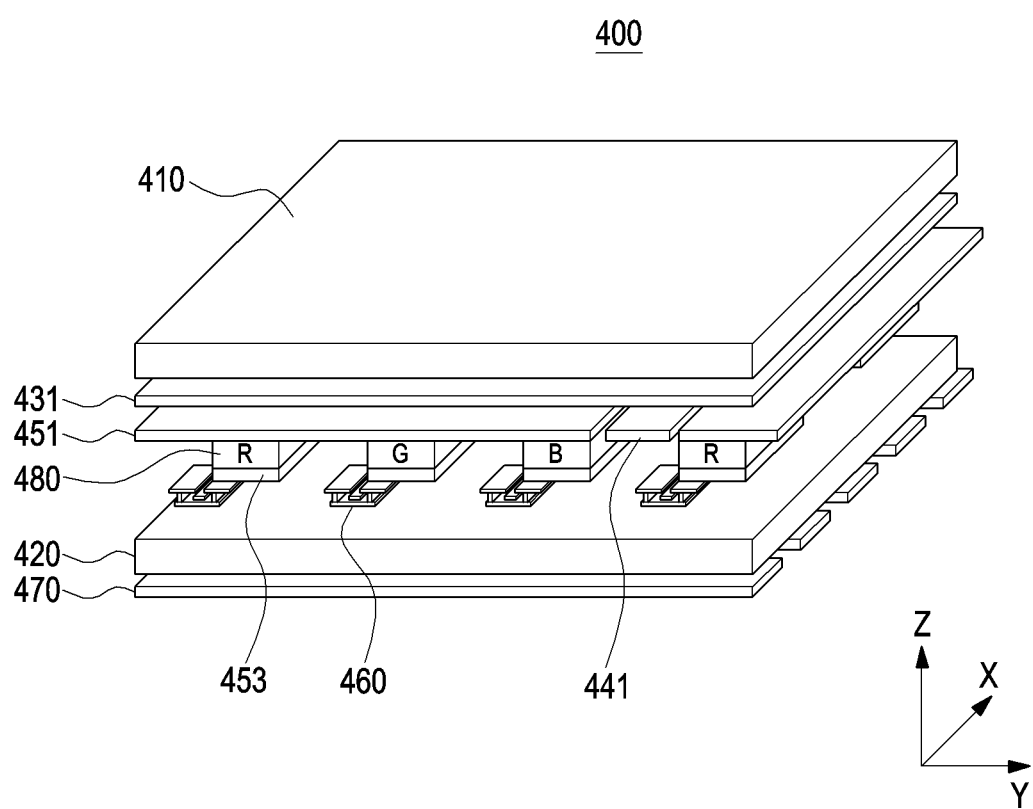
FIG. 8 is a perspective view illustrating stacked faces of a display device according to another embodiment of the present disclosure.

FIG. 8 is a perspective view illustrating stacked faces of the display device 400 according to another embodiment of the present disclosure. The second transparent plate 410, the third transparent plate 420, and the transistor 460 of the display device 400 illustrated in FIG. 8 may be the second transparent plate 310, the third transparent plate 320, and the transistor 360 illustrated in FIGS. 5 and 6.

Referring to FIG. 8, the display device 400 may include the touch sensor and/or the force sensor, and the touch sensor and/or the force sensor may include at least one electrode.

According to various embodiments of the present disclosure, the display device 400 may include a fifth electrode 470 under the third transparent plate 420. The fifth electrode 470 may be used as an electrode of the touch sensor and/or an electrode of the force sensor. For example, a touch sensor of a mutual capacitive type may use the first electrode 431 and the fifth electrode 470 that are arranged on the third transparent plate 420. In another example, the force sensor may use the second electrode 441 and the fifth electrode 470 that are arranged on the third transparent plate 420. The fifth electrode 470 may be used as a shared electrode between the touch sensor and the force sensor. For example, a transmission (Tx) signal for both the touch sensor and the force sensor may be applied to or a reception (Rx) signal may be applied to the fifth electrode 470.

According to various embodiments of the present disclosure, the first electrode 431 and the fifth electrode 470 may be electrically connected to each other, thus forming a touch sensor. According to an embodiment of the present disclosure, the first electrode 431 and the fifth electrode 470 may be electrically connected to each other, thus forming a touch sensor. In another embodiment of the present disclosure, the second electrode 441 and the fifth electrode 470 may be electrically connected to each other, thus forming a force sensor. A sensing region of the touch sensor and/or a sensing region of the force sensor may be provided to include a transmission electrode layer, an insulating layer, and a reception electrode layer on a substrate. The touch sensor and the force sensor may detect a touch or pressure sensing signal by sensing a signal at a reception electrode in response to a driving signal at transmission electrodes in a mutual capacitive manner in each mode.

According to an embodiment of the present disclosure, a transmission electrode layer of a sensor may be the first electrode 431 or the second electrode 441, and a reception electrode layer of the sensor may be the fifth electrode 470. According to another embodiment of the present disclosure, the fifth electrode 470 that is a reception electrode layer may be a shared electrode 661, and a transmission electrode layer may be a fingerprint electrode 621 or a touch electrode 631. According to an embodiment of the present disclosure, when a user's touch position or strength is detected using the fifth electrode 470 as a reception electrode, parasitic capacitance may be generated by coupling in an overlapping region between the first electrode 431 and the second electrode 441. The parasitic capacitance is generated in proportional to an area of an overlapping region between the fingerprint electrode and the touch electrode. According to the present disclosure, the first electrode 431 and the second electrode 441 are alternately arranged spaced apart from each other structurally on the same plane to minimize overlapping between the first electrode 431 and the second electrode 441, thereby reducing an influence upon parasitic capacitance and thus maintaining the performance of detection of touch position and strength.

According to various embodiments of the present disclosure, electrodes of the touch sensor and/or electrodes of the force sensor may be arranged in the form of a mesh arranged to alternate each other. For example, the plurality of first electrodes 431 and/or second electrodes 441 may be formed in a first pattern in which they are arranged in parallel in bar forms along a third (X) direction, and the plurality of fifth electrodes 470 may be formed in a second pattern in which they are arranged in parallel in bar forms along a fourth (Y) direction. The third (X) direction and the fourth (Y) direction may be orthogonal to each other. According to an embodiment of the present disclosure, arrangement of electrodes in the bar forms that are orthogonal to each other has been illustrated, but any one of the first electrode 431, the second electrode 441, and/or the fifth electrode 470 may have various shapes such as a bridge shape, and may also have an overlapping region while being orthogonal to each other. For example, a pattern of the first electrodes 431 and/or the second electrodes 441 may be a connection of a plurality of lines arranged along a region except for a region where the fifth electrodes 470 are arranged, thus minimizing overlapping with the fifth electrodes 470.

Figure 9:
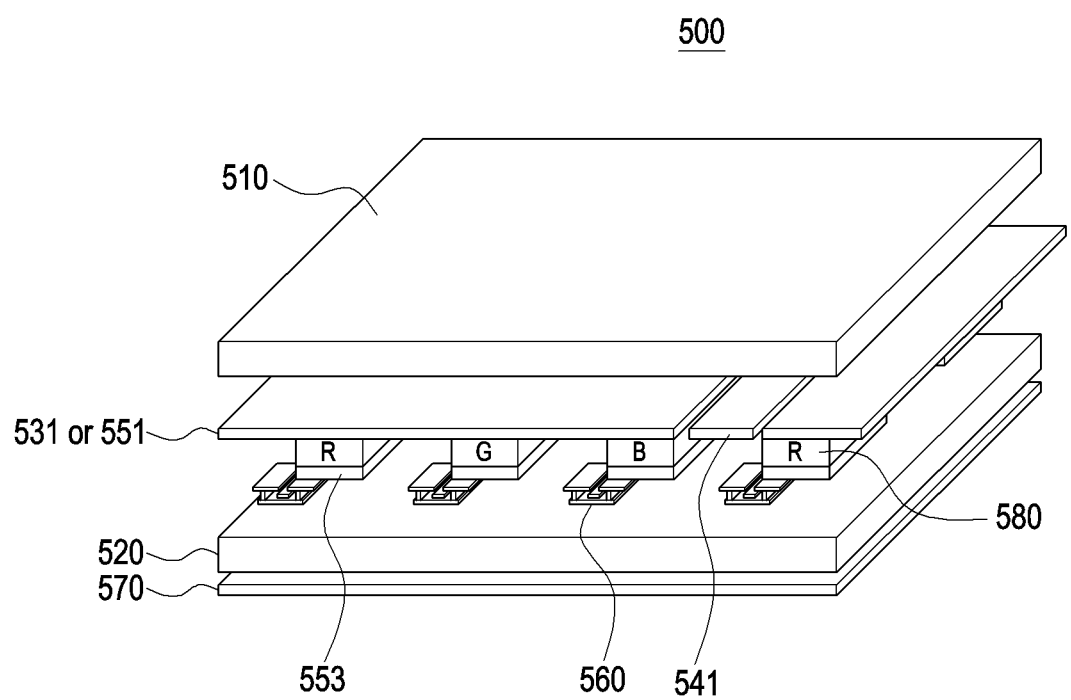
FIG. 9 is a perspective view illustrating stacked faces of a display device according to various embodiments of the present disclosure.
Figure 10:
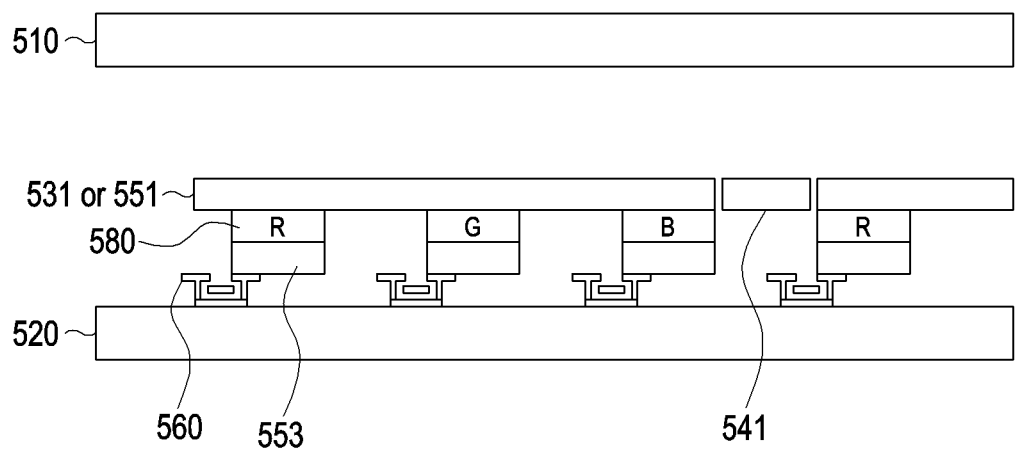
FIG. 10 is a cross-sectional view illustrating stacked faces of a display device according to various embodiments of the present disclosure.

FIG. 9 is a perspective view illustrating stacked faces of a display device 500 according to various embodiments of the present disclosure, and FIG. 10 is a cross-sectional view illustrating stacked faces of the display device 500 according to various embodiments of the present disclosure. A second transparent plate 510, a third transparent plate 520, and a transistor 560 of the display device 500 illustrated in FIGS. 9 and 10 may be the second transparent plate 310, the third transparent plate 320, and the transistor 360 illustrated in FIGS. 3 and 4.

FIGS. 9 and 10 illustrate another embodiment compared with FIG. 5, in which an overall structure is similar with a structure illustrated in FIG. 5, such that a description will be made based on differences.

Referring to FIGS. 9 and 10, the display device 500 may include the touch sensor and/or the force sensor, and the touch sensor and/or the force sensor may include at least one electrode. The second electrode 541 of the force sensor may be arranged substantially on the same plane as one of the third electrode 551 or a fourth electrode 553.

According to various embodiments of the present disclosure, the first electrode 531 of the touch sensor may be the third electrode 551 that is the display electrode, and may operate in a non-overlapping time period based on time-division switch driving. By using a common electrode according to the present disclosure, an electrode for a touch sensor does not need to be further configured, thus implementing slimmerization and material saving of the electronic device.

Figure 11:
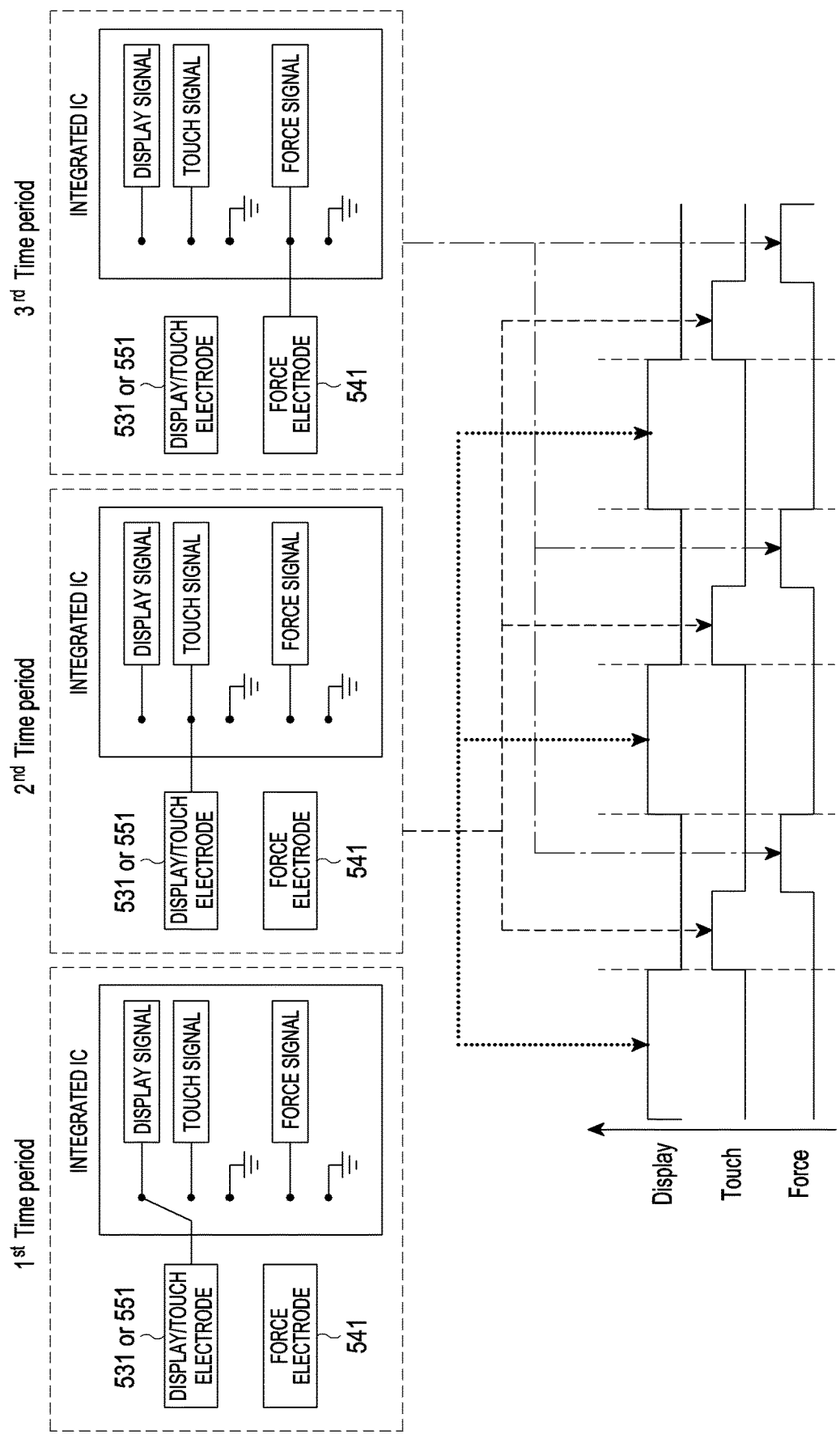
FIGS. 11 and 12 are schematic views each illustrating time-division switching driving of a display device based on an embodiment of FIG. 9, according to various embodiments of the present disclosure.
Figure 12:
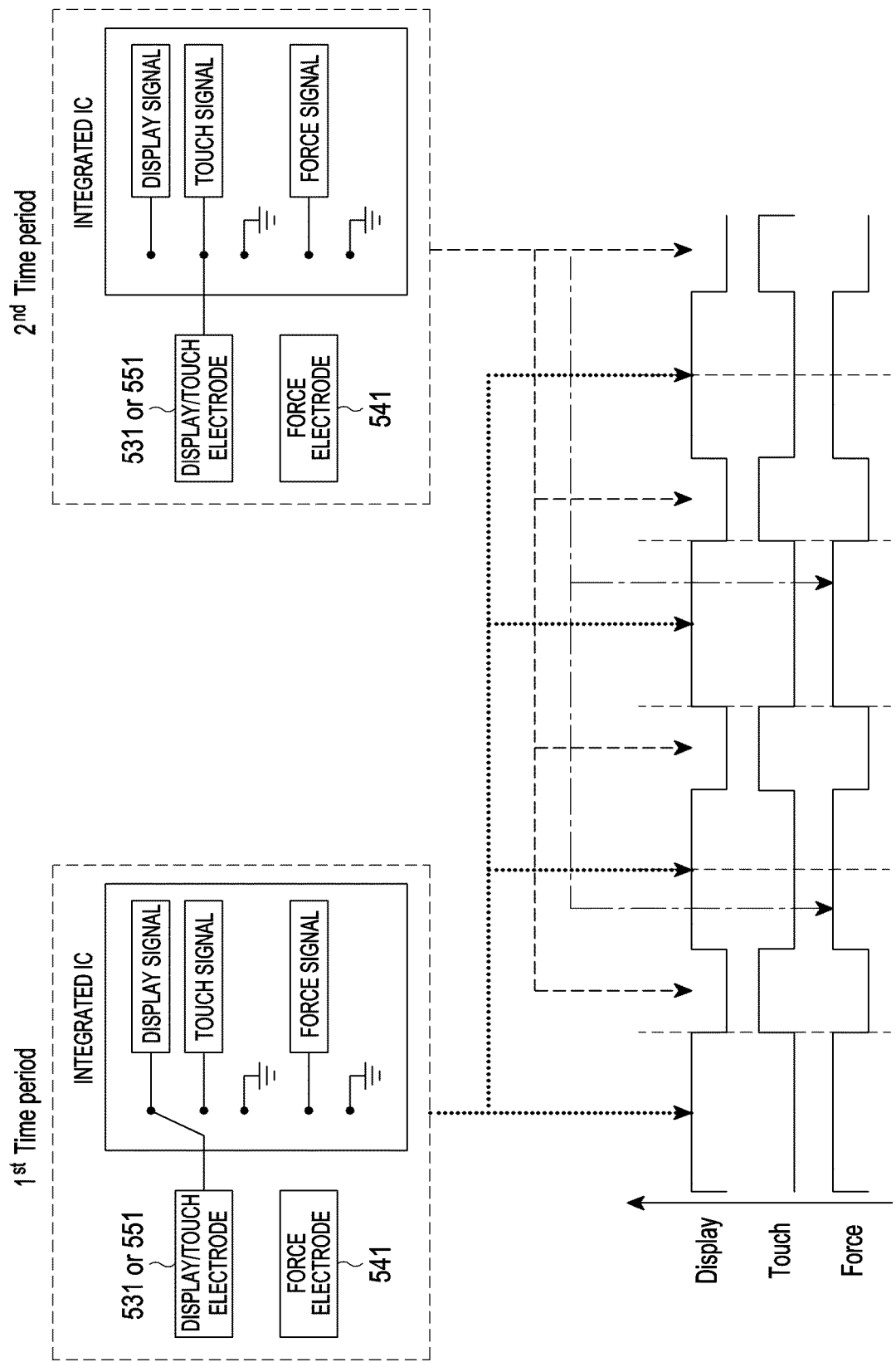

FIGS. 11 and 12 are schematic views each illustrating time-division switching driving of the display device 500 based on an embodiment of FIG. 9, according to various embodiments of the present disclosure.

As illustrated in FIG. 11, a 3D input method using the display device 500 may divide time into three periods and may transmit/receive a signal of one of a display electrode (e.g., the third electrode 551 and/or the fourth electrode 553, a touch electrode (e.g., the first electrode 531), and/or a pressure electrode (e.g., the second electrode 541) in each period. According to an embodiment of the present disclosure, the display electrode and the touch electrode may be used as a common electrode.

According to various embodiments of the present disclosure, the electronic device may include a control circuit electrically connected with the first electrode 531, the second electrode 541, the third electrode 551, and/or the fourth electrode 553. The control circuit may sense a position of a touch input of the user by using the first electrode 531, sense a strength of the touch input of the user by using the second electrode 541, and display visual information in at least a part of the display by using the third electrode 551 and the fourth electrode 553.

According to various embodiments of the present disclosure, the display device 500 of the electronic device may repetitively perform time-division driving in three periods. For example, in a first time period, the display device 500 may receive the reception signal through the third electrode 551 and/or the fourth electrode 553. In the first time period, a driving voltage may be applied through a display electrode, and a reference voltage, e.g., a ground voltage or a particular voltage may be applied to the first electrode 531 and the second electrode 541.

According to various embodiments of the present disclosure, in a second time period, the display device 500 may receive the reception signal through the first electrode 531. In the second time period, a driving voltage may be applied through the first electrode 531, and a reference voltage, e.g., a ground voltage or a particular voltage may be applied to the third electrode 551 and/or the fourth electrode 553 and the second electrode 541. In the second time period, the first electrode 531 may detect a touch sensing signal by sensing a signal at a touch reception electrode, which responds to a driving signal of fingerprint transmission electrodes using a change in a capacitance. The first electrode 531 may use the self-capacitance scheme that uses one electrode for each basic pixel for touch recognition and reads a change in a capacitance of the electrode.

According to various embodiments of the present disclosure, in a third time period, the display device 500 may receive the reception signal through the second electrode 541. In the third time period, a driving voltage may be applied through the second electrode 541, and a reference voltage, e.g., a ground voltage or a particular voltage may be applied to the third electrode 551 and/or the fourth electrode 553 and the first electrode 531. In the third time period, the second electrode 541 may detect a pressure sensing signal by sensing a signal at a pressure reception electrode, which responds to a driving signal of pressure transmission electrodes using a change in a capacitance. The second electrode 541 may use the self-capacitance scheme that uses one electrode for each basic pixel for touch recognition and reads a change in a capacitance of the electrode.

As illustrated in FIG. 12, a 3D input method using the display device 500 may divide time into two time periods and may transmit/receive a signal of one of a display electrode (e.g., the third electrode 551 and/or the fourth electrode 553), a touch electrode (e.g., the first electrode 531), and/or a pressure electrode (e.g., the second electrode 541) in each time period. According to an embodiment of the present disclosure, the display electrode and the touch electrode may be used as a common electrode.

According to various embodiments of the present disclosure, the electronic device may include a control circuit electrically connected with the first electrode 531, the second electrode 541, the third electrode 551, and/or the fourth electrode 553. The control circuit may sense a position of a touch input of the user by using the first electrode 531, sense a strength of the touch input of the user by using the second electrode 541, and display visual information in at least a part of the display by using the third electrode 551 and/or the fourth electrode 553.

According to various embodiments of the present disclosure, the display device 500 of the electronic device may repetitively perform time-division driving in two time periods, unlike in the previous embodiment (the embodiment of FIG. 11). For example, in a first time period, the display device 500 may receive the reception signal through the display electrode (e.g., the third electrode 551 and/or the fourth electrode 553) and the pressure electrode (e.g., the second electrode 541). In the first time period, a driving voltage may be applied through the third electrode 551 and/or the fourth electrode 553 and the second electrode 541, and a reference voltage, e.g., a ground voltage or a particular voltage may be applied to the first electrode 531.

According to various embodiments of the present disclosure, in a second time period, the display device 500 may receive the reception signal through the touch electrode (e.g., the first electrode 531). In the second time period, a driving voltage may be applied through the first electrode 531, and a reference voltage, e.g., a ground voltage or a particular voltage may be applied to the third electrode 551 and/or the fourth electrode 553 and the second electrode 541.

According to various embodiments of the present disclosure, as the display device 500 of the electronic device uses the display electrode (e.g., the third electrode 551 and/or the fourth electrode 553) and the touch electrode (e.g., the first electrode 531) in different time periods through one electrode, the display device 500 may use the one electrode as the display electrode in the first time period and as the touch electrode in the second time period.

Figure 13:
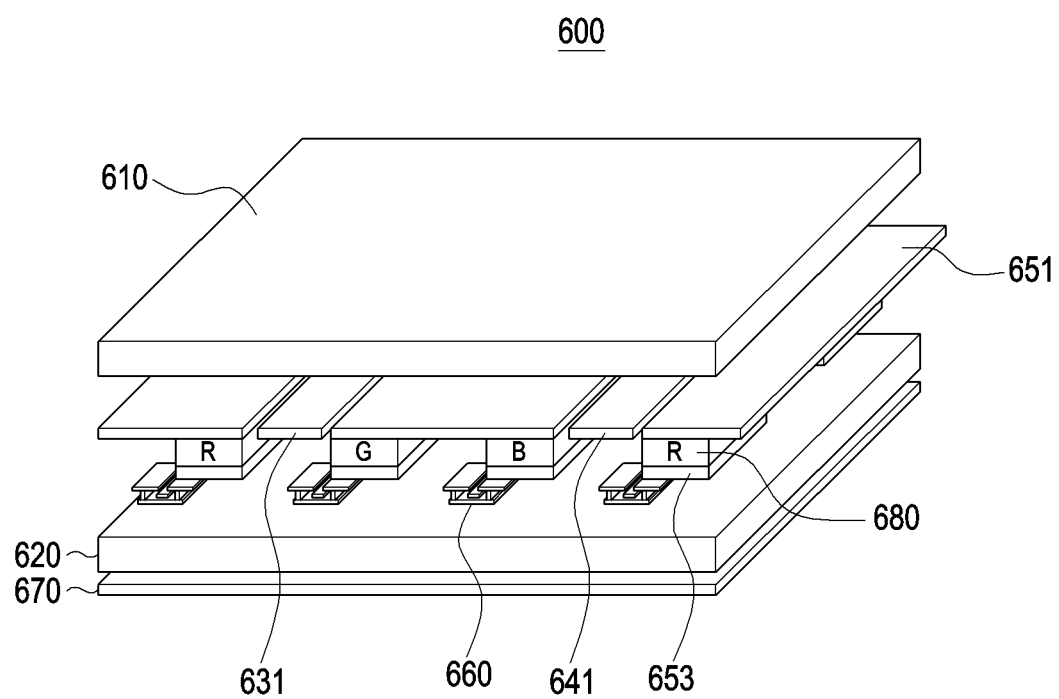
FIG. 13 is a perspective view illustrating stacked faces of a display device according to various embodiments of the present disclosure.
Figure 14:
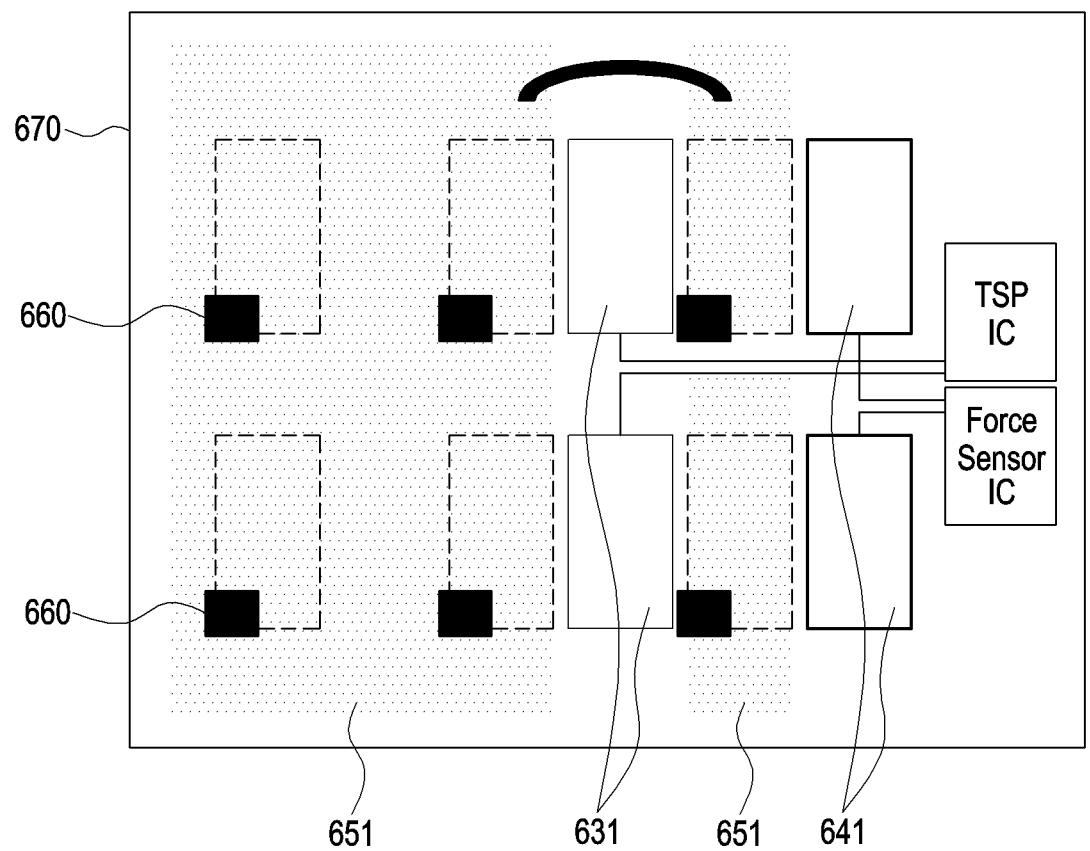
FIG. 14 is a projected plan view illustrating some components of a display device viewed from top, according to various embodiments of the present disclosure.

FIG. 13 is a perspective view illustrating stacked faces of a display device 600 according to various embodiments of the present disclosure, and FIG. 14 is a projected plan view illustrating some components of the display device 600 viewed from top, according to various embodiments of the present disclosure. A second transparent plate 610, a third transparent plate 620, and a transistor 660 of the display device 600 illustrated in FIGS. 13 and 14 may be the second transparent plate 310, the third transparent plate 320, and the transistor 360 illustrated in FIGS. 3 and 4.

FIGS. 13 and 14 illustrate another embodiment compared with FIG. 5, in which an overall structure is similar with a structure illustrated in FIG. 5, such that a description will be made based on differences.

Referring to FIGS. 13 and 14, the display device 600 may include the touch sensor and/or the force sensor, and the touch sensor and/or the force sensor may include at least one electrode.

According to various embodiments of the present disclosure, the touch sensor may include at least one electrode, and at least one electrode (e.g., the second electrode 631) including the force sensor may be configured using the self-capacitance scheme that uses one electrode for each basic pixel for touch recognition and reads a change in a capacitance of the electrode.

According to various embodiments of the present disclosure, one electrode of the touch sensor (e.g., the first electrode 631) may be arranged on the same layer or on the same plane as the third electrode 651. The third electrode 651 may be a display electrode. an organic light-emitting diode 680 including the R, G, or B pixel of the display may be arranged under the third electrode 651, and the other region than a region where the R, G, or B pixel of the display is arranged may be configured under the first electrode 631.

According to various embodiments of the present disclosure, the first electrode 631 may be arranged alternately with the second electrode 641 or the third electrode 651, and may include the same material as that of the third electrode 651. For example, the first electrode 631 may include a transparent conductive material and include at least one of ITO, IZO, PEDOT, Ag nanowire, a transparent high polymer conductor, or graphene. In another example, the first electrode 631 may apply the same voltage to the entire display device 600.

According to various embodiments of the present disclosure, like the touch sensor, the force sensor may include at least one electrode, and at least one electrode (e.g., the second electrode 641) of the force sensor may be configured using the self-capacitance scheme that uses one electrode for each basic pixel for touch recognition and reads a change in a capacitance of the electrode.

According to various embodiments of the present disclosure, one electrode of the force sensor (e.g., the second electrode 641) may be arranged on the same layer or on the same plane as the third electrode 651. The third electrode 651 may be a display electrode. an organic light-emitting diode 680 including the R, G, or B pixel of the display may be arranged under the third electrode 651, and the other region than a region where the R, G, or B pixel of the display is arranged may be configured under the first electrode 631.

According to various embodiments of the present disclosure, the second electrode 641 may be arranged alternately with the first electrode 631 or the third electrode 651, and may include the same material as that of the third electrode 651. For example, the second electrode 641 may include a transparent conductive material and include at least one of ITO, IZO, PEDOT, Ag nanowire, a transparent high polymer conductor, or graphene. In another example, the second electrode 641 may apply the same voltage to the entire display device 600.

According to various embodiments of the present disclosure, the third electrode 651 may be connected as one depending on a bridge structure. In another example, the fifth electrode 670 may include a ground member that may be manufactured to have substantially the same size as that of the display 600.

Figure 15:
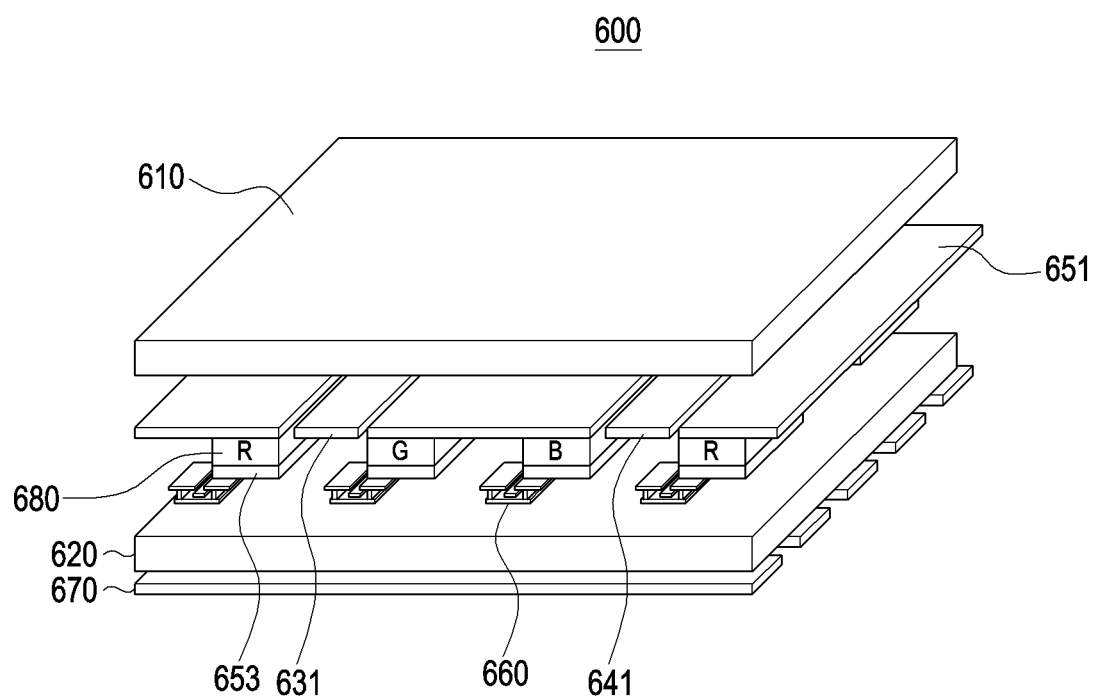
FIG. 15 is a perspective view illustrating stacked faces of a display device according to various embodiments of the present disclosure.
Figure 16:
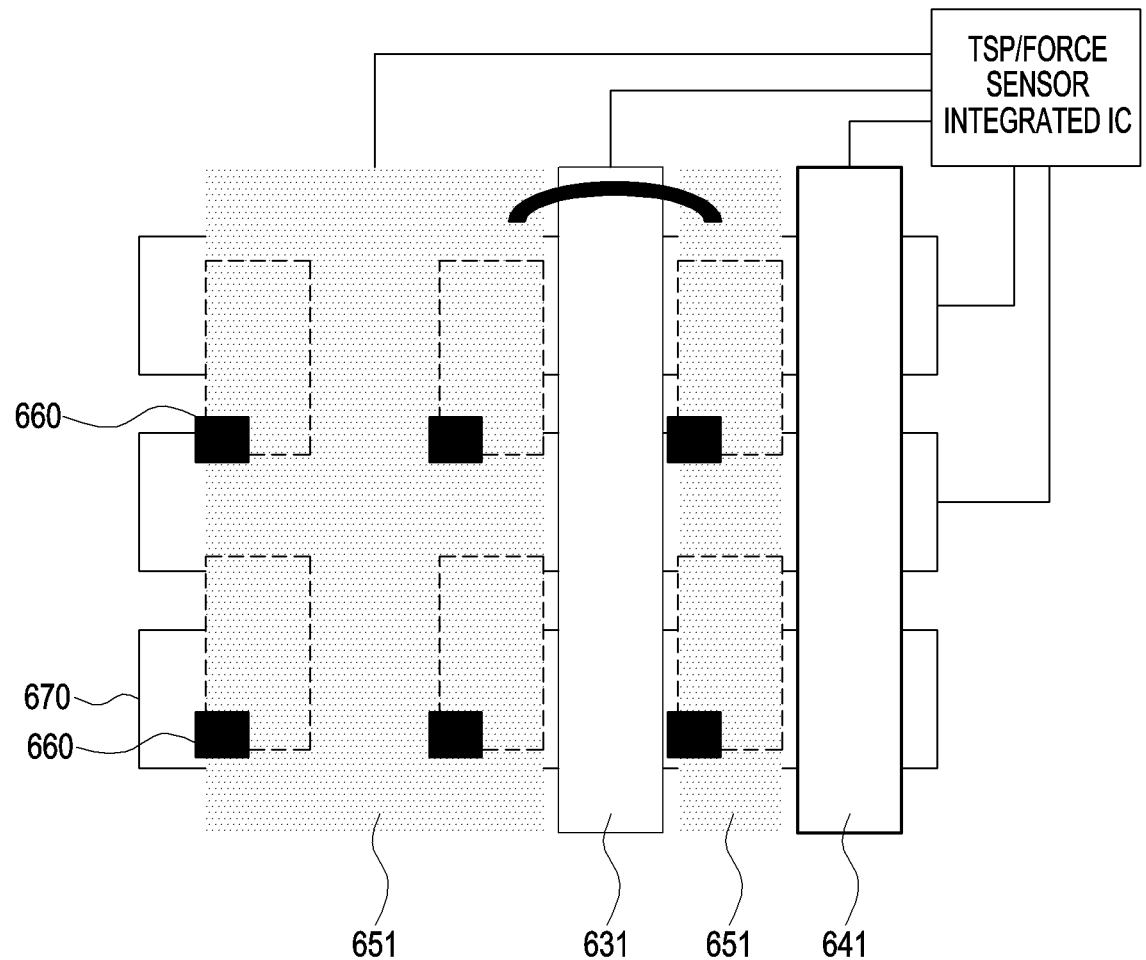
FIG. 16 is a projected plan view illustrating some components of a display device viewed from top, according to various embodiments of the present disclosure.

FIG. 15 is a perspective view illustrating stacked faces of a display device 600 according to various embodiments of the present disclosure, and FIG. 16 is a projected plan view illustrating some components of the display device 600 viewed from top, according to various embodiments of the present disclosure. A second transparent plate 610, a third transparent plate 620, and a transistor 660 of the display device 600 illustrated in FIGS. 15 and 16 may be the second transparent plate 310, the third transparent plate 320, and the transistor 360 illustrated in FIGS. 3 and 4.

FIGS. 15 and 16 illustrate another embodiment compared with FIGS. 13 and 14, in which an overall structure is similar with a structure illustrated in FIGS. 13 and 14, such that a description will be made based on differences.

Referring to FIGS. 15 and 16, the display device 600 may include the touch sensor and/or the force sensor, and the touch sensor and/or the force sensor may include at least one electrode.

According to various embodiments of the present disclosure, the electrode using the touch sensor (e.g., the first electrode 631 and the fifth electrode 670) may use the mutual capacitance scheme in which a plurality of electrodes are used and a capacitance is used between two electrodes, one of which is arranged in a horizontal axis and the other of which is arranged in a vertical axis to form a lattice structure, and a capacitance formed at an intersection between the axes is sequentially measured to detect a capacitance change at a particular point.

According to various embodiments of the present disclosure, one electrode of the touch sensor (e.g., the first electrode 631) may be arranged on the same layer or on the same plane as the third electrode 651. The third electrode 651 may be a display electrode. Another electrode (e.g., a fifth electrode 670) of the touch sensor may be arranged between the third transparent plate 620 and a second face (the second face 240 of the housing of FIG. 2) of the housing.

According to various embodiments of the present disclosure, the force sensor (e.g., the second electrode 641 and the fifth electrode 570) may include at least a plurality of electrodes like the touch sensor, and at least one electrode (e.g., the second electrode 641) of the force sensor may be arranged on the same layer or on the same plane as the third electrode 651. The third electrode 651 may be a display electrode. Another electrode (e.g., a fifth electrode 670) of the touch sensor may be arranged between the third transparent plate 620 and a second face (the second face 240 of the housing of FIG. 2) of the housing.

According to various embodiments of the present disclosure, the fifth electrode 670 may be a common electrode used as the touch sensor or the force sensor. The fifth electrode 670 may be used as a shared electrode between the touch sensor and the force sensor. For example, a transmission (Tx) signal for both the touch sensor and the force sensor may be applied to or a reception (Rx) signal may be applied to the fifth electrode 670. In another example, the plurality of first electrodes 631 and/or second electrodes 641 may be arranged in parallel in bar forms along the third (X) direction, and the plurality of fifth electrodes 670 may be arranged in parallel in bar forms along the fourth (Y) direction. The third (X) direction and the fourth (Y) direction may be orthogonal to each other. According to an embodiment of the present disclosure, arrangement of electrodes in bar forms that are orthogonal to each other has been illustrated, but a pattern of the touch electrode 631 or the pressure electrode 641 may be a connection of a plurality of lines arranged along the other region than a region where the fingerprint electrode 621 is arranged to minimize overlapping with the fingerprint electrode 621.

Figure 17:
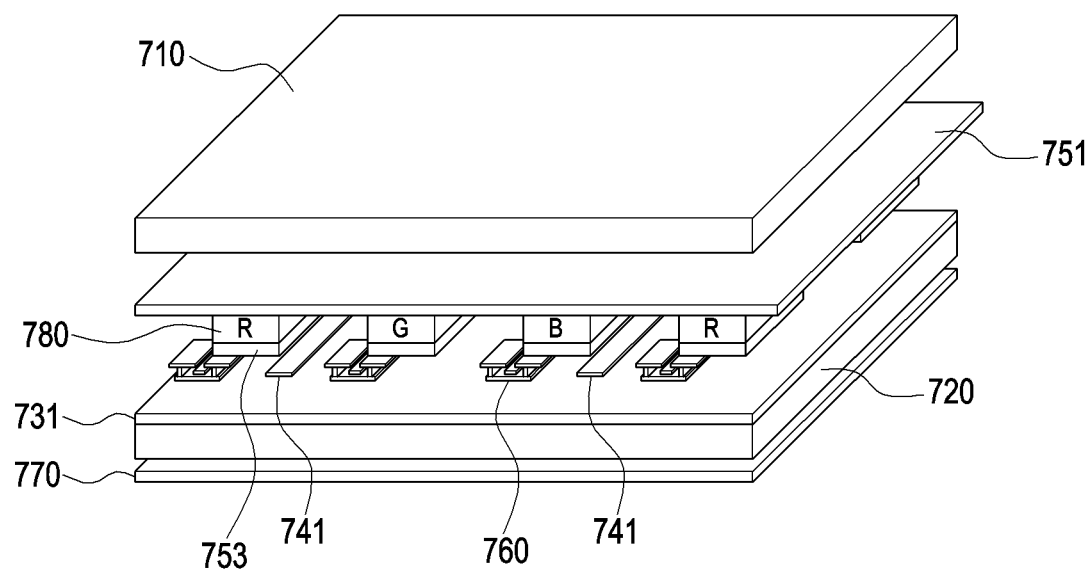
FIG. 17 is a perspective view illustrating stacked faces of a display device according to various embodiments of the present disclosure.
Figure 18:
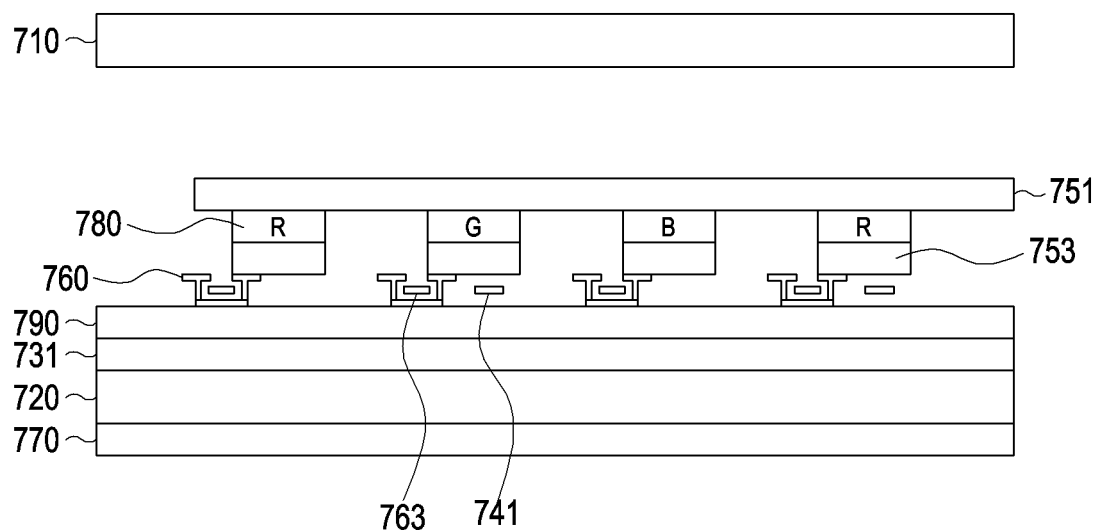
FIG. 18 is a cross-sectional view illustrating stacked faces of a display device according to various embodiments of the present disclosure.

FIG. 17 is a perspective view illustrating stacked faces of a display device 700 according to various embodiments of the present disclosure, and FIG. 18 is a cross-sectional view illustrating stacked faces of the display device 700 according to various embodiments of the present disclosure. A second transparent plate 710, a third transparent plate 720, and a transistor 760 of the display device 700 illustrated in FIGS. 17 and 18 may be the second transparent plate 310, the third transparent plate 320, and the transistor 360 illustrated in FIGS. 3 and 4.

Referring to FIGS. 17 and 18, the display device 700 may include the touch sensor and/or the force sensor, and the touch sensor and/or the force sensor may include at least one electrode. FIGS. 17 and 18 illustrate another embodiment compared with FIG. 5, in which an overall structure is similar with the structure illustrated in FIG. 5, such that a description will be made based on differences.

According to various embodiments of the present disclosure, one electrode (e.g., the first electrode 731) of the touch sensor may be arranged between the transistor 760 and the third transparent plate 720. The first electrode 731 may be arranged to overlap the third electrode 751 that is a display electrode, and may be substantially manufactured to a size corresponding to an area of the third transparent plate 751. In another example, a dielectric layer 790 may be arranged between the transistor 760 and the first electrode 731.

However, a position of the first electrode 731 is not limited to a position between the transistor 760 and the third transparent plate 720, and may be on the same plane as the third electrode 751 or between the third electrode 751 and the second transparent plate 720.

According to various embodiments of the present disclosure, the touch sensor may be configured using the self-capacitance scheme or the mutual capacitance scheme, and in the case that the touch sensor uses the mutual capacitance scheme, another electrode of the touch sensor may be a fifth electrode 770 arranged under the third transparent plate 720.

According to various embodiments of the present disclosure, one electrode of the force sensor (e.g., the second electrode 741) may be arranged on the same layer as a gate electrode 763 of the transistor 760, thus forming a layer in which the same voltage is applied to the entire display device 700. The other region than a region where the R, G, or B pixel of the display is arranged may be configured under the second electrode 741.

According to various embodiments of the present disclosure, the second electrode 741 may be arranged on the same plane as a wiring of the gate electrode 763 of the transistor 760, and may include the same material as the gate electrode 763. The second electrode 741 may include an opaque conductive material, for example, at least one of silver (Ag), copper (Cu), magnesium (Mg), titanium (Ti), molybdenum (Mo), aluminum (Al), or graphene.

According to various embodiments of the present disclosure, the force sensor may be configured using the self-capacitance scheme or the mutual capacitance scheme, and in the case that the touch sensor uses the mutual capacitance scheme, another electrode of the force sensor may be a fifth electrode 770 arranged under the third transparent plate 720.

Figure 19:
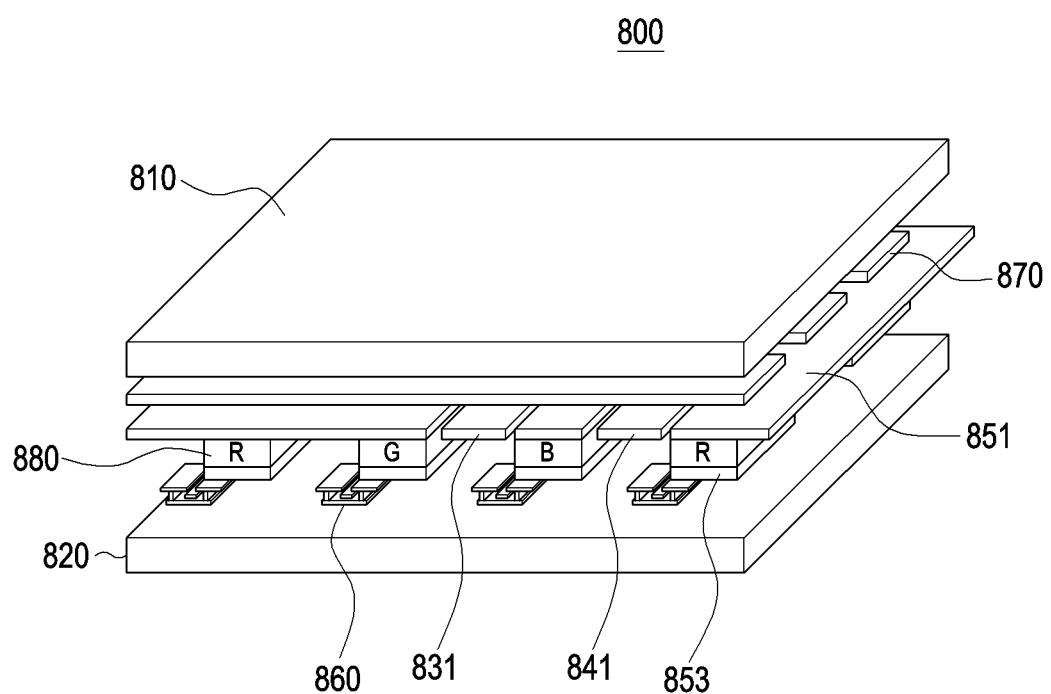
FIG. 19 is a perspective view illustrating stacked faces of a display device according to various embodiments of the present disclosure.
Figure 20:
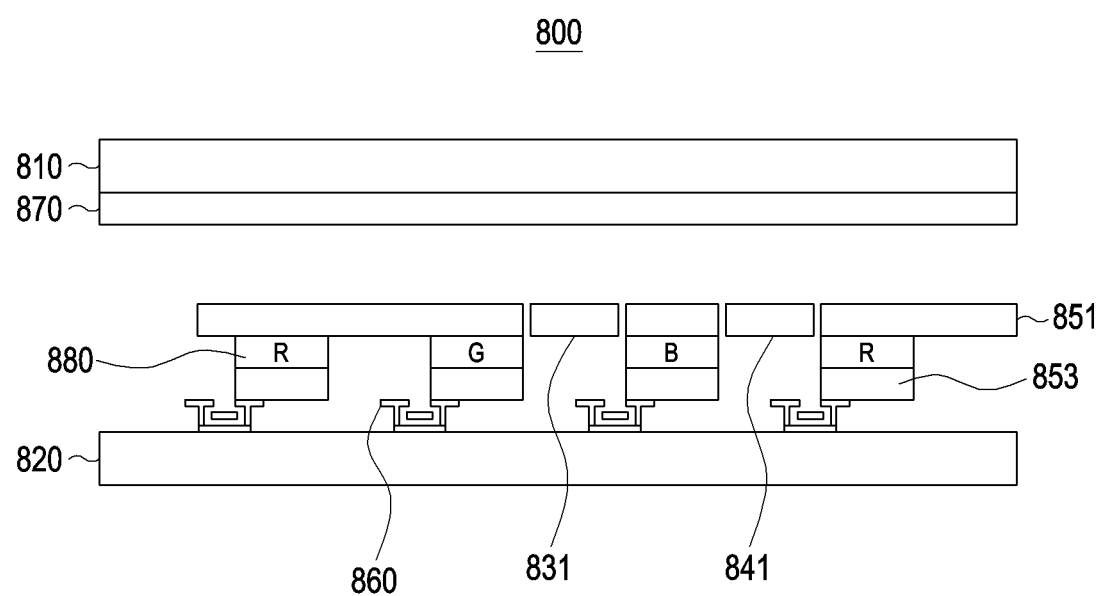
FIG. 20 is a cross-sectional view illustrating stacked faces of a display device according to various embodiments of the present disclosure.

FIG. 19 is a perspective view illustrating stacked faces of a display device 800 according to various embodiments of the present disclosure, and FIG. 20 is a cross-sectional view illustrating stacked faces of the display device 800 according to various embodiments of the present disclosure.

A second transparent plate 810, a third transparent plate 820, and a transistor 860 of the display device 800 illustrated in FIGS. 19 and 20 may be the second transparent plate 310, the third transparent plate 320, and the transistor 360 illustrated in FIGS. 3 and 4.

Referring to FIGS. 19 and 20, the display device 800 may include the touch sensor and/or the force sensor, and the touch sensor and/or the force sensor may include at least one electrode. FIGS. 19 and 20 illustrate another embodiment compared with FIG. 5, in which an overall structure is similar with a structure illustrated in FIG. 5, such that a description will be made based on differences.

According to various embodiments of the present disclosure, an electrode of the touch sensor (e.g., the first electrode 831 and the fifth electrode 870) may use the mutual capacitance scheme in which the plurality of electrodes are used, thus detecting a change in a capacitance at a particular position.

According to various embodiments of the present disclosure, one electrode (e.g., the fifth electrode 870) of the touch sensor may be arranged between the second transparent plate 810 and the third electrode 851. Another electrode of the touch sensor (e.g., the first electrode 831) may be arranged on the same layer or on the same plane as the third electrode 851. The third electrode 851 may be a display electrode.

According to various embodiments of the present disclosure, the plurality of first electrodes 831 of the touch sensor may be arranged in parallel in bar forms along the third direction, and a plurality of electrodes of the touch sensor, the fifth electrodes 870, may be arranged in parallel in bar forms along the fourth direction. The third direction and the fourth direction may be orthogonal to each other.

According to various embodiments of the present disclosure, an electrode of the force sensor (e.g., the second electrode 841 and the fifth electrode 870) like the touch sensor may use the mutual capacitance scheme in which the plurality of electrodes are used.

According to various embodiments of the present disclosure, one electrode (e.g., the fifth electrode 870) of the force sensor may be arranged between the second transparent plate 810 and the third electrode 851. The fifth electrode 870 may be used as a common electrode between the touch sensor and the force sensor. For example, a transmission (Tx) signal for both the touch sensor and the force sensor may be applied to or a reception (Rx) signal may be applied to the fifth electrode 870. Another electrode of the force sensor (e.g., the first electrode 831) may be arranged on the same layer or on the same plane as the third electrode 851. The third electrode 851 may be a display electrode. Thus, the other region than a region where the R, G, or B pixel of the display is arranged may be configured under the second electrode 841, such that the R, G, or B pixel of the display may be arranged under the third electrode 851.

According to various embodiments of the present disclosure, the plurality of first electrodes 841 of the force sensor may be arranged in parallel in bar forms along the third direction, and the plurality of fifth electrodes 870, may be arranged in parallel in bar forms along the fourth direction. The third direction and the fourth direction may be orthogonal to each other.

Figure 21:
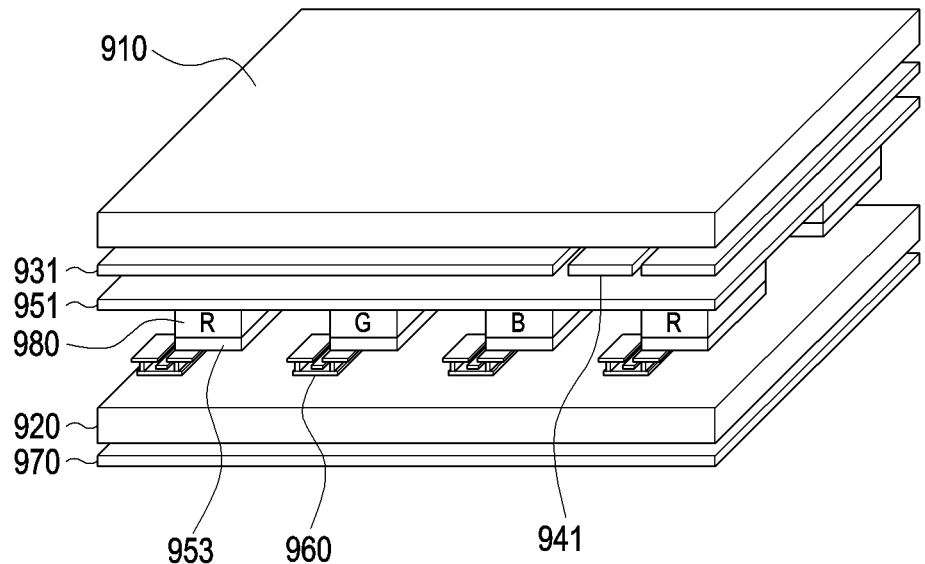
FIGS. 21 and 22 are perspective views each illustrating stacked faces of a display device according to various embodiments of the present disclosure.
Figure 22:
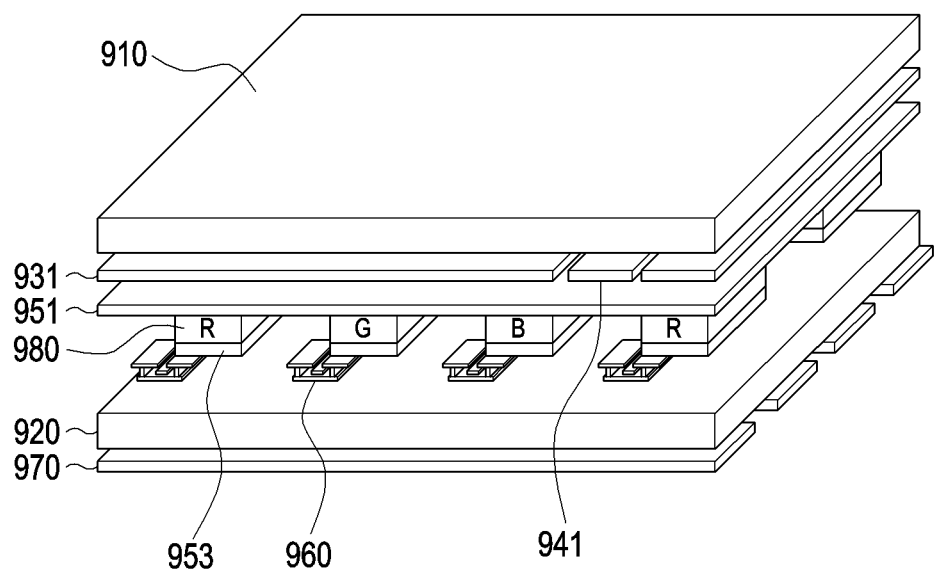

FIGS. 21 and 22 are perspective views each illustrating stacked faces of a display device 900 according to various embodiments of the present disclosure. A second transparent plate 910, a third transparent plate 920, and a transistor 960 of the display device 900 illustrated in FIGS. 21 and 22 may be the second transparent plate 310, the third transparent plate 320, and the transistor 360 illustrated in FIGS. 3 and 4.

Referring to FIGS. 21 and 22, the display device 900 may include the touch sensor and/or the force sensor, and the touch sensor and/or the force sensor may include at least one electrode. FIGS. 21 and 22 illustrate another embodiment compared with FIG. 5, in which an overall structure is similar with a structure illustrated in FIG. 5, such that a description will be made based on differences.

FIG. 21 is a perspective view showing a self-capacitance scheme in which a touch sensor and/or a force sensor is configured using one electrode, and FIG. 22 is a perspective view showing a mutual capacitance scheme in which the touch sensor and/or the force sensor is configured using a plurality of electrodes.

According to various embodiments of the present disclosure, one electrode (e.g., the first electrode 931) of the touch sensor may be arranged between the second transparent plate 920 and the third electrode 951. When viewed from top of the display, the first electrode 931 may be arranged to overlap the third electrode 951 that is a display electrode, and may be substantially manufactured to a size corresponding to an area of the second transparent plate 920. In another example, a dielectric layer may be arranged between the transistor 960 and the first electrode 931.

According to various embodiments of the present disclosure, one electrode of the force sensor (e.g., the second electrode 941) may be arranged on the same layer or on the same plane as the first electrode 931. The second electrode 941 may be arranged in a latticed or alternate manner with the first electrode 931 to form one layer, thus enabling slimmerization of the display device 900.

According to another embodiment of the present disclosure, the touch sensor may be configured using the mutual capacitance scheme in which a plurality of electrodes are used. One electrode (e.g., a first electrode 931) of the touch sensor may be arranged between a second transparent plate 910 and a third electrode 951, and another electrode (e.g., a fifth electrode 970) may be arranged under a third transparent plate 920.

According to an embodiment of the present disclosure, the touch sensor may be configured using the mutual capacitance scheme in which a plurality of electrodes are used. One electrode of the force sensor (e.g., the second electrode 941) may be arranged on the same layer or on the same plane as the first electrode 931, and another electrode (e.g., the fifth electrode 970) may be arranged under the third transparent plate 920.

Figure 23:
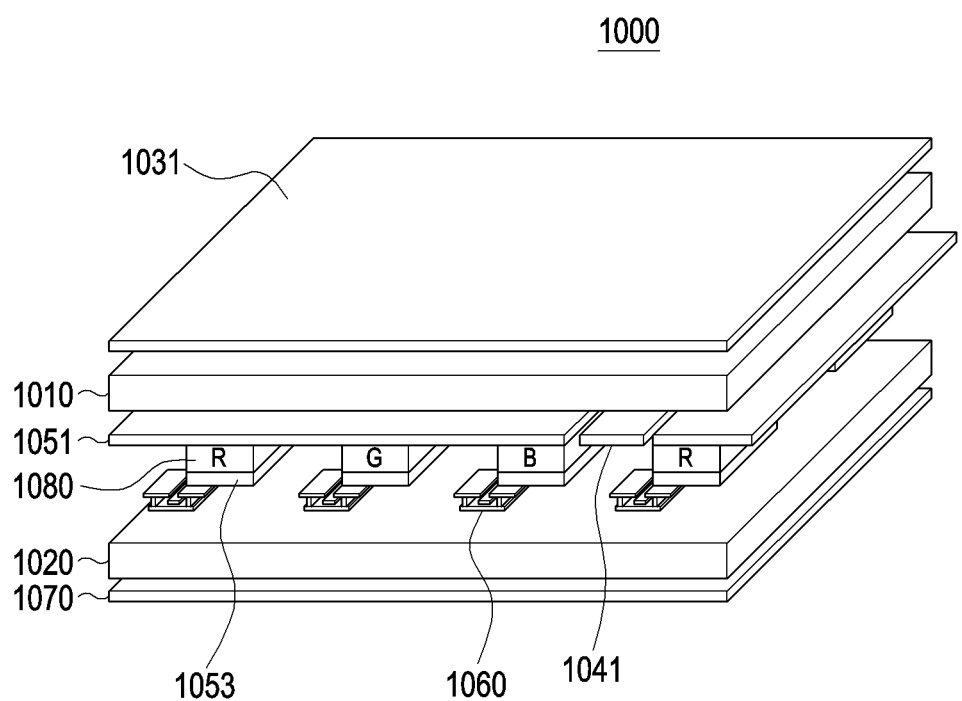
FIG. 23 is a perspective view illustrating stacked faces of a display device according to various embodiments of the present disclosure.

FIG. 23 is a perspective view illustrating stacked faces of a display device 1000 according to various embodiments of the present disclosure. A second transparent plate 1010, a third transparent plate 1020, and a transistor 1060 of the display device 1000 illustrated in FIG. 23 may be the second transparent plate 310, the third transparent plate 320, and the transistor 360 illustrated in FIGS. 3 and 4.

Referring to FIG. 23, the display device 1000 may include the touch sensor and/or the force sensor, and the touch sensor and/or the force sensor may include at least one electrode. FIG. 23 illustrates another embodiment compared with FIG. 5, in which an overall structure is similar with a structure illustrated in FIG. 5, such that a description will be made based on differences.

According to various embodiments of the present disclosure, one electrode (e.g., the first electrode 1031) of the touch sensor may be arranged between the first transparent plate (the first transparent plate 303 of FIG. 3) and a second transparent plate 1010. The first electrode 1031 may be arranged to substantially overlap the first transparent plate 303 and/or the second transparent plate 101, and may include one electrode or a plurality of electrodes according to the self-capacitance scheme or the mutual capacitance scheme.

According to various embodiments of the present disclosure, one electrode of the force sensor (e.g., the second electrode 1041) may be arranged on the same layer or on the same plane as a third electrode 1051. The third electrode 1051 may be a display electrode. an organic light-emitting diode 680 including the R, G, or B pixel of the display may be arranged under the third electrode 1051, and the other region than a region where the R, G, or B pixel of the display is arranged may be configured under the first electrode 1041.

Figure 24:
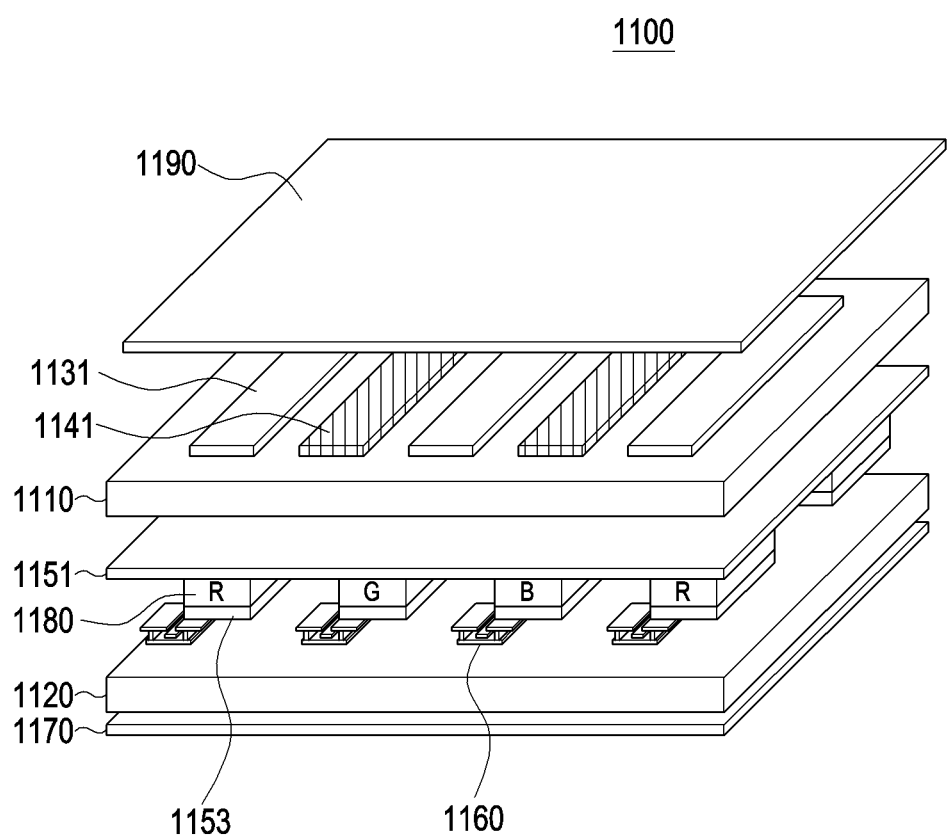
FIG. 24 is a perspective view illustrating stacked faces of a display device according to various embodiments of the present disclosure.

FIG. 24 is a perspective view illustrating stacked faces of a display device 1100 according to various embodiments of the present disclosure. A second transparent plate 1110, a third transparent plate 1120, and a transistor 1160 of the display device 1100 illustrated in FIG. 24 may be the second transparent plate 310, the third transparent plate 320, and the transistor 360 illustrated in FIGS. 3 and 4.

Referring to FIG. 24, the display device 1100 may include the touch sensor and/or the force sensor, and the touch sensor and/or the force sensor may include at least one electrode. FIG. 24 illustrates another embodiment compared with FIG. 23, in which an overall structure is similar with a structure illustrated in FIG. 23, such that a description will be made based on differences.

According to various embodiments of the present disclosure, one electrode (e.g., the first electrode 1131) of the touch sensor may be arranged between the first transparent plate (the first transparent plate 303 of FIG. 3) and a second transparent plate 1110. The first electrode 1131 may be arranged to substantially overlap the first transparent plate and/or the second transparent plate 1110.

According to various embodiments of the present disclosure, one electrode (e.g., the first electrode 1141) of the force sensor may be arranged between the first transparent plate (the first transparent plate 303 of FIG. 3) and a second transparent plate 1110. The second electrode 1141 may be arranged to substantially overlap the first transparent plate and/or the second transparent plate 1110, and may be arranged on the same layer or the same plane as the first electrode 1131. The first electrode 1131 and the second electrode 1141 may be directly deposited on, for example, the second transparent plate 1110.

According to various embodiments of the present disclosure, the first electrode 1131 and the second electrode 1141 may be alternately arranged on the same plane. For example, the plurality of first electrodes 1131 in bar forms may be arranged on the second transparent plate 1110, and the plurality of second electrodes 1141 in bar forms may be arranged between the first electrodes 1131. According to another embodiment of the present disclosure, the plurality of electrodes 1131 in dot forms and/or the plurality of second electrodes 1141 in dot forms may be arranged on the second transparent plate 1110. The number of first electrodes 1131 may be greater than, for example, the number of second electrodes 1141.

According to various embodiments of the present disclosure, the first electrode 1131 and/or the second electrode 1141 arranged alternately on the same plane may be a reception electrode or a transmission electrode. For example, a touch sensor transmission electrode Tx and a force sensor transmission electrode Tx may be arranged in parallel spaced apart from each other by a preset space. In a touch mode and/or a pressure mode, the touch sensor transmission electrode Tx may be activated and operate together with the force sensor transmission electrode Tx. In another example, in the touch mode, the first electrode 1131 may be activated and the plurality of second electrodes 1141 may be deactivated. In another example, in the pressure mode, the first electrode 1131 may be deactivated and the plurality of second electrodes 1141 may be activated.

According to various embodiments of the present disclosure, the first electrode 1131 and/or the second electrode 1141 are arranged alternately in parallel, but the first electrode 1131 and/or the second electrode 1141 may be arranged crosswise and intersections between the first electrode 1131 and/or the second electrode 1141 may be insulated using an insulating member, etc.

According to various embodiments of the present disclosure, an optical member 1190 may be arranged on the first electrode 1131 and/or the second electrode 1141. According to various embodiments of the present disclosure, in the display device 1100, the optical member 1190 and the first electrode 1131 and/or the second electrode 1141 may be formed as one piece. For example, by directly forming the first electrode 1131 and/or the second electrode 1141 on the optical member 1190, a manufacturing cost may be remarkably reduced and an assembling process may be simplified.

Figure 25:
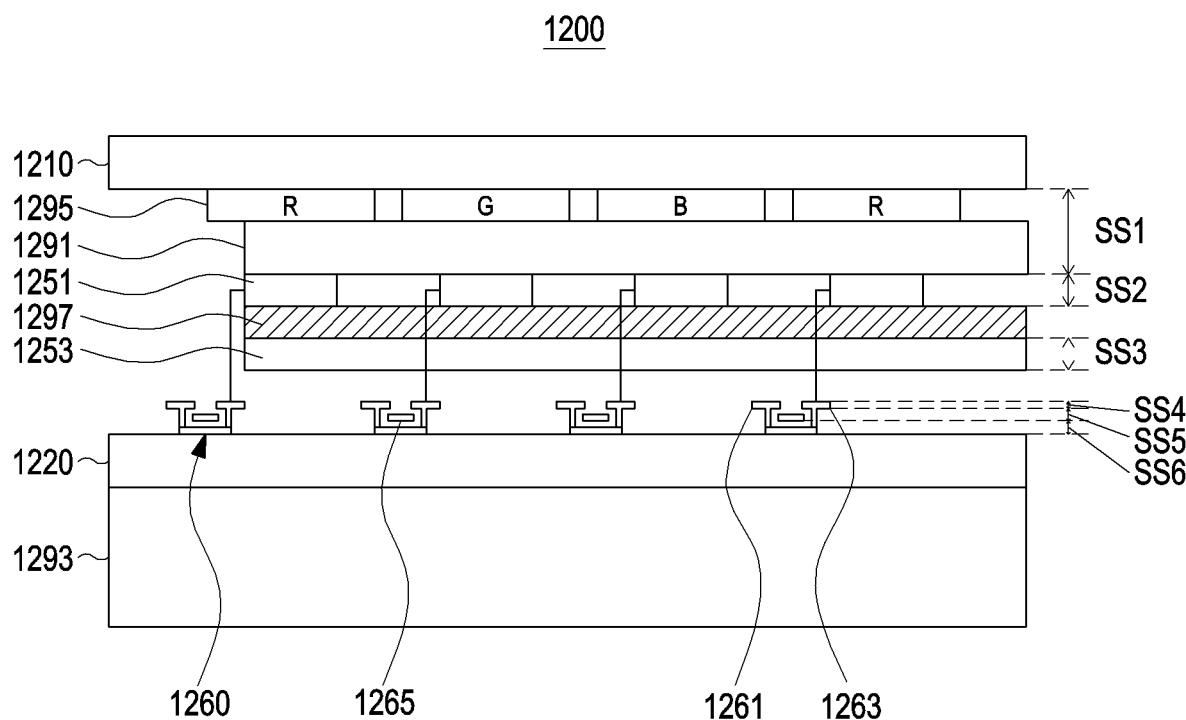
FIG. 25 is a cross-sectional view illustrating a display device according to various embodiments of the present disclosure.

FIG. 25 is a cross-sectional view illustrating a display device 1200 according to various embodiments of the present disclosure. FIG. 25 is a basic illustration of an embodiment of FIGS. 26 through 30 to be described later.

As illustrated in FIG. 25, a display device 1200 may include an LCD stacking structure, and the display device 1200 (e.g., the display 160 of FIG. 1) may output a screen and include at least one sensor arranged therein. The at least one sensor may be any one of a fingerprint sensor, a touch sensor, or a force sensor.

According to various embodiments of the present disclosure, the display device 1200 may include a second transparent plate 1210 facing the first direction (+Z) and a third transparent plate 1220 facing the second direction (−Z) that is opposite to the first direction (+Z). Between the second transparent plate 1210 and the third transparent plate 1220 may be arranged at least one electrode for driving the sensors in addition to display electrodes 1251 and 1253.

According to various embodiments of the present disclosure, liquid crystal 1291 facing the second transparent plate 1210 may be arranged under the second transparent plate 1210, and a color filter 1295 where an R, G, or B pixel is arranged may be arranged between the second transparent plate 1210 and the liquid crystal 1291. A plurality of electrodes (e.g., the third electrode 1251 and/or the fourth electrode 1253) for driving the display device 1200 may be arranged under the liquid crystal 1291, and a dielectric layer 1297 may be arranged between the electrodes. The dielectric layer 1297 may include, for example, silicon, air, foam, a membrane, an OCA, a sponge, rubber, ink, a polymer (PC or PET), etc.

According to various embodiments of the present disclosure, the display device 1200 may further include a transistor (TFT) 1260 that is electrically connected to the third electrode 1251 and/or the fourth electrode 1253, and the transistor 1260 may include a gate electrode 1265, a source electrode 1261, and a drain electrode 1263. In another example, a backlight unit 1293 for uniformly outputting light from the back of the LCD to make a display image visible may be arranged under the third transparent plate 1220.

According to various embodiments of the present disclosure, the display device 1200 may include a first electrode, a second electrode, a third electrode 1251, and/or a fourth electrode 1253 between the second transparent plate 1210 and the third transparent plate 1220.

According to various embodiments of the present disclosure, at least one of the first electrode, the second electrode, the third electrode 1251, and/or the fourth electrode 1253 may include a transparent or opaque conductive material. For example, at least one of the first electrode, the second electrode, the third electrode 1251, and/or the fourth electrode 1253 may include a transparent conductive material and include at least one of ITO, IZO, PEDOT, Ag nanowire, a transparent high polymer conductor, or graphene. In another example, at least one of the first electrode, the second electrode, the third electrode 1251, and/or the fourth electrode 1253 may include an opaque conductive material and include at least one of Ag, Cu, Mg, Ti, Mo, Al, or graphene.

According to various embodiments of the present disclosure, the display device 1200 may include a control circuit (not shown) electrically connected with the first electrode, the second electrode, the third electrode 1251, and/or the fourth electrode 1253. The control circuit may detect a position of a touch input with respect to the first transparent plate (the first transparent plate 303 of FIG. 3) by using the first electrode, and detect a strength of the touch input by using the second electrode. In another example, the control circuit may display visual information on at least a part of the display by using the third electrode 1251 and the fourth electrode 1253. According to various embodiments of the present disclosure, the first electrode and/or the second electrode may be arranged in one position of a first region SS1 through a sixth region SS6.

For example, the first electrode and/or the second electrode may be arranged in the first region SS1, that is, between the second transparent plate 1210 and the third electrode 1251. When the first electrode and/or the second electrode are arranged in the first region SS1, the first electrode and/or the second electrode may include a transparent conductive material.

In another example, the first electrode and/or the second electrode may be arranged in the second region SS2, that is, on the same plane as that of the third electrode 1251, and may include the same material as that of the third electrode 1251. When the first electrode and/or the second electrode are arranged in the second region SS2, the first electrode and/or the second electrode may include a transparent conductive material.

In another example, the first electrode and/or the second electrode may be arranged in the third region SS3, that is, on the same plane as that of the fourth electrode 1253, and may include the same material as that of the fourth electrode 1253. When the first electrode and/or the second electrode are arranged in the third region SS3, the first electrode and/or the second electrode may include a transparent conductive material.

In another example, the first electrode and/or the second electrode may be arranged in the fourth region SS4, that is, on the same plane as that of wirings of the source electrode 1261 and/or the drain electrode 1263 of the transistor 1260, and may include the same material as that of the source electrode 1261 and/or the drain electrode 1263. When the first electrode and/or the second electrode are arranged in the fourth region SS4, the first electrode and/or the second electrode may include an opaque conductive material.

In another example, the first electrode and/or the second electrode may be arranged in the fifth region SS5, that is, on the same plane as that of an wiring of the gate electrode 1265 of the transistor 1260, and may include the same material as that of the gate electrode 1265. When the first electrode and/or the second electrode are arranged in the fifth region SS5, the first electrode and/or the second electrode may include an opaque conductive material.

In another example, the first electrode and/or the second electrode may be arranged in the sixth region SS6, that is, between the gate electrode 1265 and the third transparent plate 1220. When the first electrode and/or the second electrode are arranged in the sixth region SS6, the first electrode and/or the second electrode may include an opaque conductive material.

Hereinbelow, configurations of the first electrode and/or the second electrode arranged in each region of the display device will be described.

Figure 26:
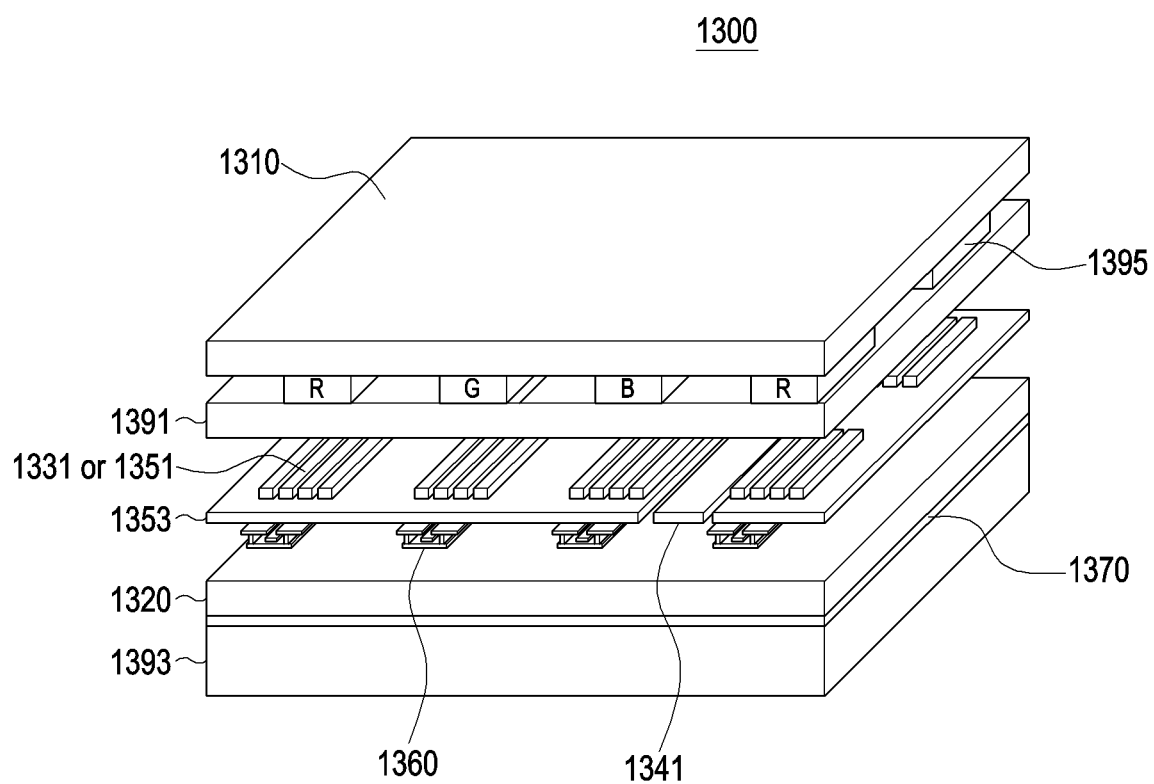
FIG. 26 is a perspective view illustrating stacked faces of a display device according to various embodiments of the present disclosure.
Figure 27:
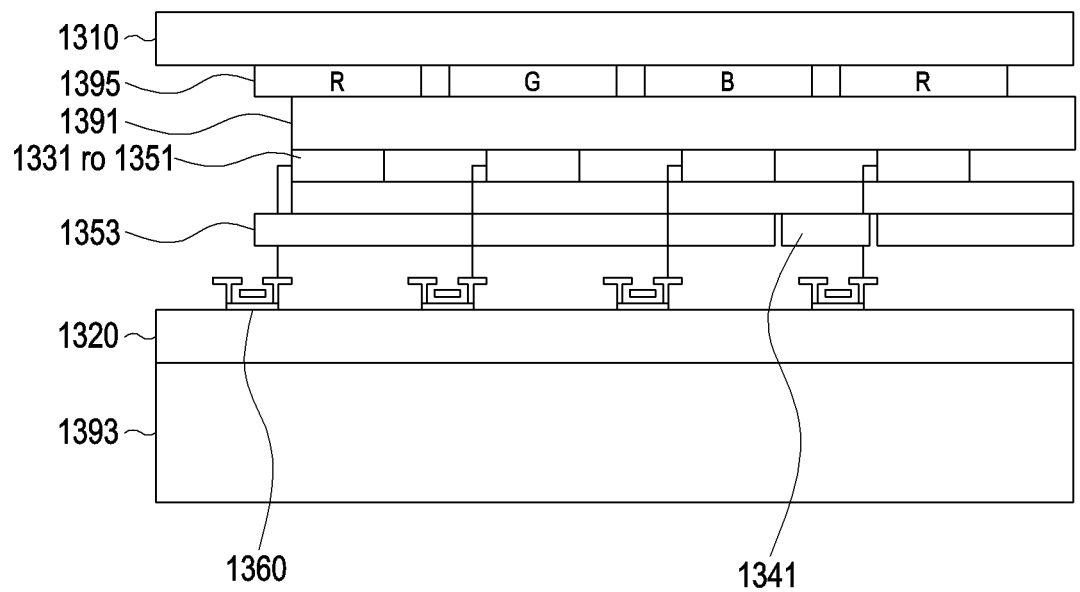
FIG. 27 is a cross-sectional view illustrating stacked faces of a display device according to various embodiments of the present disclosure.

FIG. 26 is a perspective view illustrating stacked faces of a display device 1300 according to various embodiments of the present disclosure, and FIG. 27 is a cross-sectional view illustrating stacked faces of the display device 1300 according to various embodiments of the present disclosure. A second transparent plate 1310, a third transparent plate 1320, and a transistor 1360 of the display device 1300 illustrated in FIGS. 26 and 27 may be the second transparent plate 1210, the third transparent plate 1220, and the transistor 1260 illustrated in FIG. 25.

Referring to FIGS. 26 and 27, the display device 1300 may include the touch sensor and/or the force sensor, and the touch sensor and/or the force sensor may include at least one electrode.

According to various embodiments of the present disclosure, the force sensor may include at least one electrode, and one electrode (e.g., the second electrode 1341) of the force sensor may be arranged substantially on the same plane as one of the third electrode 1351 or the fourth electrode 1353. In the case that the force sensor includes a plurality of electrodes, another electrode (e.g., a fifth electrode 1370) of the force sensor in addition to the second electrode 1341 may be arranged between the third transparent plate 1220 and a second face (a second face 303 of the housing of FIG. 3) of the housing. The second electrode 1341 and the fifth electrode 1370 may be electrically connected with a control circuit to detect a strength of a touch pressure.

According to various embodiments of the present disclosure, the second electrode 1341 may be arranged between parts of the third electrode 1351 or alternately with the third electrode 1351, and may include the same material as that of the third electrode 1351. For example, the second electrode 1341 may include a transparent conductive material and include at least one of ITO, IZO, PEDOT, Ag nanowire, a transparent high polymer conductor, or graphene. In another example, the second electrode 1341 may apply the same voltage to the entire display device 1300.

According to various embodiments of the present disclosure, the touch sensor may include at least one electrode, and one electrode (e.g., a first electrode 1331) of the touch sensor may be a third electrode 1351 that is the display electrode, and may operate in a non-overlapping time period based on time-division switch driving. The touch electrode and the display electrode according to the present disclosure do not need separate configuration of an electrode for a touch sensor by using a common electrode, thus implementing slimmerization and material saving of the electronic device.

Figure 28:
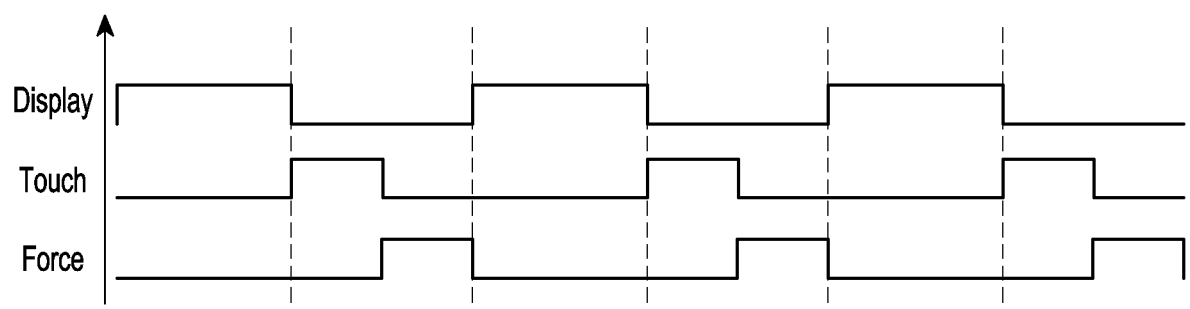
FIG. 28 is a schematic view illustrating time-division switching driving of a display device based on an embodiment of FIG. 26, according to various embodiments of the present disclosure.

FIG. 28 is a schematic view illustrating time-division switching driving of a display device 1300 based on an embodiment of FIG. 26, according to various embodiments of the present disclosure.

As illustrated in FIG. 28, a 3D input method using the display device 1300 may divide time into three periods and may transmit/receive a signal of one of a display electrode (e.g., the third electrode 1351 and/or the fourth electrode 1353), a touch electrode (e.g., the first electrode 1331), and/or a pressure electrode (e.g., the second electrode 1341) in each period. According to an embodiment of the present disclosure, the display electrode and the touch electrode may be used as a common electrode.

According to various embodiments of the present disclosure, the display device 1300 of the electronic device may repetitively perform time-division driving in three periods. For example, in a first time period, the display device 500 may receive the reception signal through the third electrode 1351 and/or the fourth electrode 1353. In the first time period, a driving voltage may be applied through a display electrode, e.g., the third electrode 1351 and/or the fourth electrode 1353, and a reference voltage, e.g., a ground voltage or a particular voltage may be applied to the first electrode 1331 and the second electrode 1341.

According to various embodiments of the present disclosure, in a second time period, the display device 500 may receive the reception signal through the first electrode 1331. In the second time period, a driving voltage may be applied through the first electrode 1331, and a reference voltage, e.g., a ground voltage or a particular voltage may be applied to the second electrode 1341 and the third electrode 1351 and/or the fourth electrode 1353. According to various embodiments of the present disclosure, in a third time period, the display device 500 may receive the reception signal through the second electrode 1341. In the third time period, a driving voltage may be applied through the second electrode 1341, and a reference voltage, e.g., a ground voltage or a particular voltage may be applied to the first electrode 1331 and the third electrode 1351 and/or the fourth electrode 1353.

Figure 29:
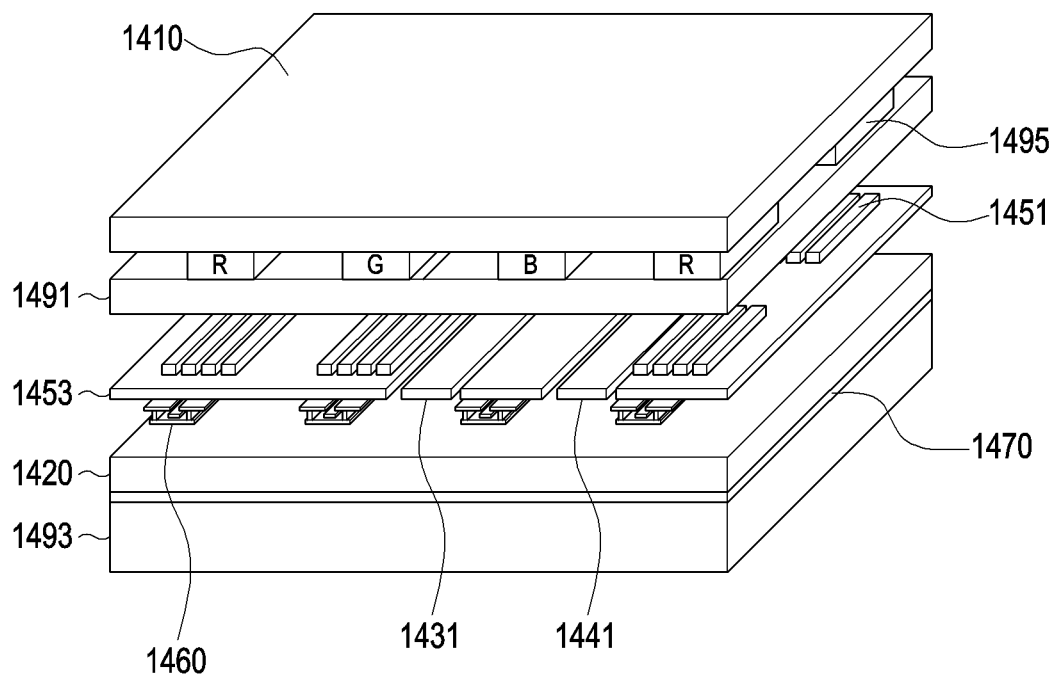
FIG. 29 is a perspective view illustrating stacked faces of a display device according to various embodiments of the present disclosure.
Figure 30:
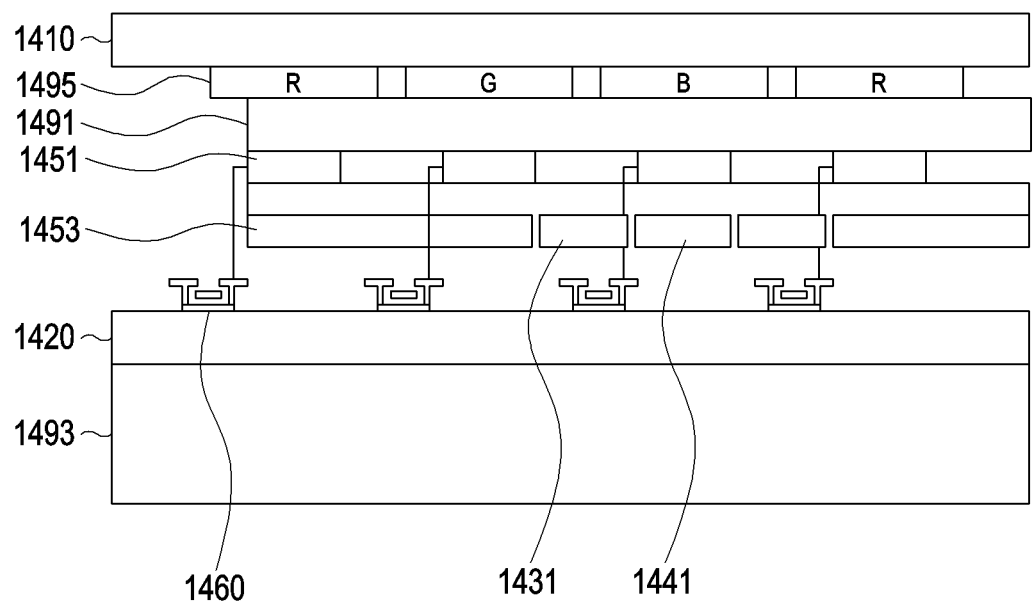
FIG. 30 is a cross-sectional view illustrating stacked faces of a display device according to various embodiments of the present disclosure.

FIG. 29 is a perspective view illustrating stacked faces of a display device 1400 according to various embodiments of the present disclosure, and FIG. 30 is a cross-sectional view illustrating stacked faces of the display device 1400 according to various embodiments of the present disclosure. A second transparent plate 1410, a third transparent plate 1420, and a transistor 1460 of the display device 1400 illustrated in FIGS. 29 and 30 may be the second transparent plate 1210, the third transparent plate 1220, and the transistor 1260 illustrated in FIG. 25.

FIGS. 29 and 30 illustrate another embodiment compared with FIG. 26, in which an overall structure is similar with a structure illustrated in FIG. 26, such that a description will be made based on differences.

Referring to FIGS. 29 and 30, the display device 1400 may include the touch sensor and/or the force sensor, and the touch sensor and/or the force sensor may include at least one electrode.

According to various embodiments of the present disclosure, the touch sensor may include at least one electrode, and at least one electrode (e.g., the second electrode 1431) including the force sensor may be configured using the self-capacitance scheme that uses one electrode for each basic pixel for touch recognition and reads a change in a capacitance of the electrode.

According to various embodiments of the present disclosure, one electrode of the touch sensor (e.g., the first electrode 1431) may be arranged on the same layer or on the same plane as the fourth electrode 1453. The fourth electrode 1453 may be a display electrode. According to various embodiments of the present disclosure, the first electrode 1431 may be arranged alternately with the second electrode 1441 or the fourth electrode 1453, and may include the same material as that of the fourth electrode 1453. For example, the first electrode 1431 may include a transparent conductive material and include at least one of ITO, IZO, PEDOT, Ag nanowire, a transparent high polymer conductor, or graphene. In another example, the first electrode 1431 may apply the same voltage to the entire display device 1400.

According to various embodiments of the present disclosure, like the touch sensor, the force sensor may include at least one electrode, and at least one electrode (e.g., the second electrode 1441) of the force sensor may be configured using the self-capacitance scheme that uses one electrode for each basic pixel for touch recognition and reads a change in a capacitance of the electrode.

According to various embodiments of the present disclosure, one electrode of the force sensor (e.g., the second electrode 1441) may be arranged on the same layer or on the same plane as the fourth electrode 1453. The fourth electrode 1453 may be a display electrode. According to various embodiments of the present disclosure, the second electrode 1441 may be arranged alternately with the first electrode 1431 or the fourth electrode 1453, and may include the same material as that of the fourth electrode 1453. For example, the second electrode 1441 may include a transparent conductive material and include at least one of ITO, IZO, PEDOT, Ag nanowire, a transparent high polymer conductor, or graphene. In another example, the second electrode 1441 may apply the same voltage to the entire display device 1400.

According to various embodiments of the present disclosure, the fourth electrode 1453 may be connected as one depending on a bridge structure. In another example, the fifth electrode 1470 may include a ground member that may be manufactured to have substantially the same size as that of the display 1400.

According to various embodiments of the present disclosure, an electrode of the touch sensor may use the mutual capacitance scheme using a plurality of electrodes, and one electrode (e.g., the first electrode 1431) may be arranged on the same layer or on the same plane as the fourth electrode 1453. The fourth electrode 1453 may be a display electrode. In another example, another electrode (e.g., the fifth electrode 1470) of the touch sensor may be arranged between the third transparent plate 1420 and the backlight unit 1493.

According to various embodiments of the present disclosure, the force sensor may include at least a plurality of electrodes like the touch sensor, and at least one electrode (e.g., the second electrode 1441) of the force sensor may be arranged on the same layer or on the same plane as the fourth electrode 1453. Another electrode (e.g., a fifth electrode 1470) of the touch sensor may be arranged between the third transparent plate 1420 and the backlight unit 1493.

According to various embodiments of the present disclosure, the fifth electrode 1493 may be a common electrode used as the touch sensor or the force sensor. In another example, the plurality of first electrodes 1431 and/or second electrodes 1441 may be arranged in parallel in bar forms along the third (X) direction, and the plurality of fifth electrodes 1470 may be arranged in parallel in bar forms along the fourth (Y) direction. The third direction and the fourth direction may be orthogonal to each other.

Figure 31:
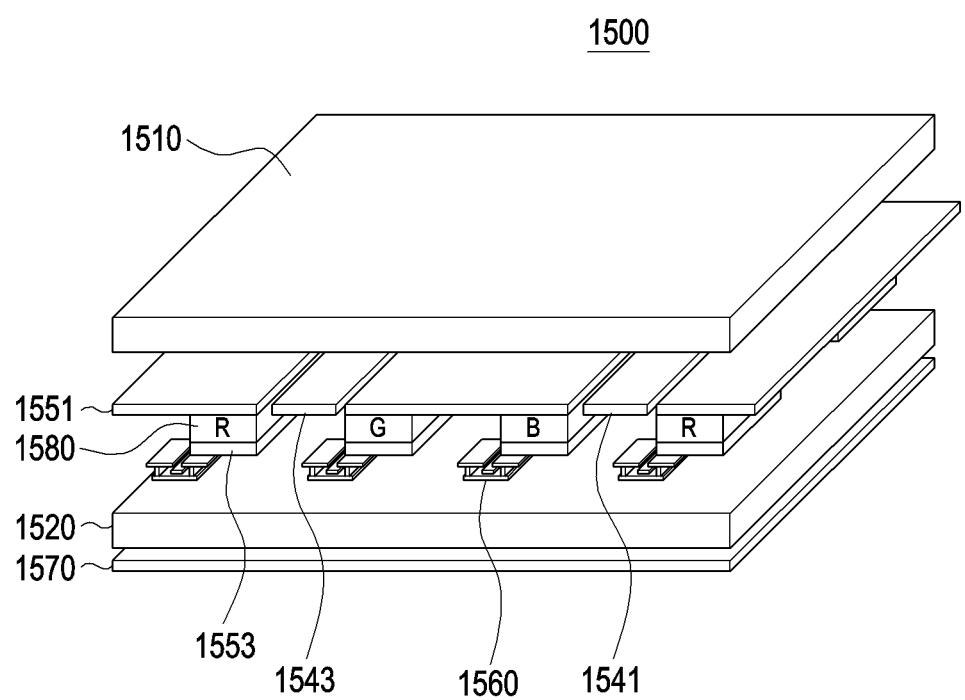
FIG. 31 is a perspective view illustrating stacked faces of a display device according to various embodiments of the present disclosure.
Figure 32:
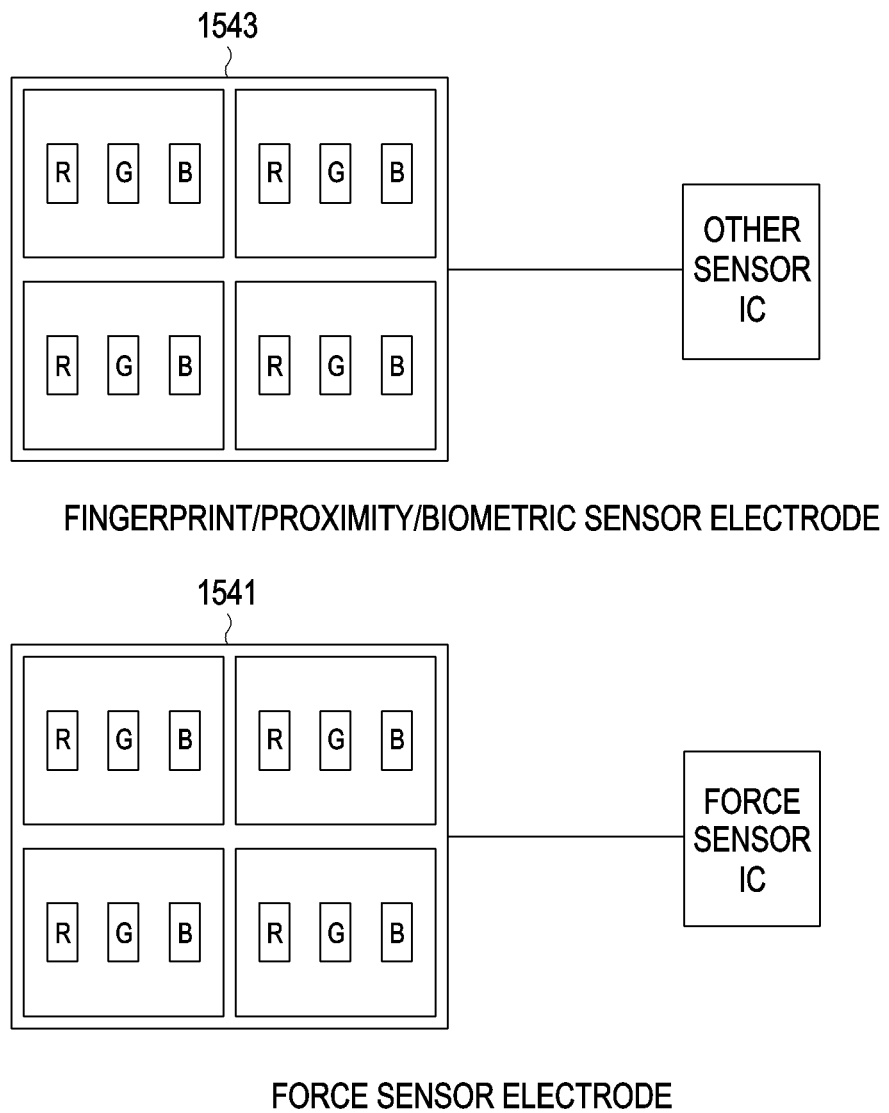
FIG. 32 is a front view illustrating a shape of electrodes according to various embodiments of the present disclosure.

FIG. 31 is a perspective view illustrating stacked faces of a display device 1500 according to various embodiments of the present disclosure, and FIG. 32 is a front view illustrating a shape of electrodes according to various embodiments of the present disclosure. A second transparent plate 1510, a third transparent plate 1520, and a transistor 1560 of the display device 1500 illustrated in FIGS. 31 and 32 may be the second transparent plate 410, the third transparent plate 420, and the transistor 460 illustrated in FIG. 5.

FIGS. 31 and 32 illustrate another embodiment compared with FIG. 5, in which an overall structure is similar with a structure illustrated in FIG. 5, such that a description will be made based on differences.

According to various embodiments of the present disclosure, one electrode of the force sensor (e.g., the second electrode 1541) may be arranged on the same layer or on the same plane as the third electrode 1551. The third electrode 1551 may be a display electrode. According to various embodiments of the present disclosure, the second electrode 1541 may be arranged alternately with the third electrode 1551, and may include the same material as that of the third electrode 1551.

According to various embodiments of the present disclosure, the display device 1500 may include an additional sensor as well as the force sensor and the touch sensor. The additional sensor may be any one of a fingerprint sensor, a proximity sensor, or a biometric sensor. In another example, the additional sensor may include a communication circuit and a seventh electrode 1543 arranged between the second transparent plate 1510 and the third transparent plate 1520 and electrically connected with the communication circuit.

According to various embodiments of the present disclosure, the communication circuit may be configured to transmit and receive a radio frequency (RF) signal to/from an external electronic device by using the seventh electrode 1543. The seventh electrode 1543 of the additional sensor may be arranged on the same layer or on the same plane as the third electrode 1551. The third electrode 1551 may be a display electrode. According to various embodiments of the present disclosure, the seventh electrode 1543 may be arranged alternately with the second electrode 1541 or the third electrode 1551, and may include the same material as that of the third electrode 1551. For example, the second electrode 1541 may include a transparent conductive material and include at least one of ITO, IZO, PEDOT, Ag nanowire, a transparent high polymer conductor, or graphene. In another example, the seventh electrode 1543 may apply the same voltage to the entire display device 1500. However, arrangement of the seventh electrode 1543 is not limited thereto, and the seventh electrode 1543 may be arranged in various forms in the third region S3 through the sixth region S6 illustrated in FIG. 4.

According to various embodiments of the present disclosure, the second electrodes 1541 of the force sensor may be configured as a bridge structure arranged around one organic light-emitting material set configured using R, G, and B pixels of the display. The second electrodes 1541 may be configured in the first direction (+Z) from the R, G, and B pixels in such a way not to overlap the top faces of the R, G, and B pixels.

According to various embodiments of the present disclosure, the seventh electrode 1543 of the additional sensor may be arranged on the same plane as the second electrode 1541 by a specific space therebetween. The seventh electrodes 1543 may be configured as a bridge structure arranged around one organic light-emitting material set configured using R, G, and B pixels of the display.

According to various embodiments of the present disclosure, at least some (e.g., two or more) of the additional sensor and the force sensor may be included in one IC or an IC package. For example, the second electrodes 1541 of the force sensor may be connected with the force sensor IC, and seventh electrodes 1543 of the additional sensor may be connected with an additional sensor IC and may perform a sensing operation depending on a circuit operation. Each force IC and/or additional sensor IC may operate as an integrated IC. These ICs may be connected with a processor.

Figure 33:
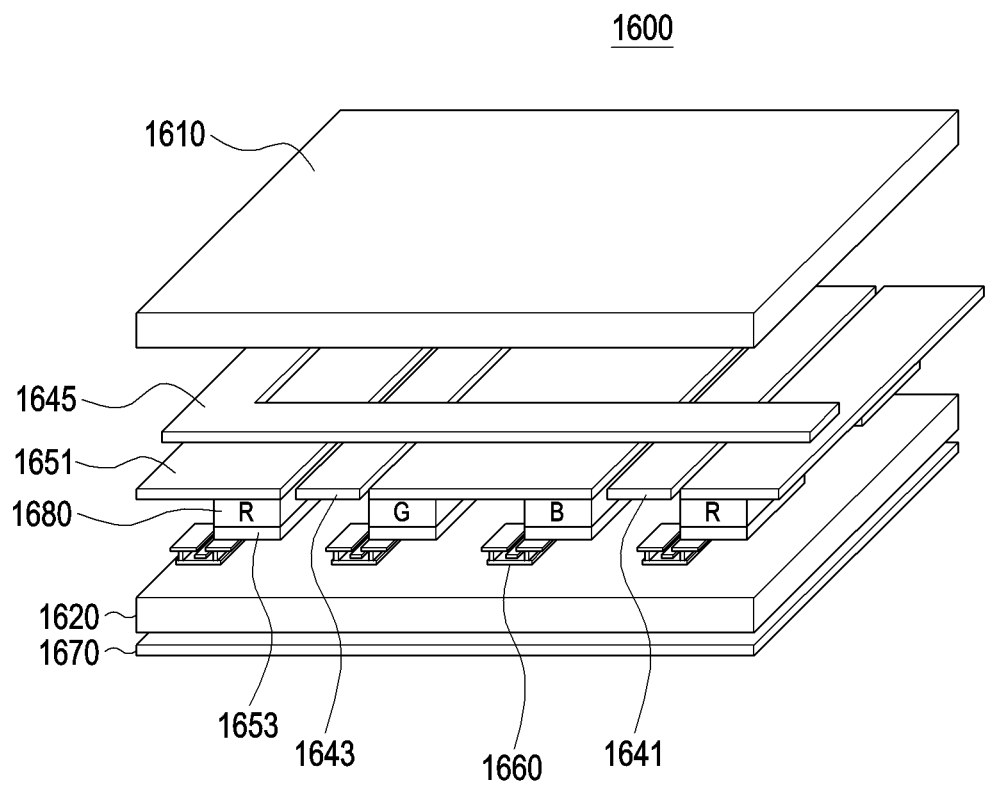
FIG. 33 is a perspective view illustrating stacked faces of a display device according to various embodiments of the present disclosure.
Figure 34:
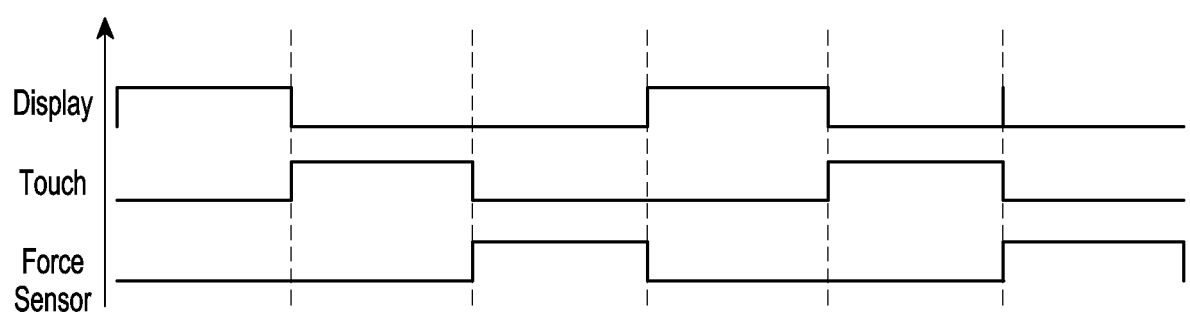
FIGS. 34 through 40 are schematic views each illustrating time division switching driving of a display device according to various embodiments of the present disclosure.

FIG. 33 is a perspective view illustrating stacked faces of a display device 1600 according to various embodiments of the present disclosure. A second transparent plate 1610, a third transparent plate 1620, a second electrode 1641, a seventh electrode 1643, and a transistor 1660 of the display device 1600 illustrated in FIG. 33 may be the second transparent plate 1510, the third transparent plate 1520, the second electrode 1541, the seventh electrode 1543, and the transistor 1560 illustrated in FIG. 31. FIG. 33 illustrates another embodiment compared with FIG. 31, in which an overall structure is similar with a structure illustrated in FIG. 31, such that a description will be made based on differences.

According to various embodiments of the present disclosure, the display device 1600 may include an antenna structure 1645. The antenna structure 1645 may form a stacking structure together with other components of the display, and may form a specific pattern.

According to various embodiments of the present disclosure, the antenna structure 1645 may be arranged between a third electrode 1651 and a second transparent plate 1610. For example, when configured using low frequencies such as NFC, wireless charging, etc., the antenna structure 1645 may be in the form of a closed loop arranged along a circumference of the display device 1600. For example, when configured using high frequencies such as LTE, WiFi, Bluetooth (BT), GPS, etc., the antenna structure 1645 may be arranged in an edge along a face or a tile face of the display device 1600. However, arrangement of the antenna structure 1645 is not limited thereto, and the antenna structure 1645 may be arranged in various forms and/or patterns in the second regions S2 through the sixth region S6 illustrated in FIG. 4.

FIGS. 34 through 40 are schematic views each illustrating time division switching driving of a display device according to various embodiments of the present disclosure.

Referring to FIGS. 34 through 38, each of a touch electrode, a pressure electrode, and/or a display electrode may be a touch electrode (the touch electrode 431), a pressure electrode (the pressure electrode 441), and/or a display electrode (the third electrode 451 and/or the fourth electrode 453) of FIG. 5.

According to various embodiments of the present disclosure, the electronic device may include a control circuit (not shown) electrically connected with at least one of a touch electrode, a pressure electrode, and/or a display electrode. The control circuit may sense a position of a touch input of the user by using the touch electrode, sense a strength of the touch input of the user by using the pressure electrode, and display visual information in at least a part of the display by using the display electrode.

Referring back to FIG. 34, according to various embodiments of the present disclosure, the display device of the electronic device may repetitively perform time-division driving in three periods. For example, in a first time period, the display device may receive the reception signal through the touch electrode. In the second time period, a driving voltage may be applied through the touch electrode, and a reference voltage, e.g., a ground voltage or a particular voltage may be applied to the pressure electrode and the display electrode.

According to various embodiments of the present disclosure, in a second time period, the display device may receive the reception signal through the pressure electrode. In the second time period, a driving voltage may be applied through the pressure electrode, and a reference voltage, e.g., a ground voltage or a particular voltage may be applied to the touch electrode and the display electrode.

According to various embodiments of the present disclosure, in the third time period, the display device may receive the reception signal through the display electrode. In the first time period, a driving voltage may be applied through the display electrode, and a reference voltage, e.g., a ground voltage or a particular voltage may be applied to the touch electrode and the pressure electrode.

Figure 35A:
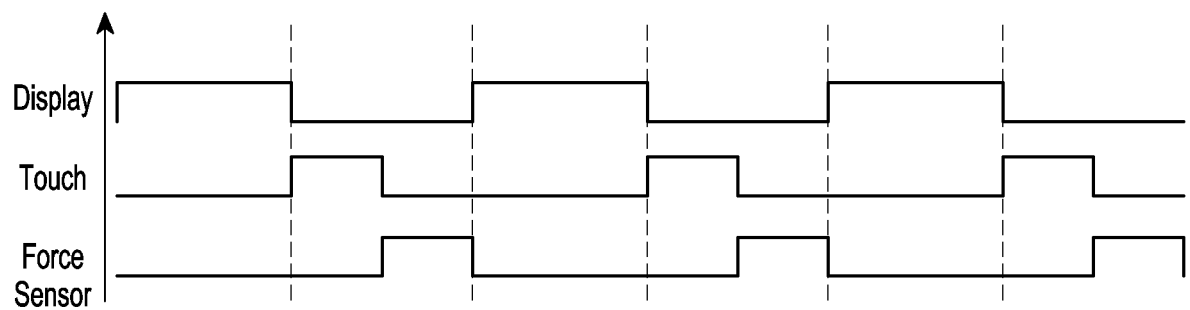
Figure 35B:
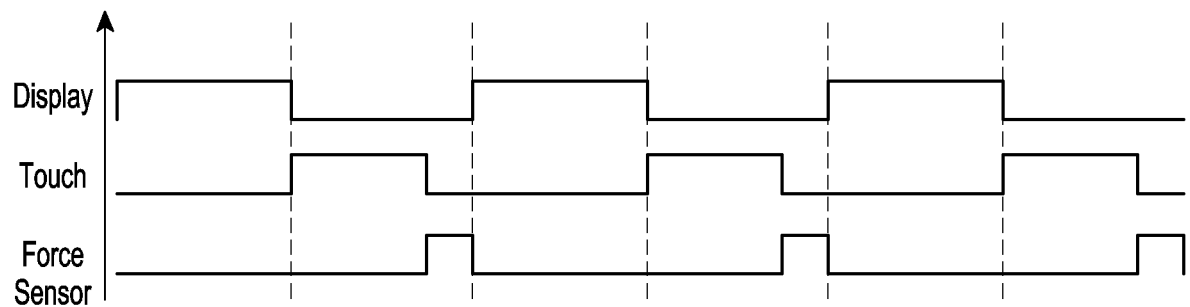

Referring to FIGS. 35(*a*) and 35(*b*), unlike sequential time-division driving according to the previous embodiment (the embodiment of FIG. 34), divisional driving may be performed using at least one of the time periods differently.

According to various embodiments of the present disclosure, in the first time period, the display device 500 may receive the reception signal having a first period through the touch electrode. In the second time period, the display device 500 may receive the reception signal having a second period through the pressure electrode. However, time-division driving may be performed such that the first time period and the second time period are shorter than the third time period. For example, time-division driving may be performed such that a sum of a first period of the first time period and a first period of the second time period are equal to a third period of the third time period.

According to various embodiments of the present disclosure, time-division driving may be performed such that a first period in which driving is performed using the touch electrode and a second period in which driving is performed using the pressure electrode are different from each other. For example, time-division driving may be performed such that the first period based on the touch electrode is three to five times longer than the second period based on the pressure electrode.

Figure 36A:
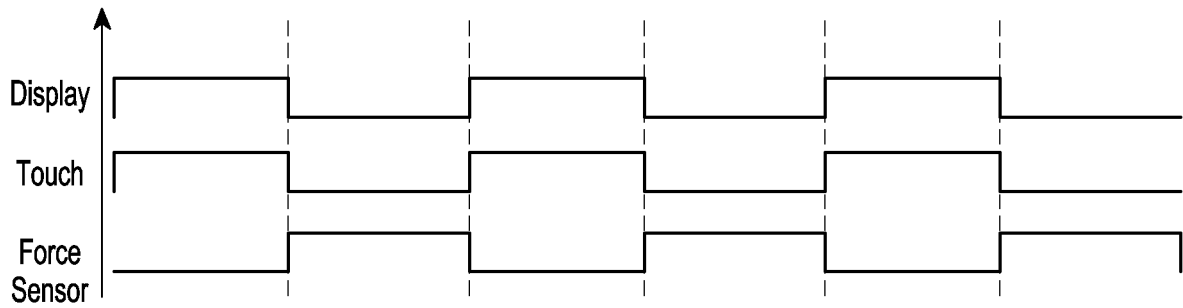
Figure 36B:
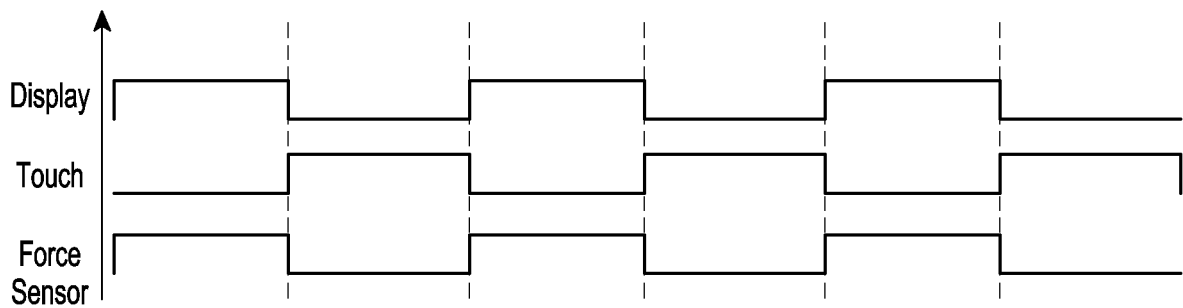

Referring to FIGS. 36(*a*) and 36(*b*), a 3D input method using a display device may divide time into two time periods and simultaneously drive two out of three signals in one time period. Unlike in time-division driving according to the preceding embodiment (the embodiment of FIGS. 34 and 35), time-division driving in the two periods may be repetitively performed.

According to various embodiments of the present disclosure, in the first time period, the display device may receive the reception signal having a first period through the touch electrode. At the same time, in the first time period, the display device may receive the reception signal having a third period equal to the first period through the display electrode.

In the second time period, the display device may receive the reception signal having a second period through the pressure electrode. In the second time period, a reference voltage, e.g., a ground voltage or a particular voltage may be applied to the touch electrode and the display electrode. According to an embodiment of the present disclosure, a driving voltage may be applied to the second electrode and the display electrode as a common electrode in different time periods.

In another embodiment of the present disclosure, in the first time period, the display device may receive the reception signal having a first period through the pressure electrode. At the same time, in the first time period, the display device may receive the reception signal having a third period equal to the first period through the display electrode.

In the second time period, the display device may receive the reception signal having a first period through the touch electrode. In the second time period, a reference voltage, e.g., a ground voltage or a particular voltage may be applied to the pressure electrode and the display electrode. According to an embodiment of the present disclosure, a driving voltage may be applied to the first electrode and the display electrode as a common electrode in different time periods.

Figure 37:
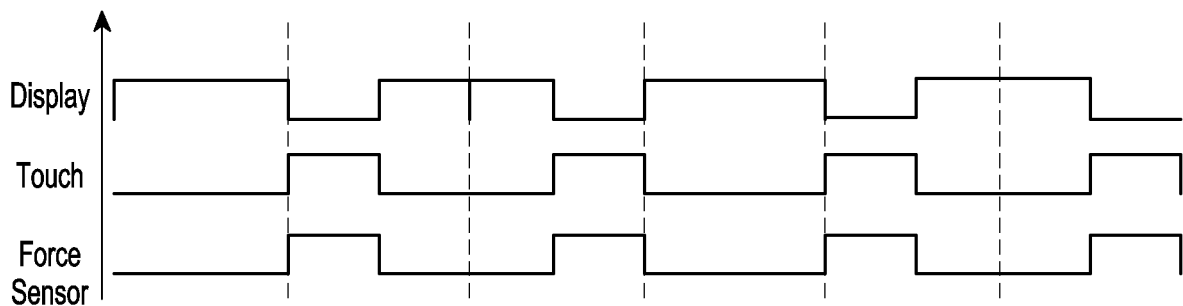

Referring to FIG. 37, a 3D input method using a display device may divide time into two time periods and simultaneously drive two out of three signals in one time period. Like time-division driving of FIG. 35, the 3D input method may repetitively perform driving based on asymmetric time-division in one time period.

Figure 38A:
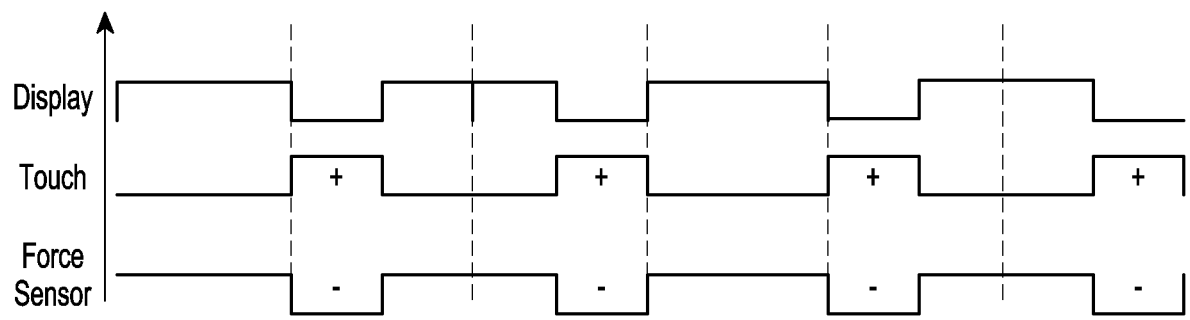
Figure 38B:
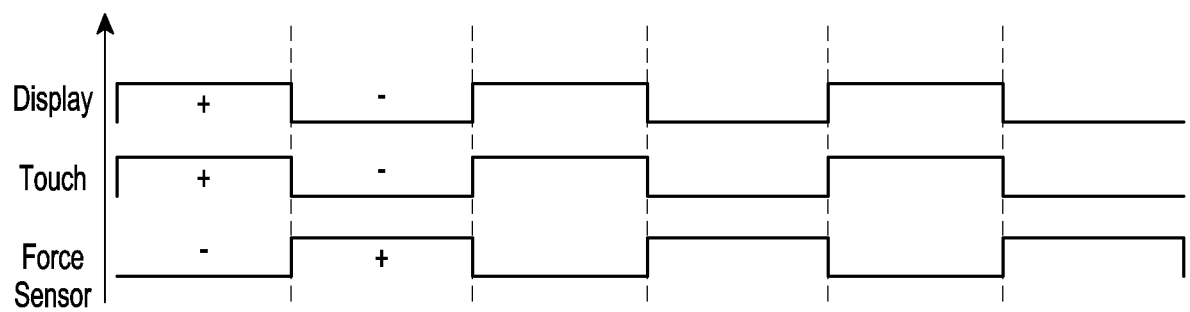

Referring to FIGS. 38(*a*) and 38(*b*), a 3D input method using a display device may divide time into two time periods and invertedly drive out signals of two of the electrodes in one time period.

According to various embodiments of the present disclosure, after the display electrode is driven in a time period part such that the display outputs a screen, the touch electrode and the pressure electrode may be simultaneously driven in another period part to simultaneously detect a touch sensing signal and a pressure sensing signal. In the case that the touch electrode is driven in a (−) direction, the pressure electrode may be driven in a (+) direction.

In another example, in one period part, the touch electrode and the display electrode may be simultaneously driven to output the display screen and to detect a touch sensing signal at the same time. In the case that the touch electrode is driven in the (+) direction and the display electrode is driven in the (+) direction, the pressure electrode may be driven in the (−) direction.

Figure 39:
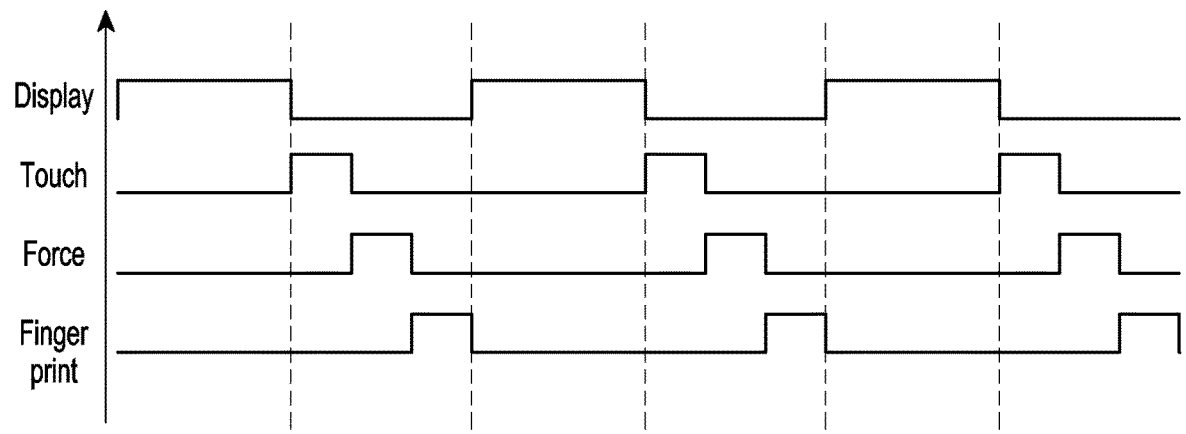
Figure 40:
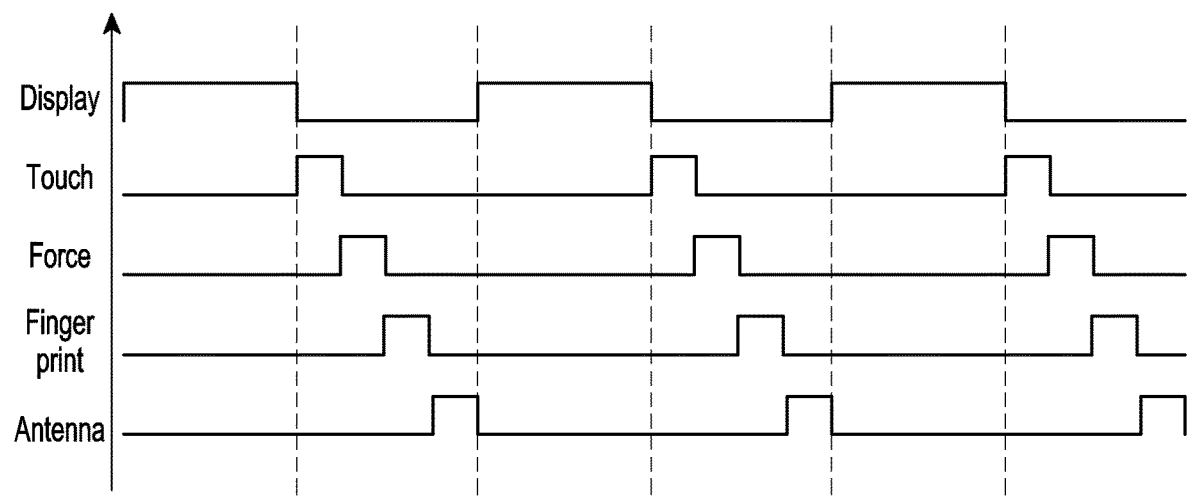

Referring to FIGS. 39 and 40, the electronic device may include a fingerprint electrode electrically connected with the control circuit that may obtain user's fingerprint information included in the touch input by using the fingerprint electrode. In another example, the electronic device may include an additional electrode electrically connected with the communication circuit that may transmit and receive an RF signal to/from an external electronic device by using the additional electrode.

According to various embodiments of the present disclosure, the fingerprint electrode may receive the reception signal having a fourth period in a fourth time period (first time period). In a fifth time period (second time period), the additional electrode may receive the reception signal having a fifth period. In the fourth time period and/or the fifth time period, a driving voltage may be applied to the fingerprint electrode and/or the additional electrode, and a reference voltage, e.g., a ground voltage or a particular voltage may be applied to the other electrodes.

In another example, two or more signals may be simultaneously driven in one time period, and time-division driving in two time periods may be performed repetitively or invertedly.

Referring to FIGS. 34 through 40, as a driving method, for example, in the case that a mode in which a touch sensor does not operate is set (e.g., a waterproof mode), the control circuit may detect that the touch sensor of the electronic device does not operate, output the screen through the display electrode, and drive the force sensor simultaneously or time-divisionally.

According to various embodiments of the present disclosure, in the case that a mode using a particular sensor (an additional sensor) is set, the control circuit may temporarily increase a corresponding signal frequency and reduce the other signal frequencies in the electronic device. For example, when card payment is performed in a fingerprint recognition mode, the control circuit may temporarily increase a frequency of a fingerprint recognition signal and reduce a frequency of a signal of a proximity sensor, etc.

According to various embodiments of the present disclosure, in the case that a wireless charging mode operating in the antenna structure is set, the control circuit may reduce other sensor-related signal frequencies and/or power or stop sensor-related sensing during charging of the electronic device.

Figure 41:
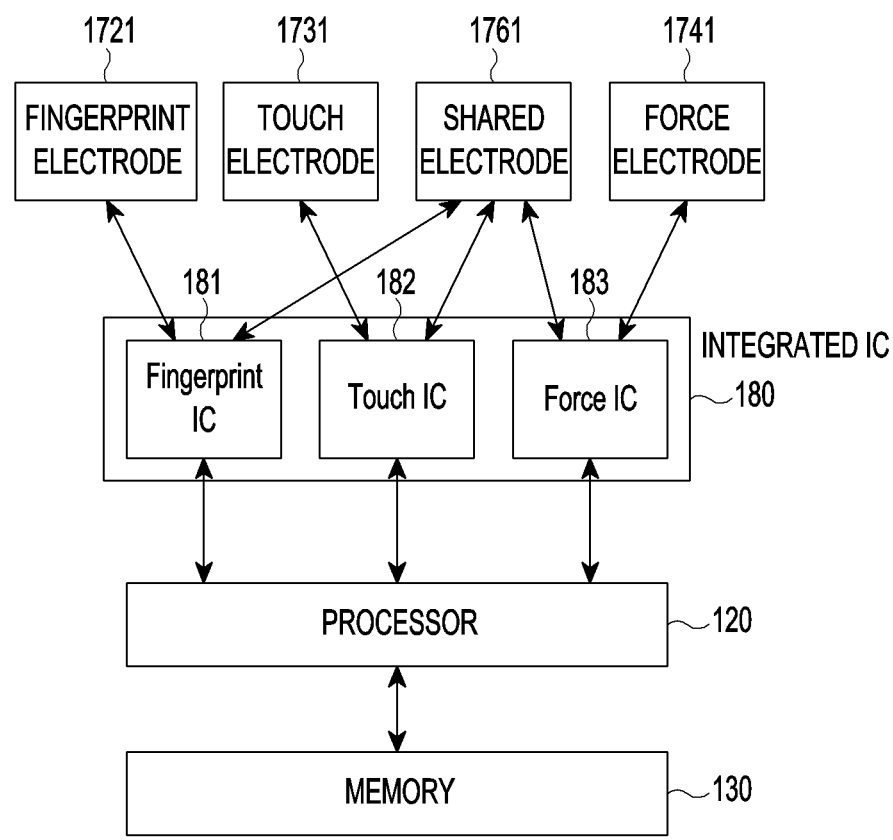
FIGS. 41 and 42 are block diagrams each illustrating an integrated IC connected with electrodes of a display device, according to various embodiments of the present disclosure.
Figure 42:
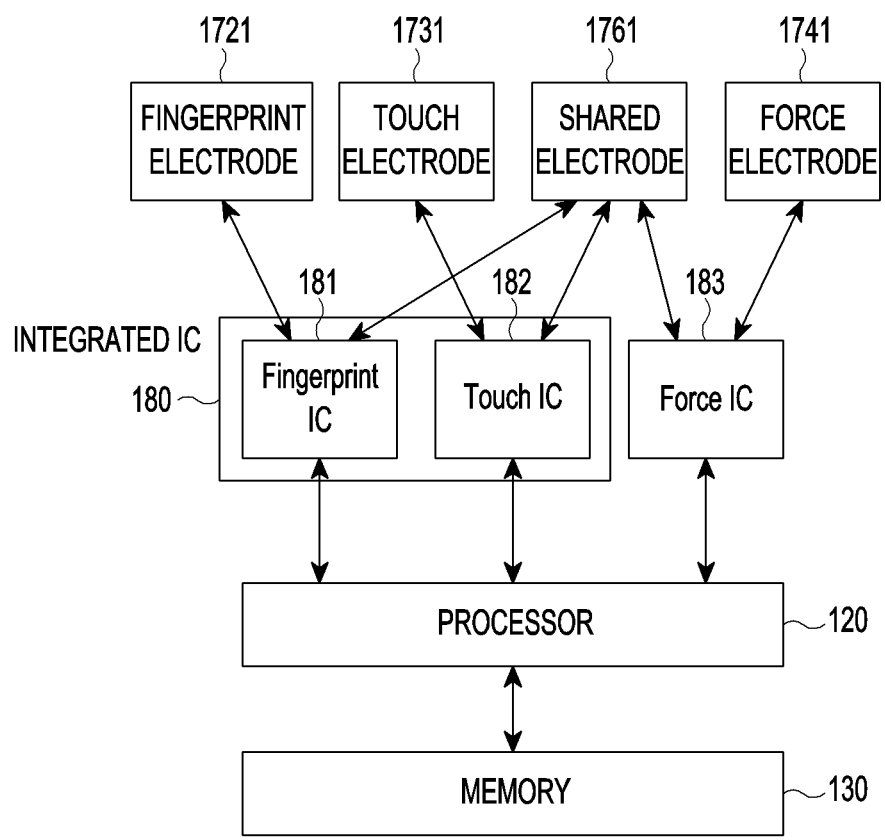

FIGS. 41 and 42 are block diagrams each illustrating an integrated IC connected with electrodes of a display device, according to various embodiments of the present disclosure.

As shown in FIGS. 41 and 42, the display device may include a fingerprint electrode 1721, a shared electrode 1761, a touch electrode 1731, and/or a pressure electrode 1741.

According to various embodiments of the present disclosure, the fingerprint sensor may include two electrodes, e.g., the fingerprint electrode 1721 and the shared electrode 1761 that are formed on respective support members. The fingerprint sensor may be implemented through electrical connection between the fingerprint electrode 1721 arranged on a support member and the shared electrode 1761 on another support member. When the fingerprint electrode 1721 is activated and operates as a reception electrode, the shared electrode 1761 may be activated and operate as a transmission electrode.

According to various embodiments of the present disclosure, the shared electrode 1761 may be connected with the touch electrode 1731 and/or the pressure electrode 1741 electrically as well as with the fingerprint electrode 1721. Thus, the touch sensor may be implemented through electrical connection between the touch electrode 1731 and the shared electrode 1761, and the force sensor may be implemented through electrical connection between the pressure electrode 1741 and the shared electrode 1761. For example, when the shared electrode 1761 is activated and operates as a transmission electrode, the touch electrode 1731 and/or the pressure electrode 1741 may be activated and operate as a reception electrode. In another example, when the shared electrode 261 is activated and operates as a reception electrode, the fingerprint electrode 1721, the touch electrode 1731 and/or the pressure electrode 1741 may be activated and operate as transmission electrodes.

According to various embodiments of the present disclosure, at least some (e.g., two or more) of the fingerprint sensor, the touch sensor, and the force sensor may be included in one IC or an IC package. For example, the fingerprint sensor 1721 of the fingerprint sensor and the shared electrode 1761 may be connected with a fingerprint IC 181, the touch electrode 1731 of the touch sensor and the shared electrode 1761 may be connected with a touch IC 182, and the pressure electrode 1741 of the force sensor and the shared electrode 1761 may be connected with a force IC 183, such that a sensing operation may be performed based on a circuit operation.

According to various embodiments of the present disclosure, at least two of the fingerprint IC 181, the touch IC 182, and/or the force IC 183 may operate as an integrated IC 180. For example, as illustrated in FIG. 36, the fingerprint IC 181, the touch IC 182, and the force IC 183 may be configured as the integrated IC 180 in which they are integrated into one, to collectively process whether a fingerprint of a finger of the user, a touch position, and a pressure of the finger are detected. In another example, as illustrated in FIG. 37, the fingerprint IC 181 and the touch IC 182 may be configured as the integrated IC 180 where they are integrated into one, to collectively process whether the fingerprint of the finger of the user and the touch position are detected, and the force IC 183 may be directly connected with the processor 120 to separately process detection of the pressure of the finger of the user.

According to various embodiments of the present disclosure, at least two of the fingerprint IC 181, the touch IC 182, the force IC 183, and/or a display driver IC may operate as the integrated IC 180. For example, as illustrated in FIG. 38, the fingerprint IC 181, the touch IC 182, the force IC 183, and the display driver IC 161 may be configured as the integrated IC 180 in which they are integrated into one, to collectively process whether a fingerprint of a finger of the user, a touch position, and a pressure of the finger are detected, and whether a driving signal is transmitted to the display. These ICs may be connected with a processor.

The processor 120 controls multiple hardware or software components connected to the processor 120 by driving an operating system (OS) or an application program, and performs processing and operations with respect to various data. The processor 120 may be implemented with, for example, a system on chip (SoC). According to an embodiment of the present disclosure, the server 120 may include a graphic processing unit (GPU) and/or an image signal processor. The processor 120 loads an instruction or data received from at least one of other elements (e.g., a nonvolatile memory) into a volatile memory to process the instruction or data, and stores result data in the non-volatile memory.

The memory 130 may include an internal memory or an external memory. The internal memory may, for example, include at least one of a volatile memory (e.g., dynamic random access memory (DRAM), static RAM (SRAM), synchronous dynamic RAM (SDRAM), etc.), and a non-volatile memory (e.g., one time programmable read only memory (OTPROM), programmable ROM (PROM), erasable and programmable ROM (EPROM), electrically erasable and programmable ROM (EEPROM), etc.), mask ROM, flash ROM, a flash memory, and a solid state drive (SSD). The external memory may further include flash drive, for example, compact flash (CF), secure digital (SD), micro-SD, mini-SD, extreme Digital (xD), a multi-media card (MMC), or a memory stick. The external memory may be functionally or physically connected with the electronic device through various interfaces.

As illustrated in FIG. 42, an IC integration structure may be configured through interworking between touch screen panel (TSP) IC integration and a DDI. According to an embodiment of the present disclosure, the TSP IC integration may be performed by connecting the force sensor to a remaining channel of the TSP IC to drive the force sensor and the touch sensor at the same time, or by integrating the fingerprint sensor to drive the force sensor and the fingerprint sensor at the same time. DDI integration may be configured by interworking between the TSP integrated IC and the display driver IC and may collectively process data. Coordinates and an event corresponding to a touch position based on the DDI integration may be processed through a path of a TSP analog front end (AFE), a DDI, and an AP.

Figure 43:
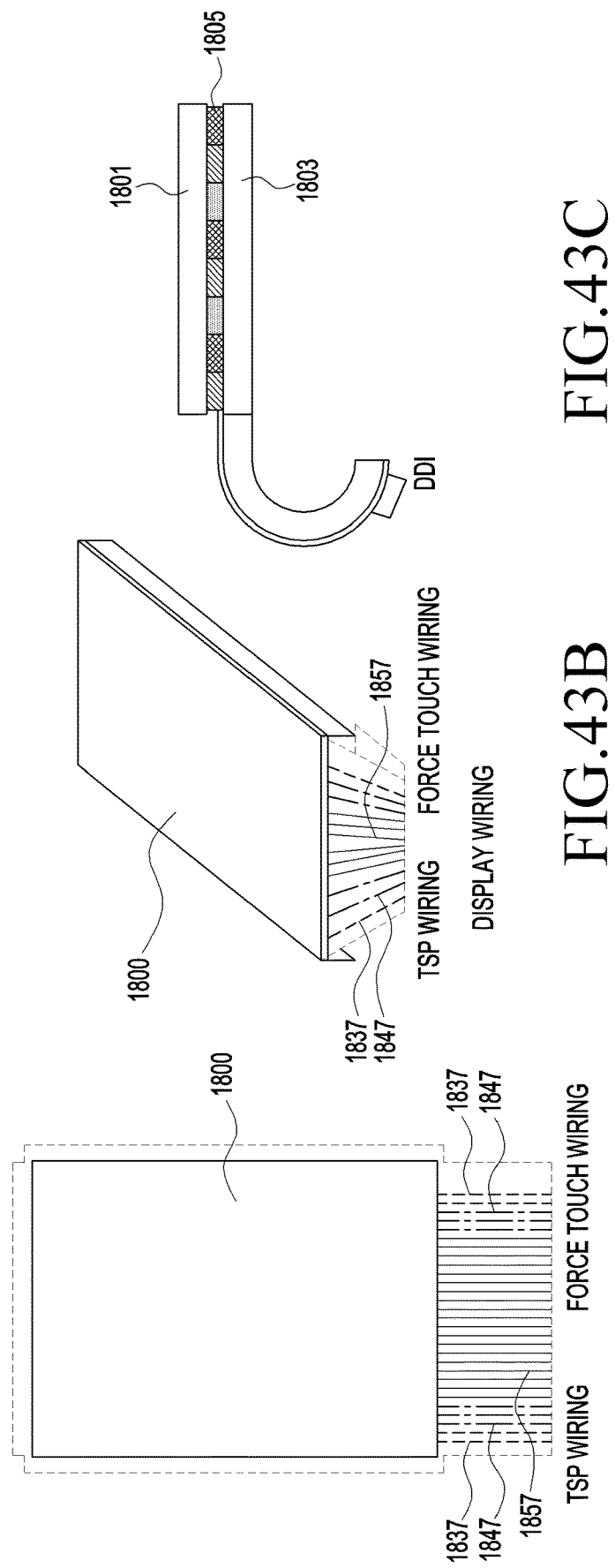
FIGS. 43A, 43B, and 43C are perspective views and a cross-sectional view illustrating wirings of an inactive area of a display device, according to various embodiments of the present disclosure.

FIG. 43 is a perspective view and a cross-sectional view illustrating wirings of an inactive area of a display device, according to various embodiments of the present disclosure.

Referring to FIG. 43, a display device of an electronic device may include an active region in which the visual information is displayed and an inactive region in which the visual information is not displayed. In another example, a third transparent plate (the third transparent plate 420 of FIG. 5) of the display device may be configured to be folded in the second direction (−Z) in the inactive region.

According to various embodiments of the present disclosure, in the display device, a display wiring 1857, a touch sensor wiring 1837, a force sensor wiring 1847, an antenna wiring, and/or an wiring of other sensors, which are drawn from the inside, may be connected to an IC along one flexible printed circuit board (FPCB) (COF) or a display bottom plate (COP). The IC may be the above-described integrated IC, and each wiring may be arranged in adjacent to the IC.

According to various embodiments of the present disclosure, at least a part of the control circuit of the electronic device may be arranged in a part of a region of the third transparent plate, which is folded in the second direction (−Z), and may be connected to each wiring. For example, wirings electrically connected with the control circuit may be arranged in another part of the folded region of the third transparent plate in the second direction (−Z), and may include a first wiring 1837, a second wiring 1847, and a third wiring 1857. The first wiring 1837 may be electrically connected with the first electrode (the first electrode 431 of FIG. 5), the second wiring 1847 may be electrically connected with the second electrode (the second electrode 441 of FIG. 5), and the third wiring 1857 may be electrically connected with the third electrode (the third electrode 451 of FIG. 5) and/or the fourth electrode (the fourth electrode 453 of FIG. 5).

According to various embodiments of the present disclosure, the third transparent plate may include a first polymer layer 1801 and a second polymer layer 1803 attached on a face of the first polymer layer 1801 facing the second direction (−Z). The second polymer layer 1803 may be configured to be at least partially removed from the folded region of the third transparent plate in the second direction (−Z). With this configuration, a BM strength is reduced when compared to an existing electronic device, such that a size of the display device may increase.

Figure 44:
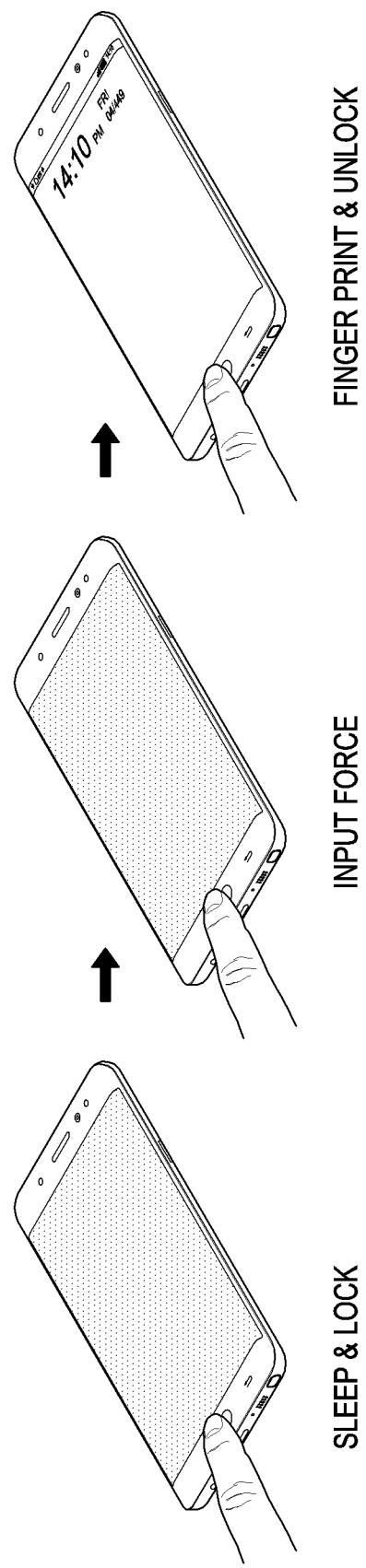
FIGS. 44A, 44B, 44C, 45A, 45B, and 45C are views for describing unlocking and payment authentication of an electronic device according to various embodiments of the present disclosure.
Figure 45:
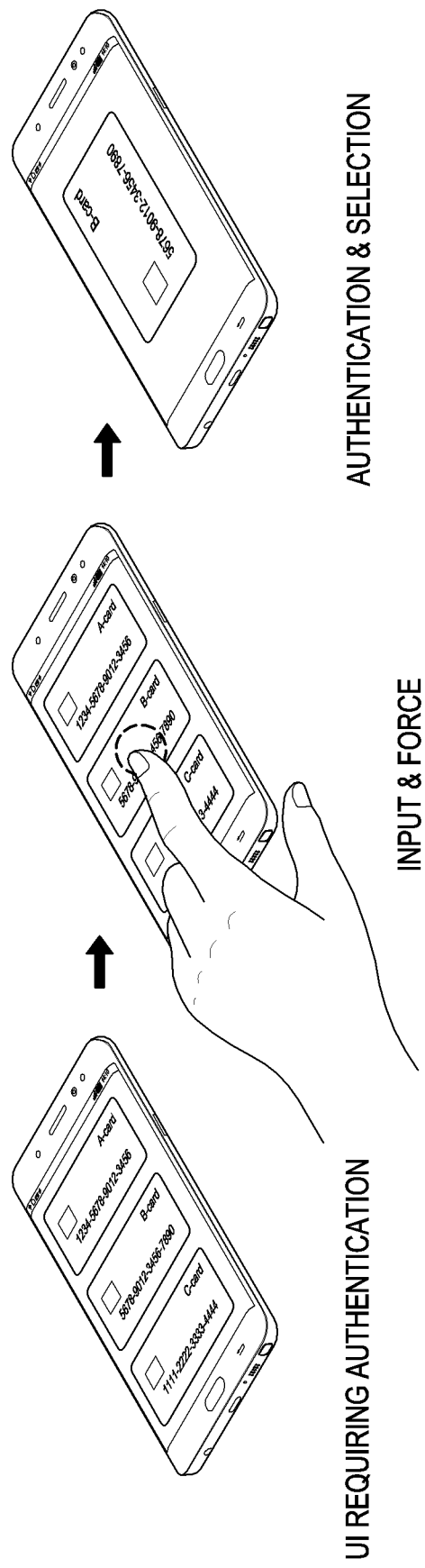

FIGS. 44 and 45 are views for describing unlocking and payment authentication of an electronic device according to various embodiments of the present disclosure.

As illustrated in FIG. 44, the electronic device may detect a user's input and unlock the electronic device. According to an embodiment of the present disclosure, the user may perform an operation of detecting an input with a finger in an active region of the electronic device as illustrated in (a). In the input detecting operation, a driving voltage may be applied to only a force sensor-related electrode to detect an input using only the force sensor, and a ground voltage or a particular voltage may be applied to touch sensor-related and display output-related electrodes except for the force sensor-related electrode.

Thereafter, when an input through the user's touch is detected, the electronic device may perform an operation of activating the fingerprint sensor as illustrated in (b). The electronic device may compare previously registered fingerprint information with user's fingerprint information to determine whether to output the screen. In the case that the user's fingerprint information and fingerprint information previously registered in the electronic device match each other, an operation of unlocking the electronic device may be performed as illustrated in (c). Once authentication with respect to the user is performed, the electronic device may detect a signal from a locking device, automatically select the screen corresponding to the detected signal, and display the screen on the display. In another example, simultaneously with fingerprint recognition, a driving voltage may be applied to the display electrode which may then be activated. Operations illustrated in (a) through (c) may be performed at the same time with user's selection.

As illustrated in FIG. 45, the electronic device may detect the user's input to activate an application requiring authentication of the electronic device and perform a necessary procedure. According to an embodiment of the present disclosure, the electronic device may perform an operation where a plurality of cards requiring authentication are output on a display screen and displayed to the user, as illustrated in (a). Thereafter, the user may perform an operation where an input made by a finger in an active region of the electronic device to select one of the displayed cards is detected and the fingerprint sensor is activated, as illustrated in (b). In the input detecting operation, a driving voltage may be applied to only a force sensor-related electrode to detect an input using only the force sensor, and a ground voltage or a particular voltage may be applied to touch sensor-related and display output-related electrodes except for the force sensor-related electrode.

Simultaneously with the operation of detecting the input with respect to the particular card, an operation of activating the fingerprint sensor in a particular card region on the entire display screen is performed, and the electronic device may compare the previously registered fingerprint information with the user's fingerprint information to determine whether to authenticate the use of the card. In the case that the user's fingerprint information and the fingerprint information previously registered in the electronic device match each other, an operation of authenticating the card may be performed as illustrated in (c). Once authentication with respect to the user is performed, the electronic device may detect a payment signal for a particular card, automatically select the screen corresponding to the detected signal, and display the screen on the display. In another example, simultaneously with fingerprint recognition, a driving voltage may be applied to the display electrode which may then be activated. Operations illustrated in (a) through (c) may be performed at the same time with user's selection.

Figure 46:
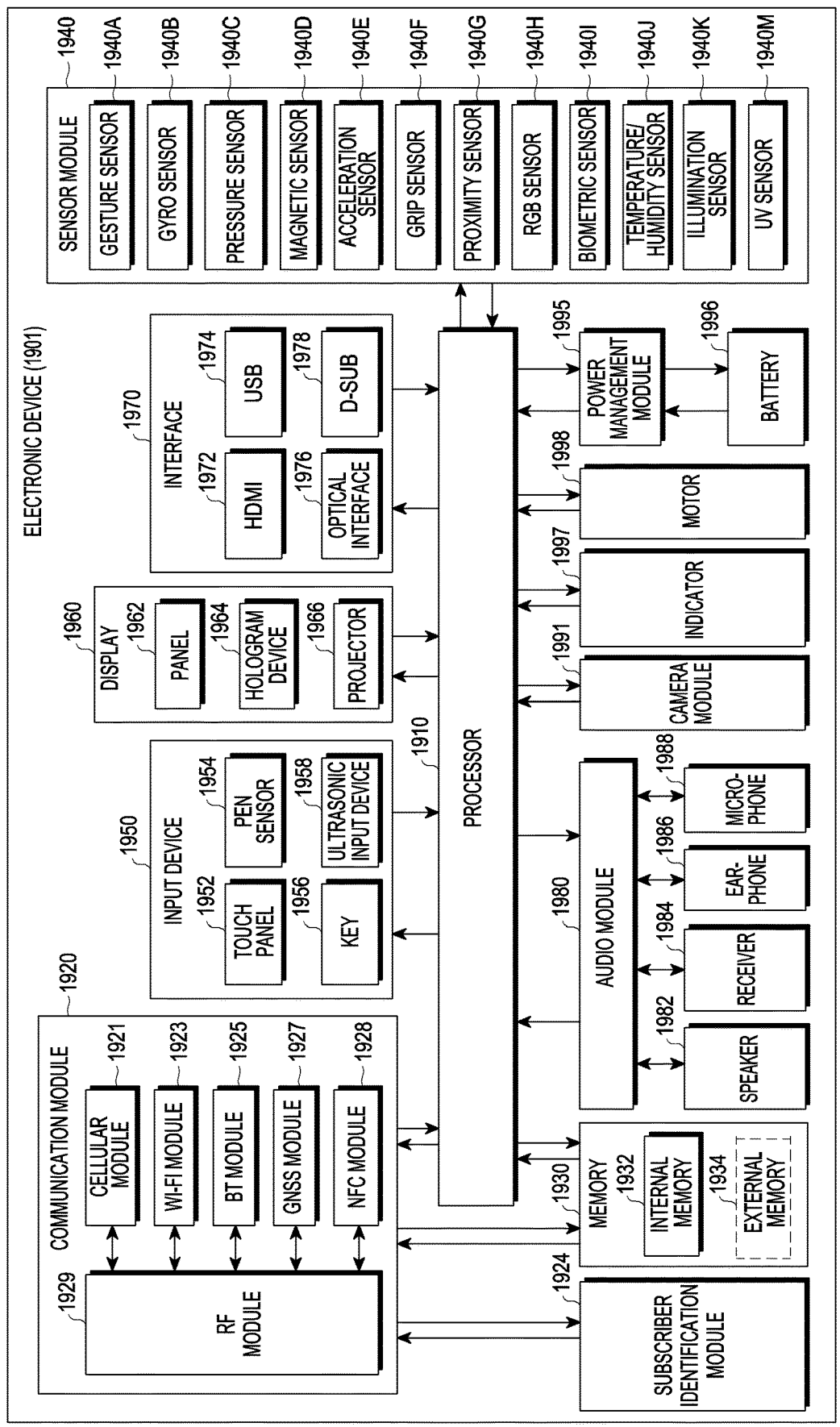
FIG. 46 is a block diagram of a detailed structure of an electronic device according to various embodiments of the present disclosure.

FIG. 46 is a block diagram of an electronic device according to various embodiments of the present disclosure. The electronic device 1901 may form the entire electronic device 101 illustrated in FIG. 1 or a part of the electronic device 101 illustrated in FIG. 1. The electronic device 1901 may include one or more processors (e.g., application processors (APs)) 1910, a communication module 1920, a subscriber identification module (SIM) 1924, a memory 1930, a sensor module 1940, an input device 1950, a display 1960, an interface 1970, an audio module 1980, a camera module 1991, a power management module 1995, a battery 1996, an indicator 1997, and a motor 1998.

The processor 1910 controls multiple hardware or software components connected to the processor 1910 by driving an operating system (OS) or an application program, and performs processing and operations with respect to various data. The processor 1910 may be implemented with, for example, a system on chip (SoC). According to an embodiment of the present disclosure, the server 1910 may include a graphic processing unit (GPU) and/or an image signal processor. The processor 1910 may include at least some of the elements illustrated in FIG. 46 (e.g., the cellular module 1921). The processor 1910 loads an instruction or data received from at least one of other elements (e.g., a non-volatile memory) into a volatile memory to process the instruction or data, and stores result data in the non-volatile memory.

The communication module 1920 may have a configuration that is the same as or similar to the communication interface 170 illustrated in FIG. 1. The communication module 1920 may include, for example, the cellular module 1921, a WiFi module 1923, a Bluetooth (BT) module 1925, a GNSS module 1927, an NFC module 1928, and a radio frequency (RF) module 1929. The cellular module 1921 may provide, for example, a voice call, a video call, a text service, or an Internet service over a communication network. According to an embodiment, the cellular module 1921 identifies and authenticates the electronic device 1901 in a communication network by using the SIM 1924 (e.g., a SIM card). According to an embodiment, the cellular module 1921 may perform at least one of functions that may be provided by the processor 1910. According to an embodiment, the cellular module 1921 may include a communication processor (CP). According to some embodiment, at least some (e.g., two or more) of the cellular module 1921, the WiFi module 1923, the BT module 1925, the GNSS module 1927, and the NFC module 1928 may be included in one integrated chip (IC) or IC package. The RF module 1929 may, for example, transmit and receive a communication signal (e.g., an RF signal). The RF module 1929 may include a transceiver, a power amp module (PAM), a frequency filter, a low noise amplifier (LNA), or an antenna. According to another embodiment, at least one of the cellular module 1921, the WiFi module 1923, the BT module 1925, the GNSS module 1927, and the NFC module 1928 may transmit and receive an RF signal through the separate RF module. The SIM 224 may, for example, include a card including a SIM or an embedded SIM, and may include unique identification information (e.g., an integrated circuit card identifier (ICCID) or subscriber information (e.g., an international mobile subscriber identity (IMSI)).

The memory 1930 (e.g., the memory 130 of FIG. 1) may, for example, include an internal memory 1932 and/or an external memory 1934. The internal memory 1932 may, for example, include at least one of a volatile memory (e.g., dynamic random access memory (DRAM), static RAM (SRAM), synchronous dynamic RAM (SDRAM), etc.), and a non-volatile memory (e.g., one time programmable read only memory (OTPROM), programmable ROM (PROM), erasable and programmable ROM (EPROM), electrically erasable and programmable ROM (EEPROM), etc.), mask ROM, flash ROM, a flash memory, and a solid state drive (SSD). The external memory 234 may further include flash drive, for example, compact flash (CF), secure digital (SD), micro-SD, mini-SD, extreme Digital (xD), a multi-media card (MMC), or a memory stick. The external memory 1934 may be functionally or physically connected with the electronic device 1901 through various interfaces.

The sensor module 1940 measures physical quantity or senses an operation state of the electronic device 1901 to convert the measured or sensed information into an electric signal. The sensor module 1940 may, for example, include at least one of a gesture sensor 1940A, a gyro sensor 1940B, a pressure sensor 1940C, a magnetic sensor 1940D, an acceleration sensor 1940E, a grip sensor 1940F, a proximity sensor 1940G, a color sensor 1940H (e.g., red/green/blue (RGB) sensor), a biometric sensor 1940I, a temperature/humidity sensor 1940J, an illumination sensor 1940K, and a ultraviolet (UV) sensor 1940M. Additionally or alternatively, the sensor module 1940 may include an E-nose sensor (not shown), an electromyography (EMG) sensor (not shown), an electroencephalogram (EEG) sensor (not shown), an electrocardiogram (ECG) sensor (not shown), an infrared (IR) sensor, an iris sensor, and/or a fingerprint sensor. The sensor module 1940 may further include a control circuit for controlling at least one sensor included therein. In some embodiment, the electronic device 1901 may further include a processor configured to control the sensor module 1940 as part of or separately from the processor 1910, to control the sensor module 1940 during a sleep state of the processor 1910.

The input device 1950 may include, for example, a touch panel 1952, a (digital) pen sensor 1954, a key 1956, an ultrasonic input device 1958, or a force sensor 1959. The touch panel 1952 may use at least one of a capacitive type, a resistive type, an IR type, or an ultrasonic type. The touch panel 1952 may further include a control circuit. The touch panel 1952 may further include a tactile layer to provide tactile reaction to the user. The (digital) pen sensor 1954 may include a recognition sheet which is a part of the touch panel 252 or a separate recognition sheet. The key 1956 may also include a physical button, an optical key, or a keypad. The ultrasonic input device 1958 senses ultrasonic waves generated by an input means through a microphone (e.g., the microphone 288) and checks data corresponding to the sensed ultrasonic waves. The pressure sensor 1959 may be a part of a touch panel or a separate panel. For example, the pressure sensor 1959 may include a structure of one panel or arrangement of a plurality of panels. The pressure sensor 1959 may employ a self-capacitance scheme in which one electrode is used for each basic pixel for a touch pressure and a change in capacitance of the electrode is read or a mutual capacitance scheme in which a plurality of electrodes are used and a change in capacitances of the electrodes is read.

The display 1960 (e.g., the display 160 of FIG. 1) may include a panel 1962, a hologram device 1964, a projector 1966, and/or a control circuit for controlling them. The panel 1962 may be implemented to be flexible, transparent, or wearable. The panel 1962 may be configured with the touch panel 1952 in one module. According to an embodiment, the panel 1962 may include the pressure sensor 1959 (or a "force sensor") capable of measuring a strength of a pressure by a user's touch. The pressure sensor 1959 may be implemented integrally with the touch panel 1952 or may be implemented as one or more sensors separate from the touch panel 1952. The hologram device 1964 may show a stereoscopic image in the air by using interference of light. The projector 1966 may display an image onto a screen through projection of light. The screen may be positioned inside or outside the electronic device 1901.

The interface 1970 may include an HDMI 1972, a USB 1974, an optical interface 1976, or a D-subminiature (D-sub) 1978. The interface 1970 may be included in the communication interface 170 illustrated in FIG. 1. Additionally or alternatively, the interface 1970 may include a mobile high-definition link (MHL) interface, an SD/multi-media card (MMC) interface, or an Infrared Data Association (IrDA) interface. The audio module 1980 may bi-directionally convert sound and an electric signal. At least some element of the audio module 1980 may be included, for example, in the I/O interface 150 illustrated in FIG. 1. The audio module 1980 may process sound information input or output through the speaker 1982, the receiver 1984, the earphone 1986, or the microphone 1988. The camera module 1991 is, for example, a device capable of capturing a still image or a moving image, and according to an embodiment, may include one or more image sensors (e.g., a front sensor or a rear sensor), a lens, an image signal processor (ISP), or a flash (e.g., an LED, a xenon lamp, etc.). The power management module 1995 manages power of the electronic device 1901. According to an embodiment, the power management module 1995 may include a power management integrated circuit (PMIC), a charger IC, or a battery fuel gauge. The PMIC may have a wired and/or wireless charging scheme. The wireless charging scheme may include a magnetic-resonance type, a magnetic induction type, and an electromagnetic type, and may further include an additional circuit for wireless charging, for example, a coil loop, a resonance circuit, or a rectifier. The battery gauge may measure the remaining capacity of the battery 1996 or the voltage, current, or temperature of the battery 1996 during charging. The battery 1996 may include, for example, a rechargeable battery and/or a solar battery.

The indicator 1997 displays a particular state, for example, a booting state, a message state, or a charging state, of the electronic device 1901 or a part thereof (e.g., the processor 1910). The motor 1998 may convert an electric signal into mechanical vibration or generates vibration or a haptic effect. The electronic device 1901 may include a device for supporting the mobile TV (e.g., a GPU) to process media data according to a standard such as digital multimedia broadcasting (DMB), digital video broadcasting (DVB), or MediaFlo™. Each of the foregoing elements described herein may be configured with one or more components, names of which may vary with a type of the electronic device. In various embodiments, some components of the electronic device (e.g., the electronic device 1901) may be omitted or may further include other elements, and some of the components may be coupled to form one entity and identically perform functions of the components before being coupled.

Figure 47:
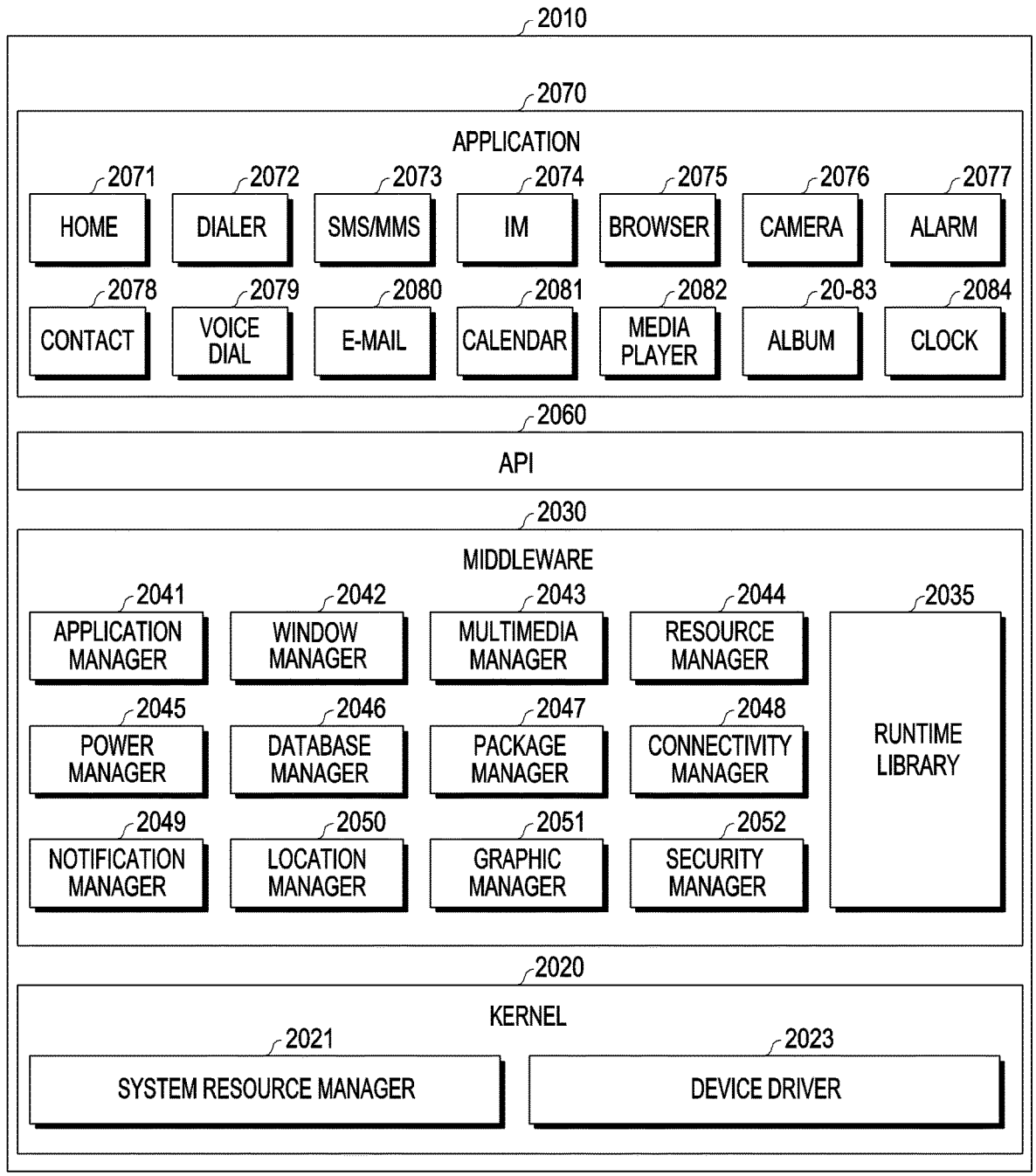
FIG. 47 is a block diagram of programming module according to various embodiments of the present disclosure.

FIG. 47 is a block diagram of a programming module according to various embodiments. According to an embodiment, a programming module 2010 (e.g., the program 140) may include an OS for controlling resources associated with an electronic device (e.g., the electronic device 1901) and/or various applications (e.g., the application program 147) executed on the OS. The OS may include Android™, iOS™ Windows™, Symbian™, Tizen™, or Bada™. Referring to FIG. 47, the programming module 2010 may include a kernel 2020 (e.g., the kernel 141), middleware 2030 (e.g., the middleware 143), an application programming interface (API) 2060 (e.g., the API 145), and/or an application 2070 (e.g., the application program 147). At least a part of the programming module 2010 may be preloaded on an electronic device or may be downloaded from an external device (e.g., the electronic device 102 or 104, or the server 106 of FIG. 1).

The kernel 2020 may include a system resource manager 2021 and/or a device driver 2023. The system resource manager 2021 may perform control, allocation, retrieval of system resources, and so forth. According to an embodiment, the system resource manager 2021 may include a process management unit, a memory management unit, or a file system management unit. The device driver 2023 may include, for example, a display driver IC, a camera driver, a Bluetooth driver, a shared memory driver, a USB driver, a keypad driver, a WiFi driver, an audio driver, or an inter-process communication (IPC) driver.

The middleware 2030 may provide functions that the application 2070 commonly requires or provide various functions to the application 2070 through the API 2060 to allow the application 2070 to use a limited system resource in an electronic device. According to an embodiment, the middleware 2030 may include at least one of a runtime library 2035, an application manager 2041, a window manager 2042, a multimedia manager 2043, a resource manager 2044, a power manager 2045, a database manager 2046, a package manager 2047, a connectivity manager 2048, a notification manager 2049, a location manager 2050, a graphic manager 2051, and a security manager 2052.

The runtime library 2035 may include a library module that a compiler uses to add a new function through a programming language while the application 2070 is executed. The runtime library 2035 performs input/output management, memory management, or calculation function processing. The application manager 2041 manages a life cycle of the applications 2070. The window manager 2042 manages a graphic user interface (GUI) resource used in a screen. The multimedia manager 2043 recognizes a format necessary for playing media files and performs encoding or decoding on a media file by using a codec appropriate for a corresponding format. The resource manager 2044 manages a source code or a memory space of the applications 2070. The power manager 2045 manages a battery or power and provides power information necessary for an operation of the electronic device. According to an embodiment, the power manager 2045 may operate with basic input/output system (BIOS). The database manager 2046 generates, searches or changes a database used for at least one application among the applications 2070. The package manager 2047 manages the installation or update of an application distributed in a package file format.

The connectivity manager 2048 manages a wireless connection. The notification manager 2049 provides an event, e.g., an arriving message, an appointment, proximity notification, etc. The location manager 2050 manages location information of an electronic device. The graphic manager 2051 manages, for example, a graphic effect to be provided to a user or a user interface relating thereto. The security manager 2052 provides, for example, system security or user authentication. According to an embodiment, the middleware 2030 may further include a telephony manager for managing a voice or video call function of the electronic device or a middleware module forming a combination of functions of the above-described components. According to an embodiment, the middleware 2030 provides a module specified for each type of an OS. Additionally, the middleware 2030 may delete some of existing elements or add new elements dynamically. The API 2060 may be provided as a set of API programming functions with a different configuration according to the OS. In the case of Android or iOS, for example, one API set may be provided by each platform, and in the case of Tizen, two or more API sets may be provided.

The application 2070 may include one or more applications capable of providing a function, for example, a home application 2071, a dialer application 2072, a short messaging service/multimedia messaging service (SMS/MMS) application 2073, an instant message (IM) application 2074, a browser application 2075, a camera application 2076, an alarm application 2077, a contact application 2078, a voice dial application 2079, an e-mail application 2080, a calendar application 2081, a media player application 2082, an album application 2083, a clock application 2084, a health care application (e.g., an application for measuring an exercise amount, blood sugar, etc.), or an environment information providing application (e.g., an application for providing air pressure, humidity, or temperature information or the like). According to an embodiment, the application 2070 may include an information exchange application supporting information exchange between the electronic device and an external electronic device. The information exchange application may include, for example, a notification relay application for transferring specific information to the external electronic device or a device management application for managing the external electronic device. For example, the notification relay application may deliver notification information generated in another application of the electronic device to an external electronic device or may receive notification information from the external electronic device and provide the notification information to the user. The device management application may manage (e.g., install, remove, or update) a function (e.g., turn on/turn off of an external electronic device itself (or a part thereof) or control of brightness (or resolution) of a display) of an external device communicating with the electronic device, a service provided by an application operating in an external electronic device or provided by the external electronic device (e.g., a call service or a message service). According to an embodiment, the application 2070 may include an application (e.g., device health care application of mobile medical equipment) designated according to an attribute of the external electronic device. According to an embodiment, the application 2070 may include an application received from the external electronic device. The at least a part of the programming module 2010 may be implemented (e.g., executed) by software, firmware, hardware (e.g., the processor 1910), or a combination of two or more of them, and may include, for example, modules, programs, routines, sets of instructions, or processes for performing one or more functions.

A term "module" used herein may mean, for example, a unit including one of or a combination of two or more of hardware, software, and firmware, and may be used interchangeably with terms such as logic, a logic block, a part, or a circuit. The "module" may be a part configured integrally, a minimum unit or a portion thereof performing one or more functions. The "module" may be implemented mechanically or electronically, and may include an application-specific integrated circuit (ASIC) chip, field-programmable gate arrays (FPGAs), and a programmable-logic device performing certain operations already known or to be developed. At least a part of an apparatus (e.g., modules or functions thereof) or a method (e.g., operations) according to various embodiments may be implemented with an instruction stored in a computer-readable storage medium (e.g., the memory 130 of FIG. 1) in the form of a programming module. When the instructions are executed by a processor (for example, the processor 120 of FIG. 1), the processor may perform functions corresponding to the instructions. The computer-readable recording medium includes hard disk, floppy disk, or magnetic media (e.g., a magnetic tape, optical media (e.g., compact disc read only memory (CD-ROM) or digital versatile disc (DVD), magneto-optical media (e.g., floptical disk), an embedded memory, and so forth. The instructions may include a code generated by a compiler or a code executable by an interpreter. Modules or programming modules according to various embodiments of the present disclosure may include one or more of the foregoing elements, have some of the foregoing elements omitted, or further include additional other elements. Operations performed by the module, the program, or another component according to various embodiments may be carried out sequentially, in parallel, repeatedly, or heuristically, or one or more of the operations may be executed in a different order or omitted, or one or more other operations may be added.

As described above, an electronic device according to the present disclosure includes a housing including a first face facing a first direction and a second face facing a second direction that is opposite to the first direction, and including a first transparent plate forming at least a part of the first face of the housing, a display disposed between the first transparent plate and the second face of the housing, and including a second transparent plate facing the first direction, and a third transparent plate facing the second direction, a first electrode, a second electrode, a third electrode, and a fourth electrode that are disposed between the second transparent plate and the third transparent plate, and a control circuit electrically connected with the first electrode, the second electrode, the third electrode, and the fourth electrode, in which the control circuit is configured to detect a position of a touch input with respect to the first transparent plate by using the first electrode, to detect a strength of the touch input by using the second electrode, and to display visual information in at least a part of the display by using the third electrode and the fourth electrode.

According to various embodiments of the present disclosure, the second electrode may be arranged on a plane that is substantially identical to a plane of one of the third electrode or the fourth electrode.

According to various embodiments of the present disclosure, the second electrode may include a material that is substantially identical to a material of one of the third electrode or the fourth electrode.

According to various embodiments of the present disclosure, the second electrode may include at least one of ITO, IZO, a high-polymer conductor, and/or graphene.

According to various embodiments of the present disclosure, the electronic device may further include a transistor electrically connected with the third electrode and/or the fourth electrode, in which the transistor may include a gate electrode, a source electrode, and a drain electrode, and the second electrode may be arranged on a layer that is substantially identical to a layer of one of the gate electrode, the source electrode, and/or the drain electrode.

According to various embodiments of the present disclosure, the second electrode may include a material that is substantially identical to a material of one of the gate electrode, the source electrode, and/or the drain electrode.

According to various embodiments of the present disclosure, the second electrode may include at least one of silver, copper, magnesium, titanium, molybdenum, aluminum, and/or graphene.

According to various embodiments of the present disclosure, the electronic device may further include a transistor electrically connected with the third electrode or the fourth electrode, in which the second electrode may be disposed between the transistor and the third transparent plate.

According to various embodiments of the present disclosure, the electronic device may further include a fifth electrode disposed between the third transparent plate and the second face of the housing and electrically connected with the control circuit, in which the control circuit may be configured to detect a strength of the touch input by using the second electrode and the fifth electrode.

According to various embodiments of the present disclosure, the control circuit may be configured to detect a position of the touch input by using the first electrode and the fifth electrode.

According to various embodiments of the present disclosure, the fifth electrode may further include a ground member of a size that is substantially equal to a size of the display.

According to various embodiments of the present disclosure, the second electrode may be formed in a first pattern, and the fifth electrode may be formed in a second pattern that is orthogonal to the first pattern.

According to various embodiments of the present disclosure, the second electrode may be formed in a latticed pattern.

According to various embodiments of the present disclosure, the electronic device may further include a sixth electrode arranged between the second transparent plate and the third transparent plate and electrically connected with the control circuit, in which the control circuit may be configured to obtain user's fingerprint information included in the touch input by using the sixth electrode.

According to various embodiments of the present disclosure, the electronic device may further include a communication circuit and a seventh electrode arranged between the second transparent plate and the third transparent plate and electrically connected with the communication circuit, in which the communication circuit may be configured to transmit and receive a radio frequency (RF) signal to/from an external electronic device by using the seventh electrode.

According to various embodiments of the present disclosure, the display may include an active region in which the visual information is displayed and an inactive region in which the visual information is not displayed, and the third transparent plate may be folded in the second direction in the inactive region.

According to various embodiments of the present disclosure, at least a part of the control circuit is disposed in a part of a folded portion of the third transparent plate, the folded portion being folded in the second direction.

According to various embodiments of the present disclosure, the electronic device may include a first wiring, a second wiring, and a third wiring that are disposed in another part of the folded portion of the third transparent plate and are electrically connected with the control circuit, the first wiring may be electrically connected with the first electrode, the second wiring may be electrically connected with the second electrode, and the third wiring may be electrically connected with the third electrode or the fourth electrode.

According to various embodiments of the present disclosure, the third transparent plate may include a first polymer layer and a second polymer layer attached on a face of the first polymer layer facing the second direction, and the second polymer layer may be at least partially removed from the folded portion of the third transparent plate folded in the second direction.

According to various embodiments of the present disclosure, the display may include an organic light-emitting diode arranged between the third electrode and the fourth electrode.

According to various embodiments of the present disclosure, the control circuit may be configured to detect a position of a touch input with respect to the first transparent plate by using the first electrode in first time periods, to detect a strength of the touch input by using the second electrode in second time periods that alternate with the first time periods, and to display visual information in at least a part of the display by using the third electrode and the fourth electrode in third time periods that alternate with the first time periods and the second time periods.

According to various embodiments of the present disclosure, the first time periods may have a first period and the second time periods may have a second period.

According to various embodiments of the present disclosure, the first period and the second period may be identical to each other.

According to various embodiments of the present disclosure, the first time periods may be shorter than the second time periods, and the first period may be longer than the second period.

An electronic device according to the present disclosure may include a housing including a first face facing a first direction, a second face facing a second direction that is opposite to the first direction, and a first transparent plate forming at least a part of the first face of the housing, a display including a second transparent plate arranged between the first transparent plate and the second face of the housing and facing the first direction, and including a third transparent plate facing the second direction, a first electrode, a second electrode, and a third electrode that are arranged between the second transparent plate and the third transparent plate, and a control circuit electrically connected with the first electrode, the second electrode, and the third electrode, in which the control circuit may be configured to detect a position of a touch input with respect to the first transparent plate by using the first electrode in first time periods, to detect a strength of the touch input by using the second electrode in second time periods that alternate with the first time periods, and to display visual information in at least a part of the display by using the third electrode and the fourth electrode.

The electronic device according to various embodiments of the present disclosure is not limited by the above-described embodiments and drawings, and it would be apparent to those of ordinary skill in the art that various substitutions, modifications, and changes in the technical scope of the present disclosure may be possible.

The invention claimed is:

1. An electronic device comprising:
    a housing comprising a first face facing a first direction and a second face facing a second direction that is opposite to the first direction, and comprising a first transparent plate forming at least a part of the first face of the housing;
    a display disposed between the first transparent plate and the second face of the housing, and comprising a second transparent plate facing the first direction and a third transparent plate facing the second direction;
    a first electrode, a second electrode, a third electrode, and a fourth electrode that are disposed between the second transparent plate and the third transparent plate; and
    a control circuit electrically connected with the first electrode, the second electrode, the third electrode, and the fourth electrode,
    wherein the control circuit is configured to:
        detect a position of a touch input with respect to the first transparent plate by using the first electrode,
        detect a strength of the touch input by using the second electrode, and
        display visual information in at least a part of the display by using the third electrode and the fourth electrode, and
    wherein the second electrode is arranged on a plane that is substantially identical to a plane of one of the third electrode or the fourth electrode.

2. The electronic device of claim 1, wherein the second electrode comprises a material that is substantially identical to a material of one of the third electrode or the fourth electrode.

3. The electronic device of claim 1, further comprising:
    a transistor electrically connected with the third electrode and/or the fourth electrode,
    wherein the transistor comprises a gate electrode, a source electrode, and a drain electrode, and
    the second electrode is arranged on a layer that is substantially identical to a layer of one of the gate electrode, the source electrode, and/or the drain electrode.

4. The electronic device of claim 3, wherein the second electrode comprises a material that is identical to a material of one of the gate electrode, the source electrode, and/or the drain electrode, and comprises at least one of silver, copper, magnesium, titanium, molybden, aluminum, and/or graphene.

5. The electronic device of claim 1, further comprising:
    a transistor electrically connected with the third electrode or the fourth electrode,
    wherein the second electrode is disposed between the transistor and the third transparent plate.

6. The electronic device of claim 1, further comprising:
    a fifth electrode disposed between the third transparent plate and the second face of the housing, and electrically connected with the control circuit,
    wherein the control circuit is configured to:
        detect a strength of the touch input by using the second electrode and the fifth electrode, and
        detect a position of the touch input by using the first electrode and the fifth electrode.

7. The electronic device of claim 6, wherein the fifth electrode comprises a ground member of a size that is substantially equal to a size of the display.

8. The electronic device of claim 6, wherein the second electrode is formed in a first pattern, and
    the fifth electrode is formed in a second pattern that is orthogonal to the first pattern.

9. The electronic device of claim 1, further comprising:
    a sixth electrode disposed between the second transparent plate and the third transparent plate, and electrically connected with the control circuit,
    wherein the control circuit is configured to obtain user's fingerprint information included in the touch input by using the sixth electrode.

10. The electronic device of claim 1, further comprising:
    a communication circuit; and
    a seventh electrode disposed between the second transparent plate and the third transparent plate, and electrically connected with the communication circuit,
    wherein the communication circuit is configured to transmit and receive a radio frequency (RF) signal to/from an external electronic device by using the seventh electrode.

11. The electronic device of claim 1, wherein the display comprises an active region in which the visual information is displayed and an inactive region in which the visual information is not displayed, and
    the third transparent plate is folded in the second direction in the inactive region.

12. The electronic device of claim 11, wherein at least a part of the control circuit is disposed in a part of a folded portion of the third transparent plate, the folded portion being folded in the second direction,
    the electronic device comprises a first wiring, a second wiring, and a third wiring that are disposed in another part of the folded portion of the third transparent plate and are electrically connected with the control circuit,
    the first wiring is electrically connected with the first electrode,
    the second wiring is electrically connected with the second electrode, and
    the third wiring is electrically connected with the third electrode or the fourth electrode.

13. The electronic device of claim 11, wherein the third transparent plate comprises a first polymer layer and a second polymer layer attached on a face of the first polymer layer facing the second direction, and
    the second polymer layer is at least partially removed from the folded portion of the third transparent plate folded in the second direction.

14. The electronic device of claim 1, wherein the control circuit is configured to:
    detect a position of a touch input with respect to the first transparent plate by using the first electrode in first time periods;
    detect a strength of the touch input by using the second electrode in second time periods that alternate with the first time periods; and
    display visual information in at least a part of the display by using the third electrode and the fourth electrode in third time periods that alternate with the first time periods and the second time periods.

* * * * *